(12) United States Patent
Mei et al.

(10) Patent No.: US 12,174,505 B2
(45) Date of Patent: Dec. 24, 2024

(54) HIGH TRANSPARENCY ELECTROCHROMIC POLYMERS

(71) Applicant: AMBILIGHT INC, Grand Cayman (KY)

(72) Inventors: Jianguo Mei, West Lafayette, IN (US); Zhiyang Wang, West Lafayette, IN (US); Vaidehi Pandit, Woburn, MA (US); Liyan You, West Lafayette, IN (US)

(73) Assignee: Ambilight Inc, Grand Cayman (KY)

( * ) Notice: Subject to any disclaimer, the term of this patent is extended or adjusted under 35 U.S.C. 154(b) by 0 days.

(21) Appl. No.: 18/395,603

(22) Filed: Dec. 24, 2023

(65) Prior Publication Data

US 2024/0142841 A1    May 2, 2024

Related U.S. Application Data

(63) Continuation-in-part of application No. 18/093,287, filed on Jan. 4, 2023, which is a continuation-in-part
(Continued)

(51) Int. Cl.
  *C09K 9/02*  (2006.01)
  *C08F 28/06*  (2006.01)
(Continued)

(52) U.S. Cl.
  CPC ............ *G02F 1/15165* (2019.01); *C09K 9/02* (2013.01); *G02F 1/1533* (2013.01); *C09K 2211/1408* (2013.01)

(58) Field of Classification Search
  CPC .................................................. G02F 1/15165
  See application file for complete search history.

(56) References Cited

U.S. PATENT DOCUMENTS

| 10,955,717 B1 | 3/2021 | Chen et al. |
| 2007/0008603 A1 | 1/2007 | Solzing et al. |
| (Continued) | | |

FOREIGN PATENT DOCUMENTS

| CN | 103483391 A | 1/2014 |
| CN | 112126043 A | 12/2020 |
| WO | 2021/242267 A1 | 12/2021 |

OTHER PUBLICATIONS

Zheng et al. "A novel self-healing electrochromic film based on a triphenylamine cross-linked polymer." Polymer Chemistry 8.45 (2017): 6981-6988.
(Continued)

*Primary Examiner* — Shane Fang

(57) ABSTRACT

An electrochromic device includes: a first insulating substrate; a first conducting layer disposed over the first insulating substrate; an electrochromic layer disposed over the first conducting layer, wherein the electrochromic layer comprises an electrochromic polymer having a polymer backbone comprising one or more meta-conjugated linkers (MCLs) and one or more aromatic moieties (Ars), wherein each of the one or more MCLs is partially conjugated with one of the one or more Ars at a meta position of the one or more MCLs; an electrolyte layer disposed over the electrochromic layer; a second conducting layer disposed over the electrolyte layer; and a second insulating substrate disposed over the second conducting layer. A thickness of the electrochromic layer is from 10 nm to 1500 nm resulting in transmittance of 85%-99.9% at a wavelength of 550 nm at a neutral state of the electrochromic layer.

20 Claims, 10 Drawing Sheets

Related U.S. Application Data of application No. 17/748,383, filed on May 19, 2022, now Pat. No. 11,874,578, which is a continuation-in-part of application No. 17/668,300, filed on Feb. 9, 2022, now Pat. No. 11,879,098.

(51) Int. Cl.
*C08G 61/12* (2006.01)
*G02F 1/1516* (2019.01)
*G02F 1/153* (2006.01)

(56) References Cited

U.S. PATENT DOCUMENTS

| | | |
|---|---|---|
| 2007/0191576 A1 | 8/2007 | Solzing |
| 2008/0100213 A1 | 5/2008 | Iwakuma et al. |
| 2011/0288253 A1 | 11/2011 | Reynolds et al. |
| 2012/0108778 A1 | 5/2012 | Amb et al. |
| 2019/0016852 A1 | 1/2019 | Mei et al. |
| 2020/0387040 A1 | 12/2020 | He et al. |
| 2022/0017689 A1 | 1/2022 | You et al. |

OTHER PUBLICATIONS

Li et al. "Structural effects of dibromocarbazoles on direct arylation polycondensation with 3, 4 ethylenedioxythiophene." Polymer Chemistry 7.18 (2016): 3165-3171.
Yu et al. "Preparation and characterization of a class of self-doping aromatic polyoxadiazole electrochromic materials." Journal of Applied Polymer Science 137.45 (2020): 49406.
Written Opinion of the International Searching Authority and International Search Report for PCT Application No. PCT/US2022/016609 mailed on Aug. 1, 2022 (14 pages).
Written Opinion of the International Searching Authority and International Search Report for PCT Application No. PCT/US2022/30049 mailed on Oct. 13, 2022 (13 pages).
Non-Final Office Action for U.S. Appl. No. 17/748,383 mailed on Sep. 29, 2022 (26 pages).
Gaupp et al., Multichromic Copolymers Based on 3,6-Bis(2-(3,4-ethylenedioxythiophene))-N-alkylcarbazole1 Derivatives, Macromolecules, vol. 36, No. 17, Jul. 22, 2003 [retrieved on Jun. 23, 2022] Retrieved from the Internet: <URL: https://pubs.acs.org/doi/pdf/10.1021/ma034493e>. pp. 6305-6315.
Aubert et al. "Copolymers of 3, 4-ethylenedioxythiophene and of pyridine alternated with fluorene or phenylene units: Synthesis, optical properties, and devices." Macromolecules 37.11 (2004), pp. 4087-4098.
Stalder et al. "n-Type conjugated polyisoindigos." Macromolecules 44.16 (2011), pp. 6303-6310.
Zhang et al. "Colorless-to-colorful switching electrochromic polyimides with very high contrast ratio." Nature Communications 10.1 (2019), pp. 1-8.
Non-Final Office Action dated Sep. 26, 2022, issued in related U.S. Appl. No. 17/668,300 (27 pages).
Final Office Action dated Jan. 13, 2023, issued in related U.S. Appl. No. 17/668,300 (18 pages).
Search Report issued for European Application No. 24150237.6, dated Sep. 30, 2024 (9 pages).
Hsiao Sheng-Huei et al: "Fluorescent and electrochromic polymers from 2,8-di(carbazol-9-yl)dibenzothiophene and its S,S-dioxide derivative", Dyes and Pigments, Elsevier Applied Science Publishers Barking, GB, vol. 134, Jun. 29, 2016 (Jun. 29, 2016), pp. 51-63.
Jeong Dong-Cheol et al: "Effects of Substituent on Binaphthyl Hinge•Containing Conductive Polymers", Macromolecules, vol. 45, No. 24, Dec. 10, 2012 (Dec. 10, 2012), pp. 9571-9578.
Liu Jian et al: "Electrochromic polymer achieving synchronous electrofluorochromic switching for optoelectronic application", Organ IC Electronics, vol. 51, Sep. 18, 2017 (Sep. 18, 2017), pp. 295-303.
Kocaeren Aysel Aydin: "Synthesis and electrochromic performance of a novel polymer based on an oxidative polymer deriverd from carbazole and thiophene", Journal of Polymer Research, Springer Netherlands, Do Rd Recht, vol. 23, No. 4, Mar. 8, 2016 (Mar. 8, 2016), pp. 1-10.
Icli Ozkut Merve et al.: "Substituent and heteroatom effects on the electrochromic properties of similar systems", Journal of Polymer Science Part A: Polymer Chemistry, vol. 50, No. 4, Oct. 28, 2011 (Oct. 28, 2011), pp. 615-621.

HIGH TRANSPARENCY ELECTROCHROMIC POLYMERS

CROSS-REFERENCE TO RELATED APPLICATIONS

This application is a Continuation-In-Part application of Non-Provisional application Ser. No. 18/093,287, filed on Jan. 4, 2023, which is a Continuation-In-Part application of Non-Provisional application Ser. No. 17/748,383, filed on May 19, 2022, which is a Continuation-In-Part application of Non-Provisional application Ser. No. 17/668,300, filed on Feb. 9, 2022. The entire contents of all of the above applications are incorporated herein by reference in their entirety.

TECHNICAL FIELD

The present disclosure is related to a new type of electrochromic polymers that comprise meta-conjugated linkers and aromatic moieties, which present a high transparency in the visible light region in the neutral state. The polymers become highly absorbing in the visible light and near-infrared region and thus colored when their films are being oxidized. A device incorporating such conjugated electrochromic polymer films with a high optical contrast and a high transmittance is also disclosed.

BACKGROUND

Electrochromic devices allow to adjust light transmittance and control solar-heat gain. In comparison with inorganic-based electrochromic devices made through the vacuum sputtering process, polymer-based electrochromic windows can be manufactured through roll-to-roll coating and lamination. It thus renders a low-cost production and manufacturing flexibility. Polymer based electrochromic devices are typically composed of conjugated electrochromic polymers (ECPs), which feature fully conjugated polymer backbone made of $sp^2$ hybridized carbons. Conventionally, ECPs typically have strong absorbance in the visible light region and are thus colored in their neutral state. When they are oxidized, their absorption is shifted toward near-infrared (near-IR) region and they become transmissive in the visible light region. However, the oxidized polymers still have weak absorption in the visible light region, leading to residue colors. The problem becomes more severe when the polymer films are thick. As a result, it negatively impacts optical contrast of the polymers. Furthermore, it limits the highest optical transmittance a conjugated electrochromic polymer can achieve. In addition, conventional ECPs in the neutral state blocks visible light through the film and allow near-IR light passing through; While in the transmissive state, it allows visible light passing through and blocks near-IR light. This combination is not effective for thermal management and control the solar-heat gain (SHG). SHG describes the way radiation from the sun is turned into heat through a window product.

SUMMARY

The present disclosure is related to a new type of electrochromic polymer and the devices that uses the polymer.

In one aspect, an electrochromic device is provided. The electrochromic device includes: a first insulating substrate; a first conducting layer disposed over the first insulating substrate; an electrochromic layer disposed over the first conducting layer, wherein the electrochromic layer comprises an electrochromic polymer having a polymer backbone comprising one or more meta-conjugated linkers (MCLs) and one or more aromatic moieties (Ars), wherein each of the one or more MCLs is partially conjugated with one of the one or more Ars at a meta position of the one or more MCLs; an electrolyte layer disposed over the electrochromic layer; a second conducting layer disposed over the electrolyte layer; and a second insulating substrate disposed over the second conducting layer. In some embodiments, a thickness of the electrochromic layer is from 10 nm to 1500 nm resulting in transmittance of 85%-99.9% at a wavelength of 550 nm at a neutral state of the electrochromic layer. For example, a thickness of the electrochromic layer 106 from 10 nm to 1500 nm yields a transmittance of 85%, 87%, 90%, 92%, 95%, 96%, 97%, 98%, 99%, 99.9% or between any two of the above numbers. The electrochromic device 100 has transmittance of 60% or more at a wavelength of 550 nm at a bleached state of the device. For example, by tuning the material and thickness of the electrochromic layer, the electrochromic device 100 may have at its bleached state transmittance of 60%, 65%, 70%, 75%, 80%, 85%, 90%, 92%, 95%, 96%, 97%, 98%, or 99%, or between any two of the above numbers.

In some embodiments, the electrochromic layer has transmittance of 40%-0.1% at a wavelength of 550 nm at an oxidized state of the electrochromic layer. For example, the electrochromic layer at the oxidized state has transmittance at a wavelength of 550 nm of 40%, 35%, 30%, 25%, 20%, 15%, 10%, 9%, 8%, 7%, 6%, 5%, 4%, 3%, 2%, 1%, 0.9%, 0.8%, 0.7%, 0.6%, 0.5%, 0.4%, 0.3%, 0.2%, or 0.1%, or between any two of the above numbers.

In some embodiments, the electrochromic layer has an optical contrast of 60% or more. For example, the electrochromic layer may have an optical contrast of 60%, 65%, 70%, 75%, 80%, 85%, 90%, 95%, 96%, 97%, 98%, 99%, or between any two of the above numbers.

In some embodiments, when the electrochromic device further includes the ion storage layer 110, which is disposed between the electrolyte layer 108 and the second conducting layer, and the ion storage layer has transmittance of 80% or more at a wavelength of 550 nm. In some embodiments, the ion storage layer may include (1) one or more oxides of metal elements in Group 4-12, or (2) a mixture of the oxides, or (3) one of the oxides doped by a different metal oxide, or (4) a transition-metal complex, or (5) one or more of redox-active polymers including redox active nitroxyl, galvinoxyl radical polymers and conjugated polymers.

In some embodiments, the ion storage layer includes ITO particles, wherein the ion storage layer has transmittance of 90% or more at a wavelength of 550 nm. In some embodiments, the ITO particles may be nanoparticles having a size of 1-900 nm.

In some embodiments, at least one of the first conducting layer and the second conducting layer includes ITO, aluminum zinc oxide (AZO), fluorine doped tin oxide (FTO), silver nanowires, graphene, carbon nanotube, metal mesh based transparent conductive electrodes, silver-nanoparticle ink, or an organic conductive polymer.

In some embodiments, the electrochromic device has an optical contrast of 60% or more. For example, the electrochromic device may have an optical contrast of 60%, 65%, 70%, 75%, 80%, 85%, 90%, 95%, 96%, 97%, 98%, 99%, or between any two of the above numbers.

In some embodiments, a color of the electrochromic layer at an oxidized state is varied by varying/adjusting a conjugation length of the one or more MCLs and the one or more Ars.

In some embodiments, the electrochromic layer includes a blend of different electrochromic polymers without an intermediate color.

In another aspect, an electrochromic layer is provided. The electrochromic layer includes an electrochromic polymer. The electrochromic polymer consists of: a polymer backbone comprising one or more meta-conjugated linkers (MCLs) and one or more aromatic moieties (Ars). Each of the one or more MCLs is partially conjugated with one of the one or more Ars at a meta position of the one or more MCLs. A thickness of the electrochromic polymer is from 10 nm to 1500 nm resulting in transmittance of 85%-99.9% at a wavelength of 550 nm at a neutral state of the electrochromic layer. For example, a thickness of the electrochromic layer 106 from 10 nm to 1500 nm yields a transmittance of 85%, 87%, 90%, 92%, 95%, 96%, 97%, 98%, 99%, 99.9% or between any two of the above numbers.

In some embodiments, the electrochromic polymer disclosed in this application consists of a polymer backbone comprising one or more meta-conjugated linkers (MCLs) and one or more aromatic moieties (Ars). Each of the one or more MCLs is partially conjugated with the one or more Ars at meta positions of the one or more MCLs to form the polymer backbone of an electrochromic polymer. In some embodiments, the disclosed electrochromic polymer is anodically-coloring electrochromic polymer (AC-ECP), becoming colored when it is oxidized.

In some embodiments, the disclosed electrochromic polymer has an energy bandgap equal to or higher than 2.9 eV and less than 4.0 eV in the neutral state. In some embodiments, the absorption maxima ($\lambda_{max}$, the wavelength at which the polymer has its strongest photon absorption) are less than 410 nm in the neutral state. In some embodiments, the disclosed electrochromic polymer is colorless in the neutral state, while it is colored and visible and near-infrared absorbing in the oxidized state. The oxidized electrochromic polymer has an absorption coefficient larger than $10^4$ cm$^{-1}$ in the visible and/or near-IR region and thus colored in the oxidized state.

In spite of their high bandgaps, the disclosed electrochromic polymers still have relatively low oxidation potential in the ranges of 0.1-1.5 V inclusive versus Ag/AgCl electrode in some embodiments.

The MCL comprises at least one of an aromatic structure, or a fused aromatic structure, or the combinations thereof. The aromatic structure comprises a benzene or heterocyclic structure. The fused aromatic structure comprises a fused benzene structure or a fused heterocyclic structures or a fused benzene and heterocyclic structure.

In some embodiments, for the disclosed electrochromic polymers, the one or more MCLs and the one or more Ars are arranged in an alternative or random fashion with a general formula of

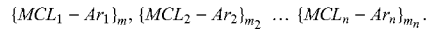

$\{MCL_1 - Ar_1\}_m, \{MCL_2 - Ar_2\}_{m_2} \ldots \{MCL_n - Ar_n\}_{m_n}.$

In the structures here, n is an integer greater than 0 and each of $m_1, m_2, \ldots, m_n$ is an integer equal to or greater than 0 with at least one of $m_1, m_2, \ldots, m_n$ is greater than 0. The one or more MCLs (or the one or more Ars) can be the same as or different from each other.

In some embodiments, the one or more MCLs and corresponding meta-positions comprise one of the following formulas:

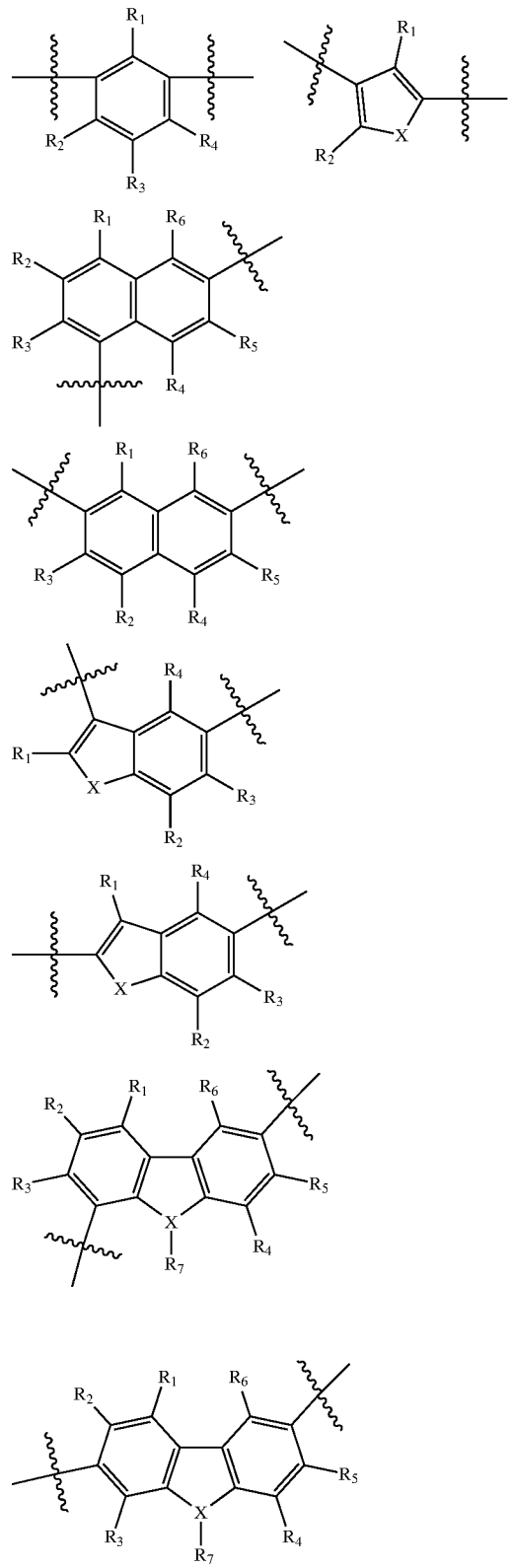

-continued
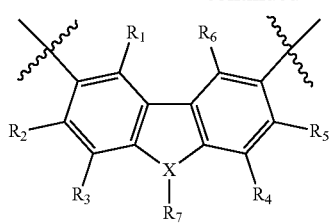
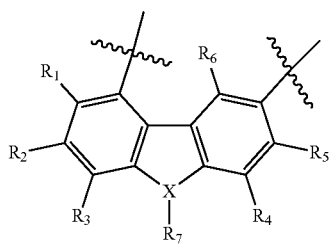
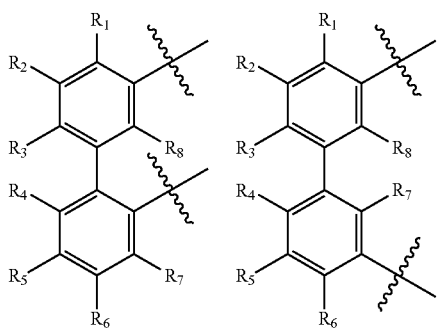
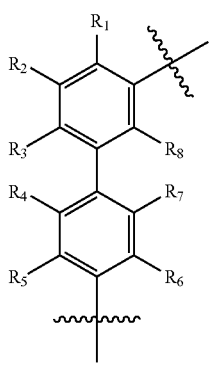
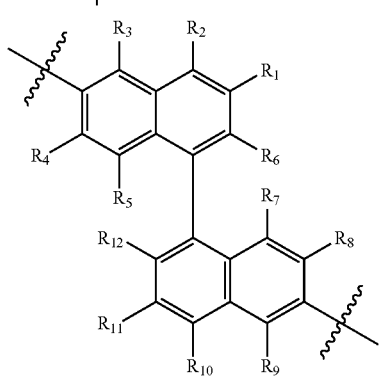
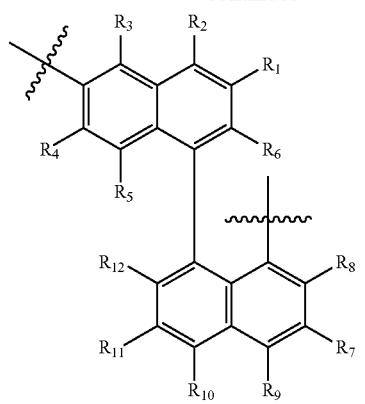
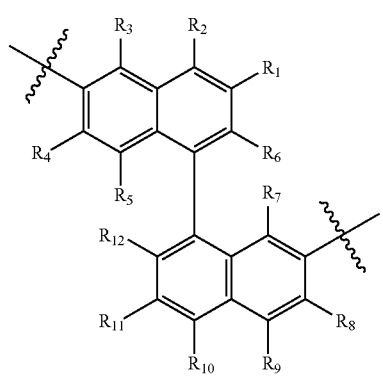
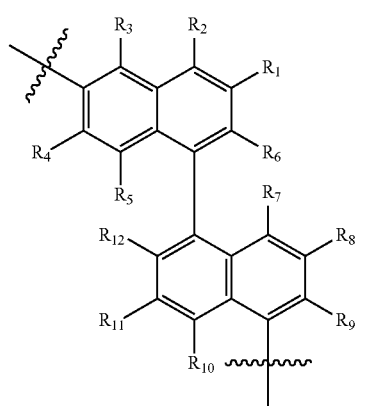
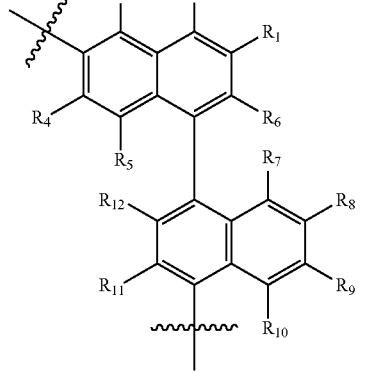

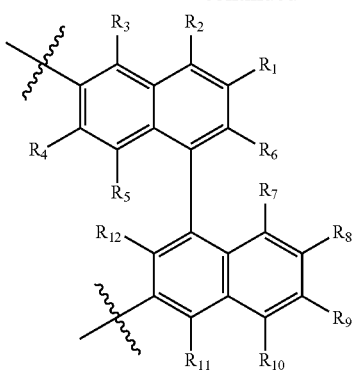
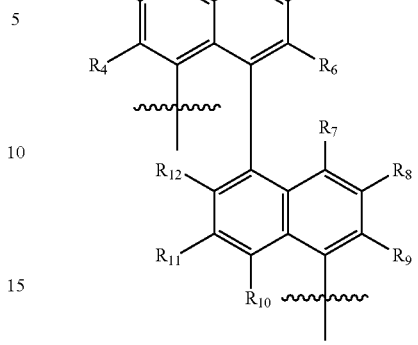
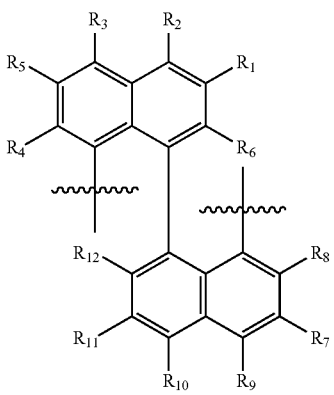
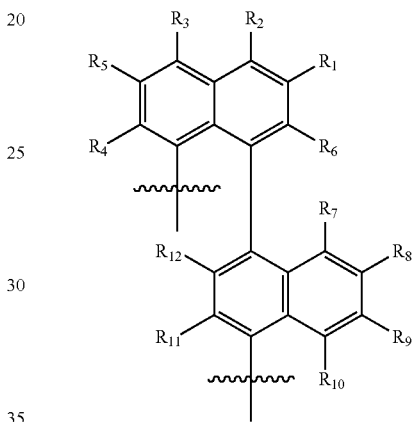
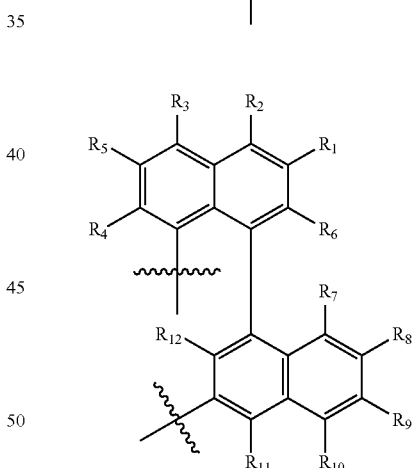
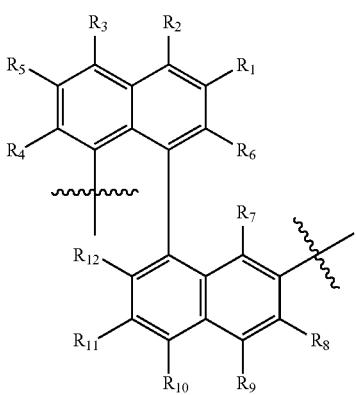
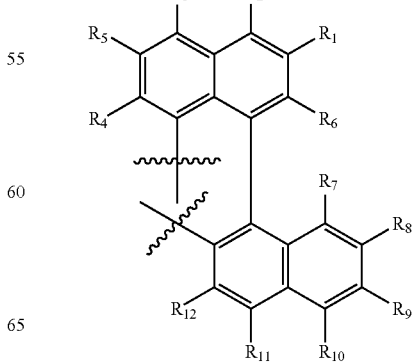

-continued
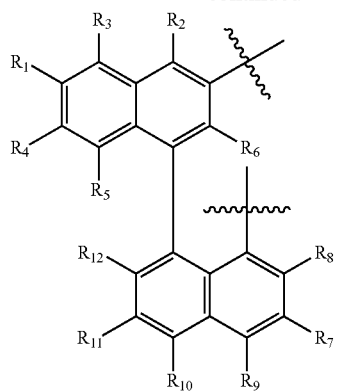
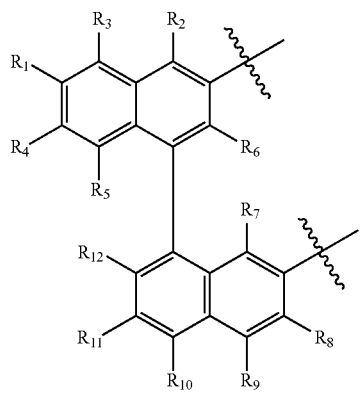
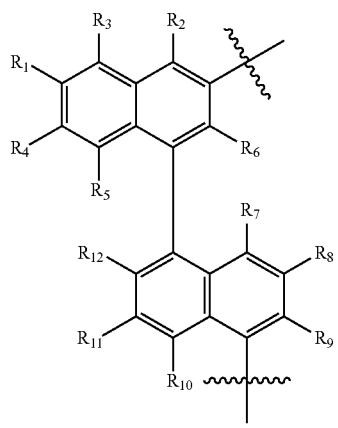
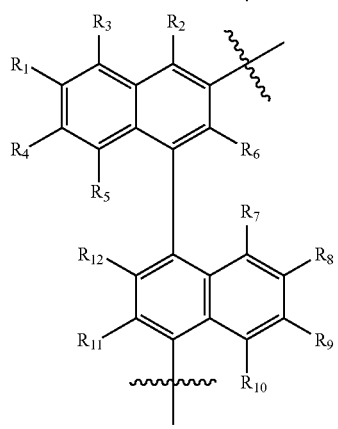
-continued
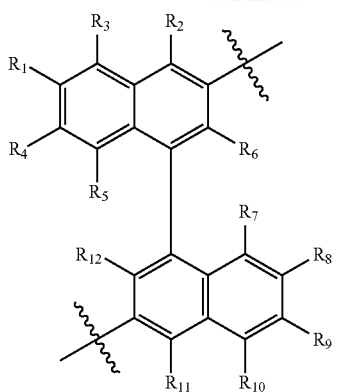
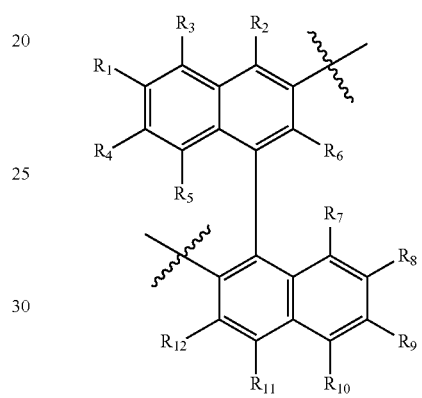
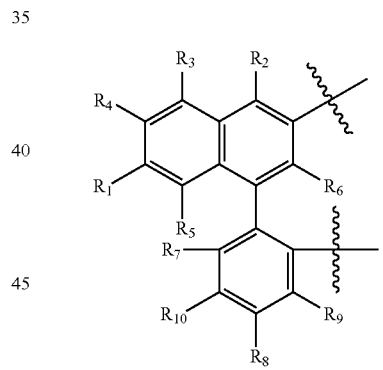
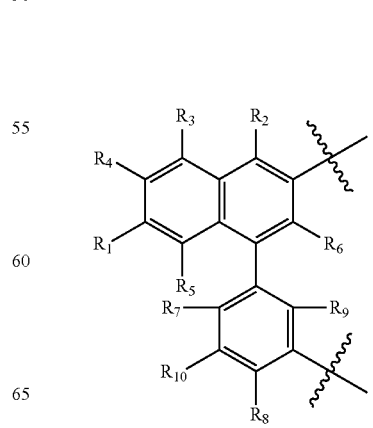

-continued
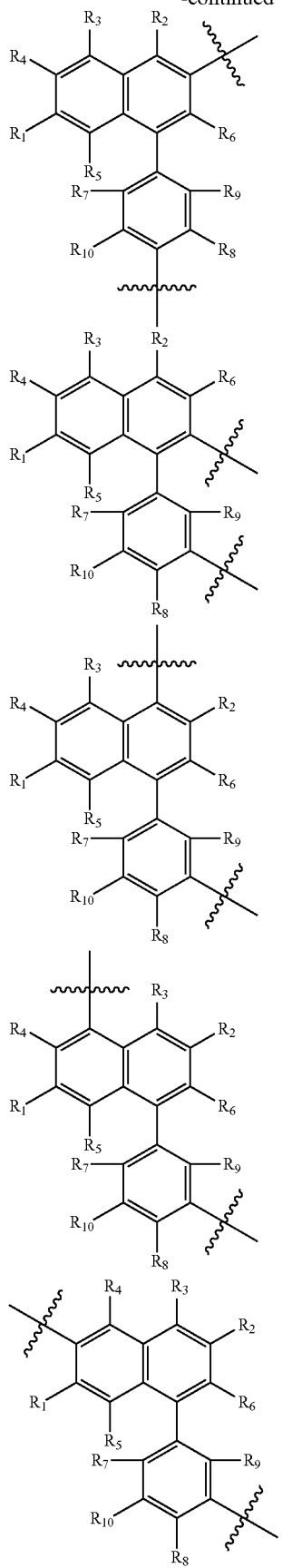
-continued
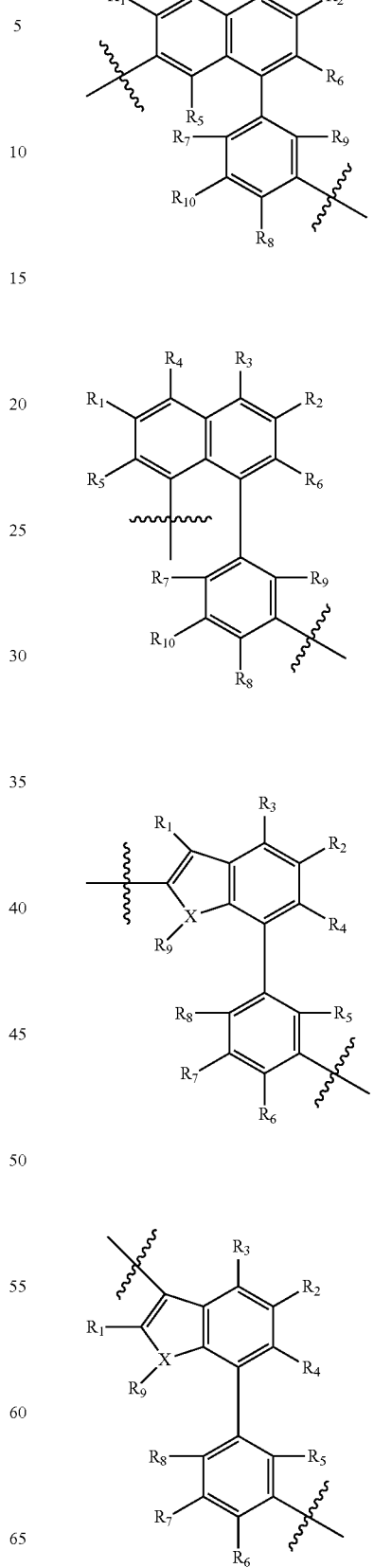

-continued
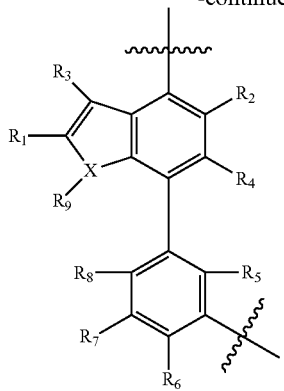
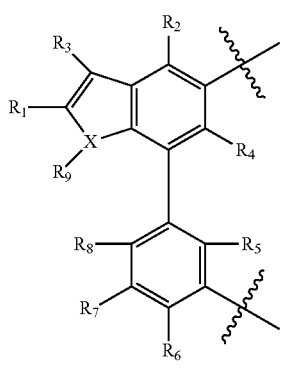
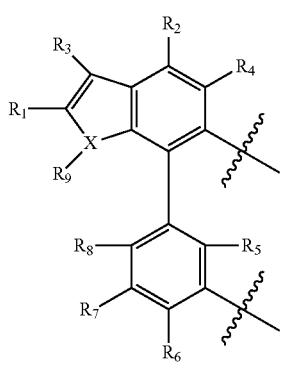
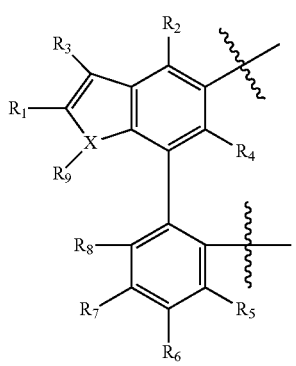
-continued
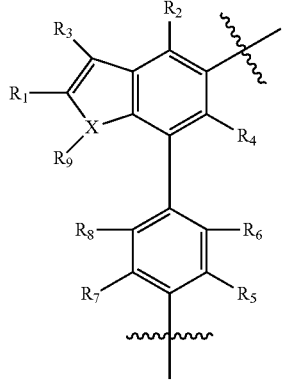
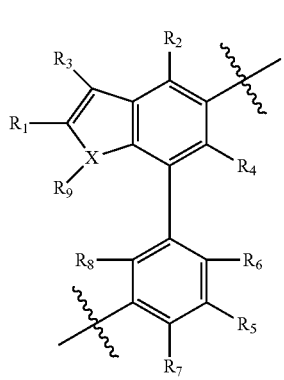
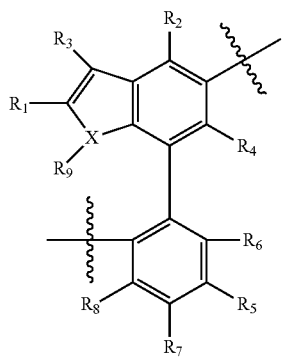

-continued
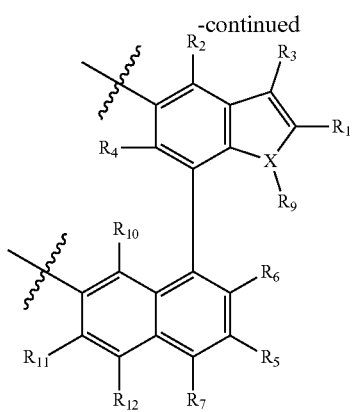
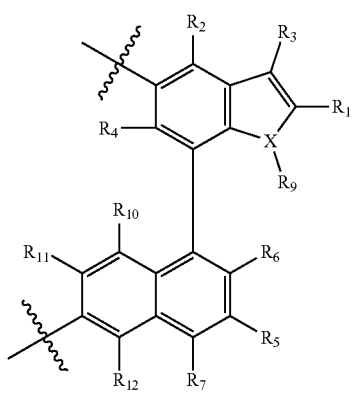
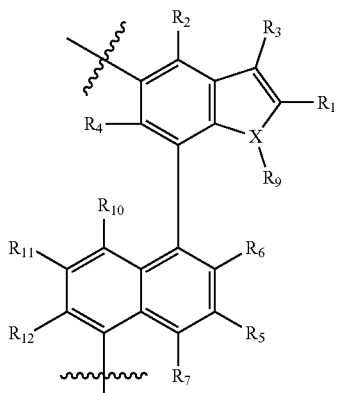
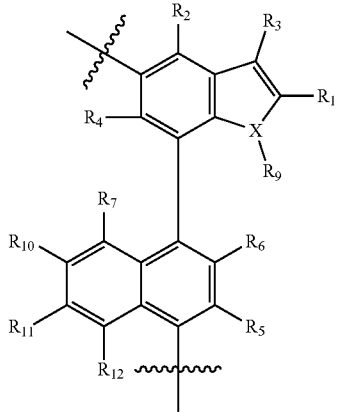
-continued
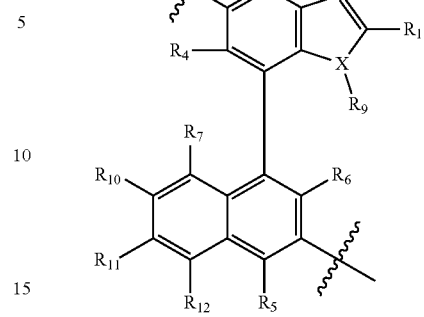
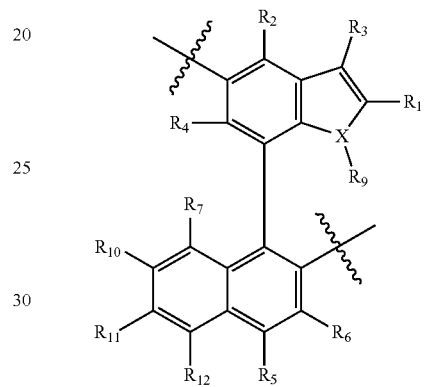
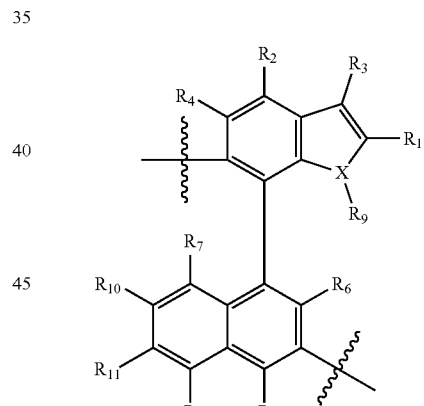
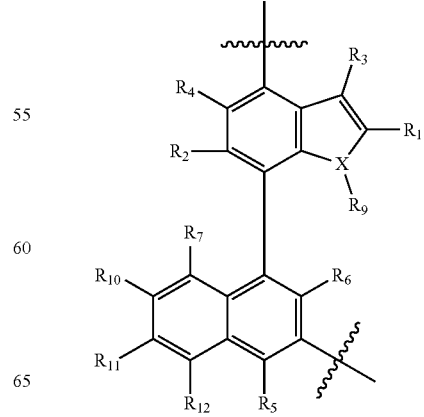

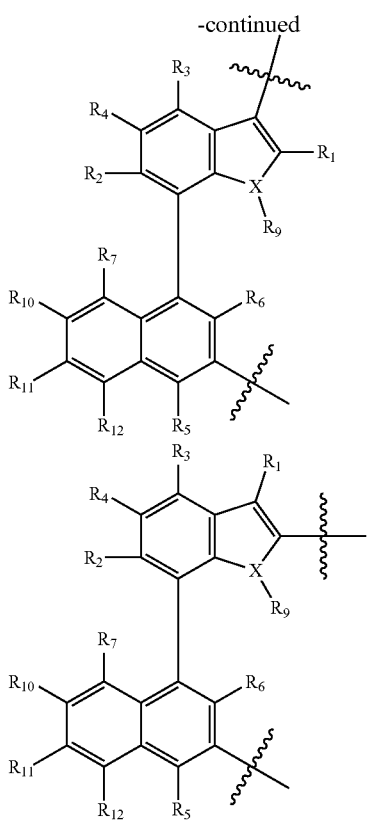

wherein each of the wavy lines represents meta-positions to link adjacent the one or more Ars; X is S, Se, N, C, or O; $R_1$-$R_{12}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

In some embodiments, the one or more Ars comprise one of a thiophene-based unit, a furan-based unit, a selenophene-based unit, or a pyrrole-based unit with a formula of

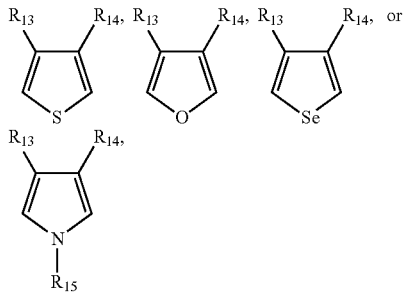

or any combination thereof, wherein each of $R_{13}$, $R_{14}$ and $R_{15}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

In some embodiments, the thiophene-based unit comprises a formula of

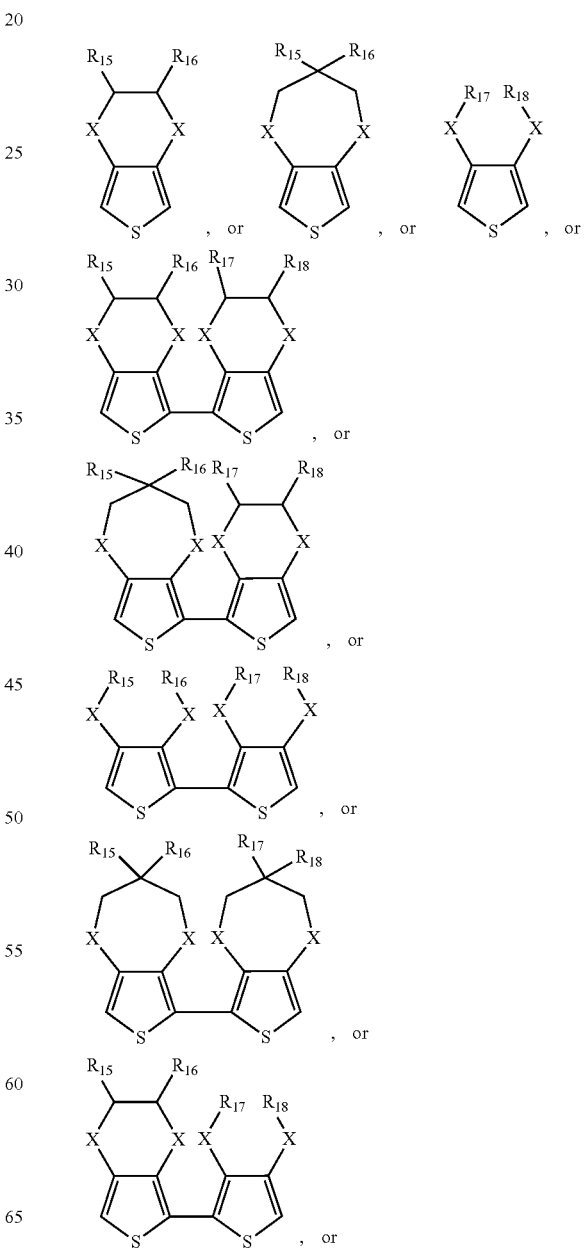

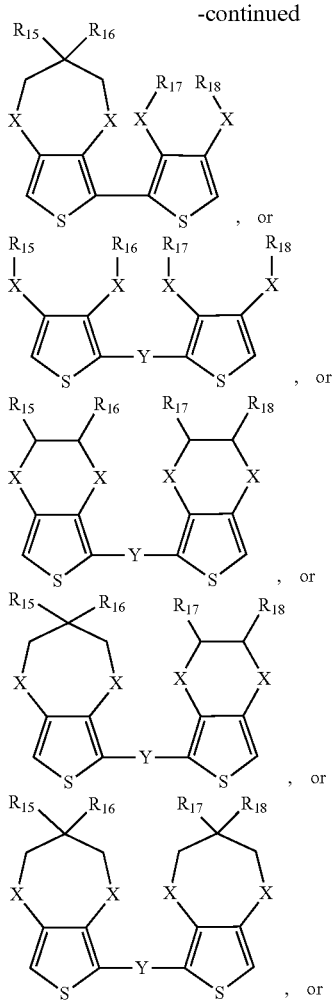

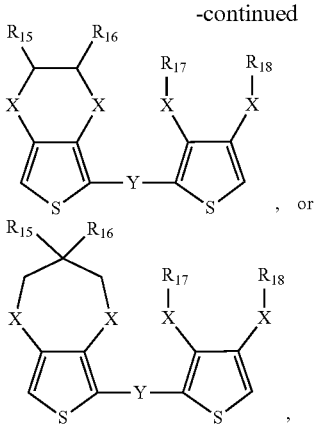

or a combination thereof, wherein X is S, Se, N, C, or O; each of $R_{15}$-$R_{18}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloakylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl. Y is any one or more of Ars, or aromatic structures, or fused aromatic structures, or a combinations thereof.

In some embodiments, X in the thiophene-based unit is O.

In some embodiments, the disclosed electrochromic polymers comprise a formula of

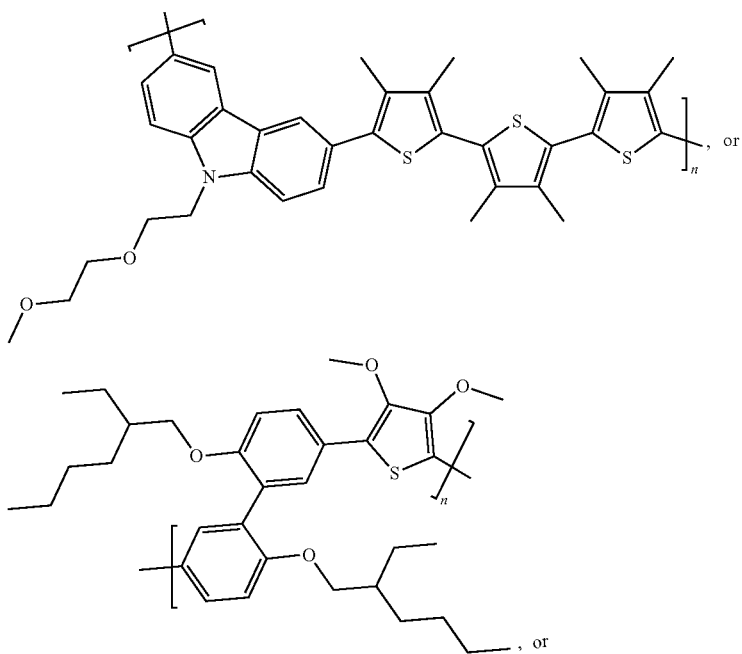

-continued
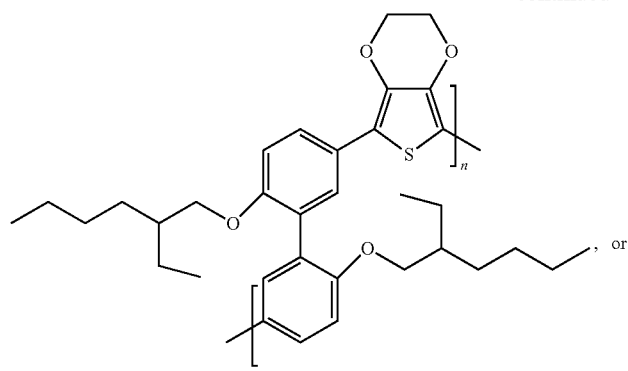
, or
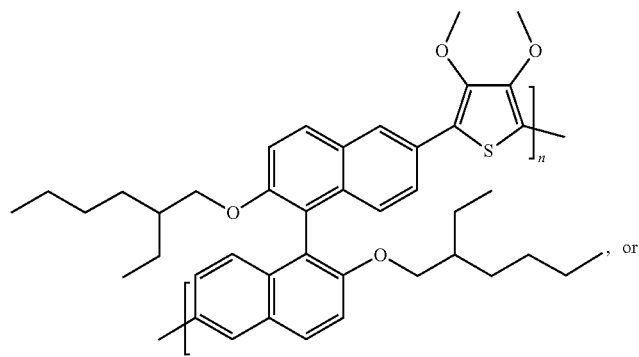
, or
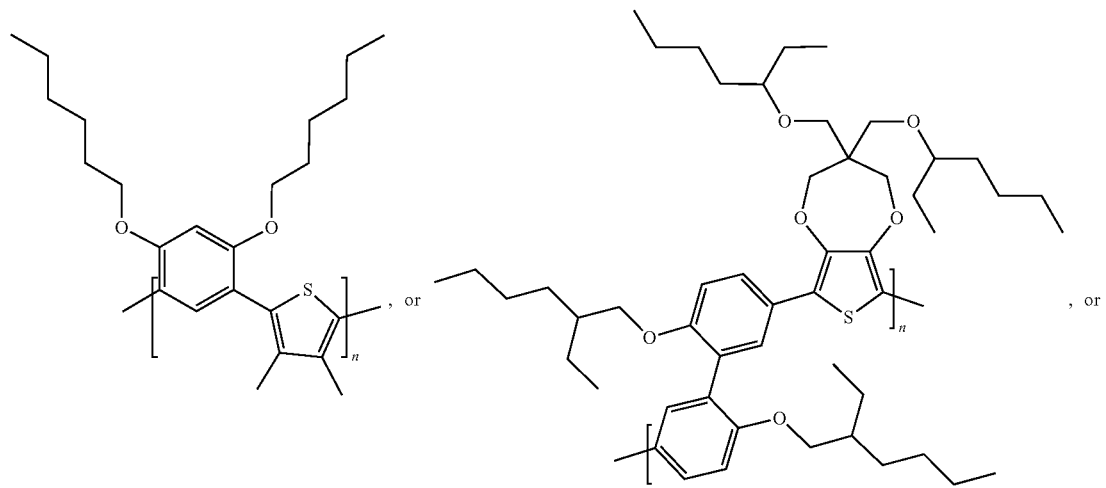
, or
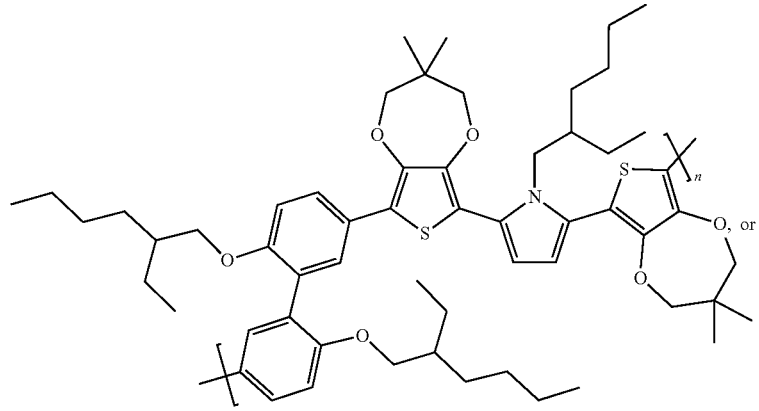

-continued
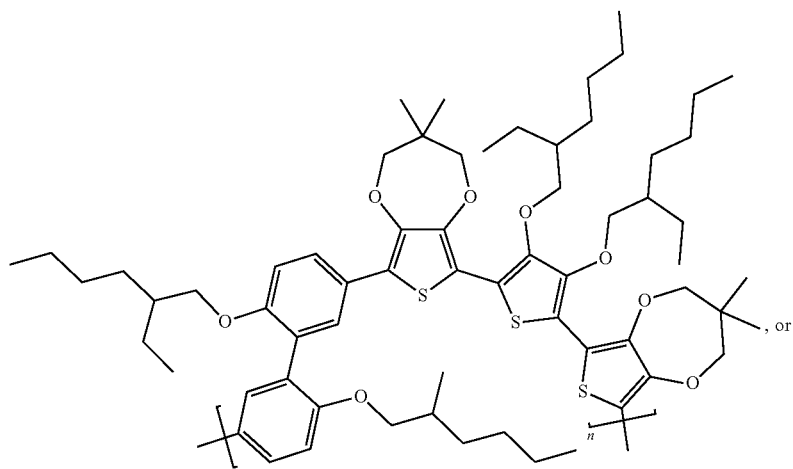
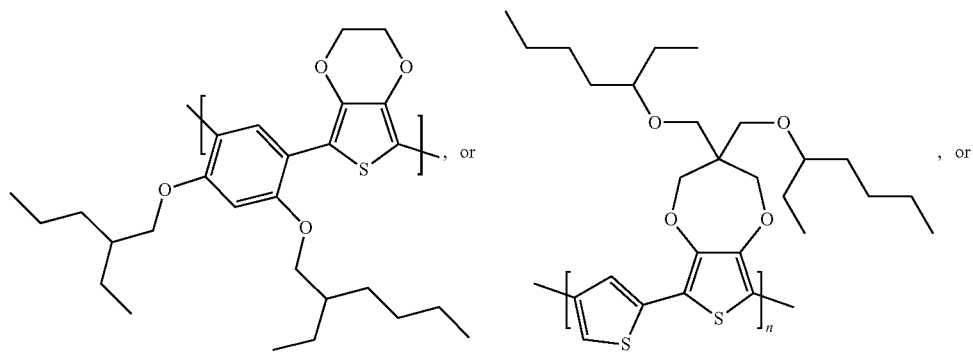
, or
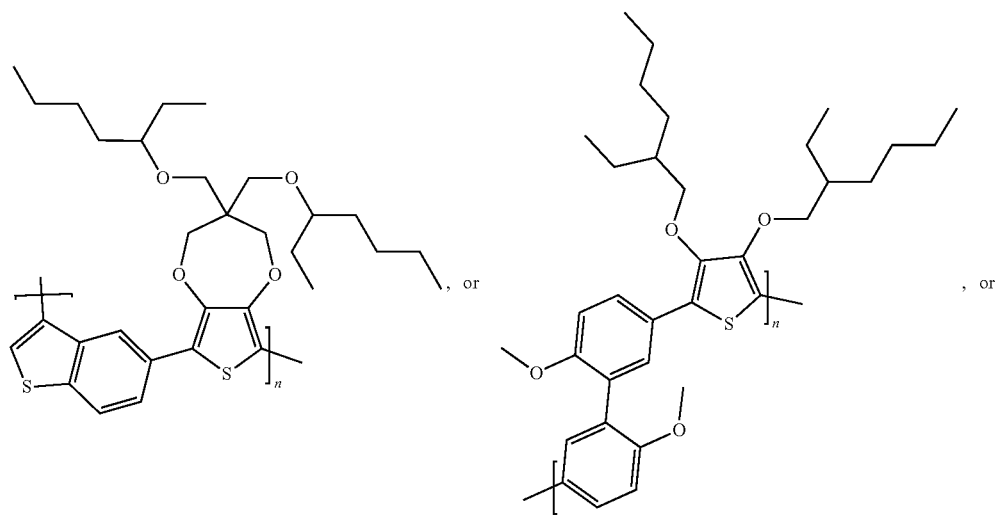
, or

-continued
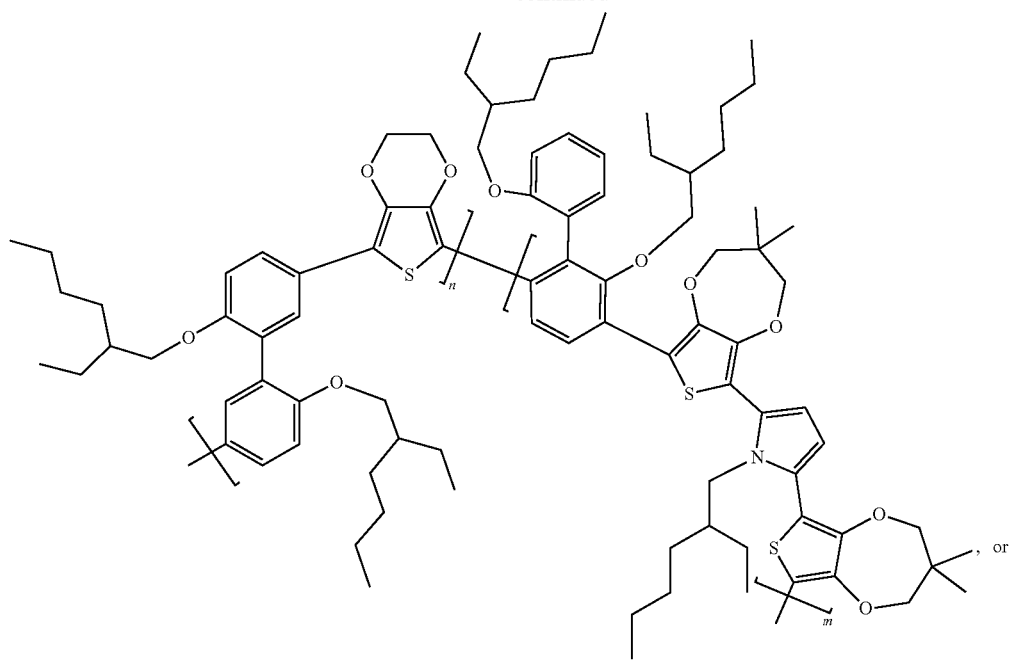
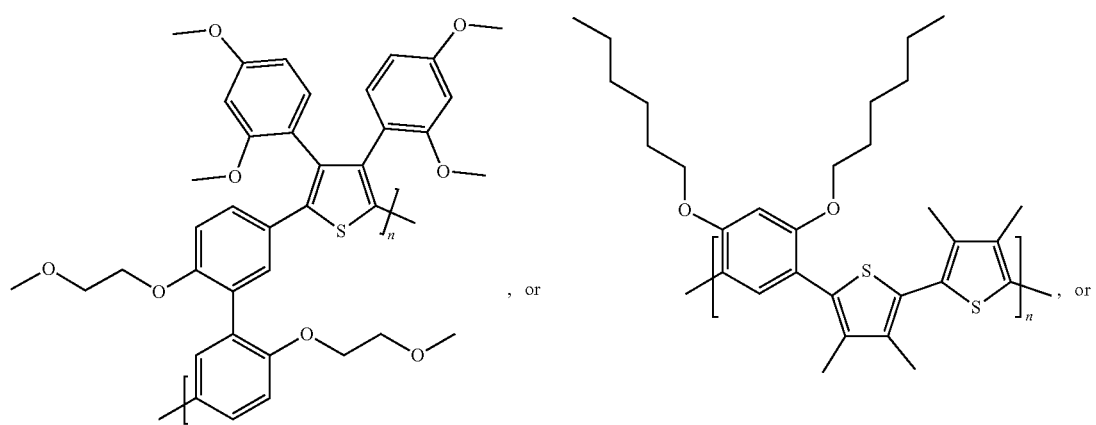
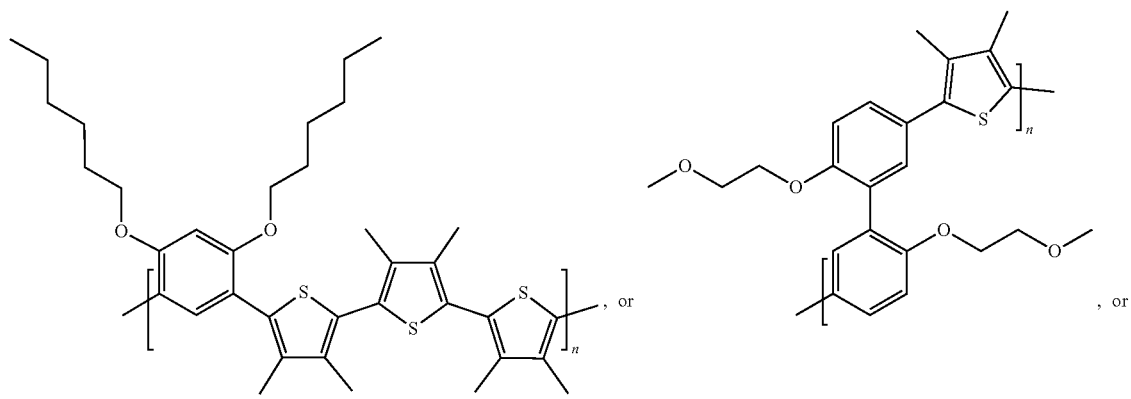

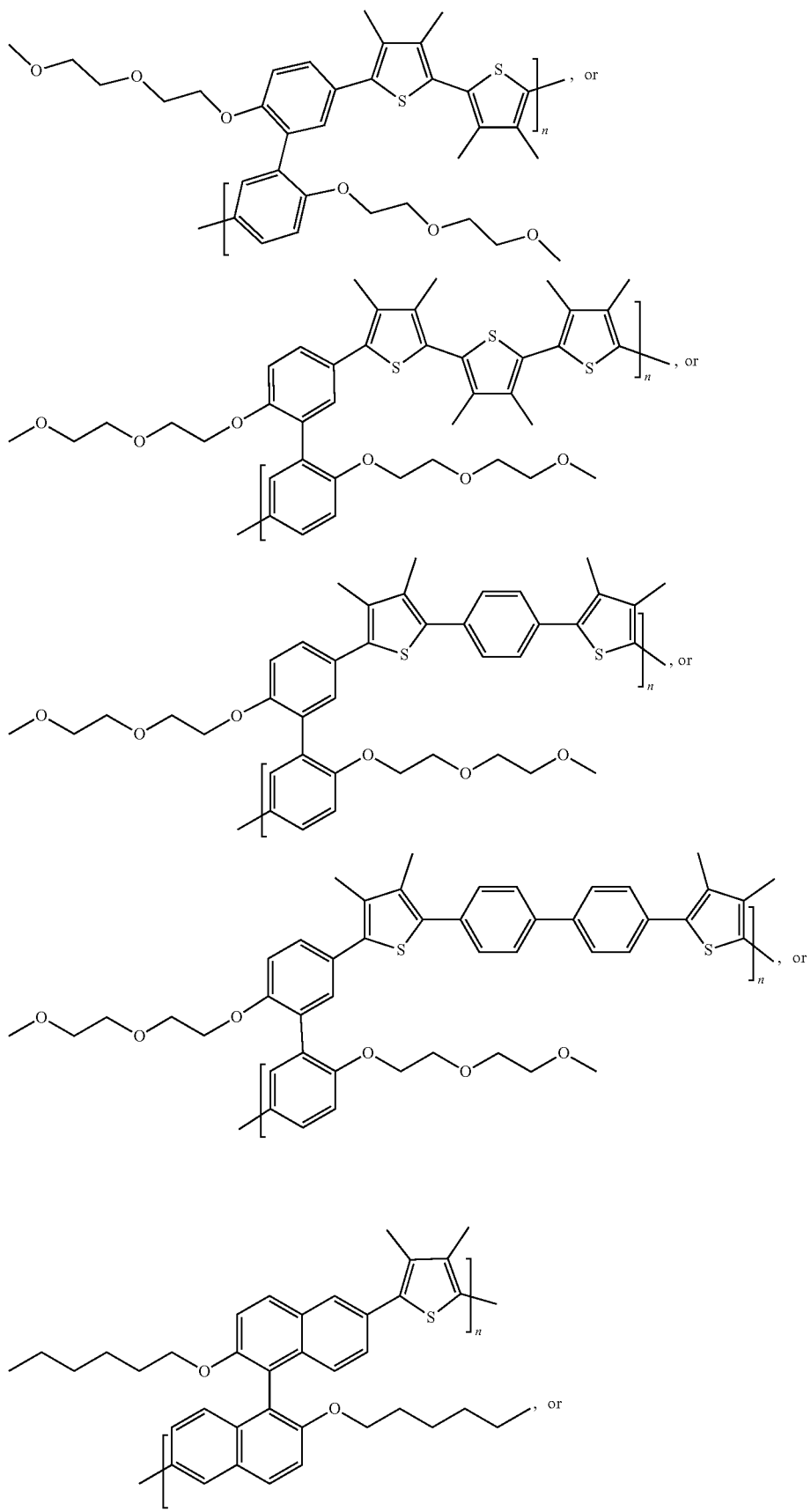

-continued
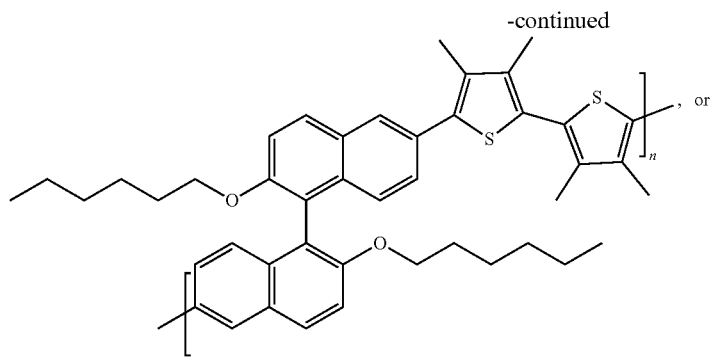, or
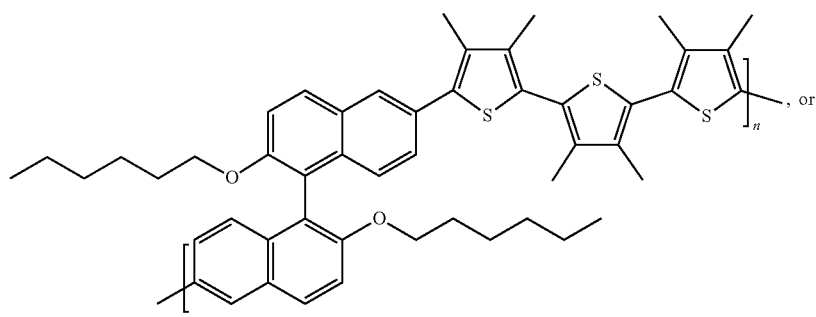, or
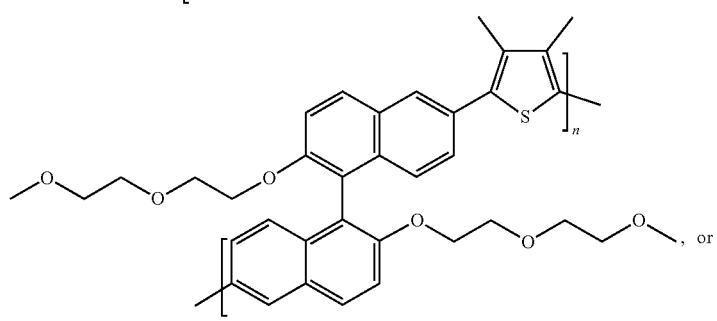, or
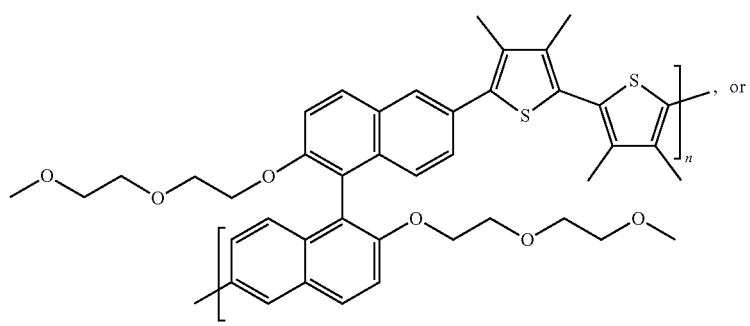, or
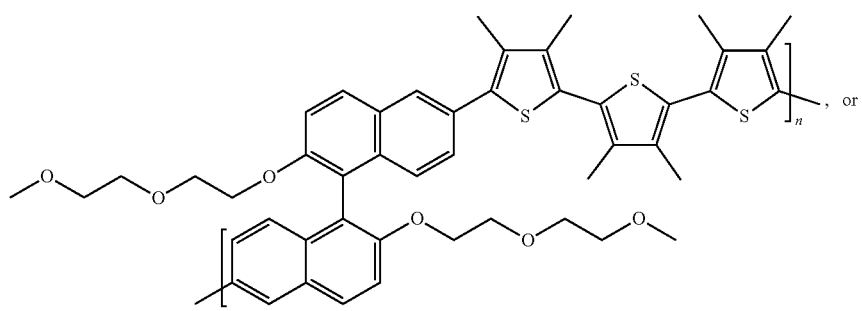, or

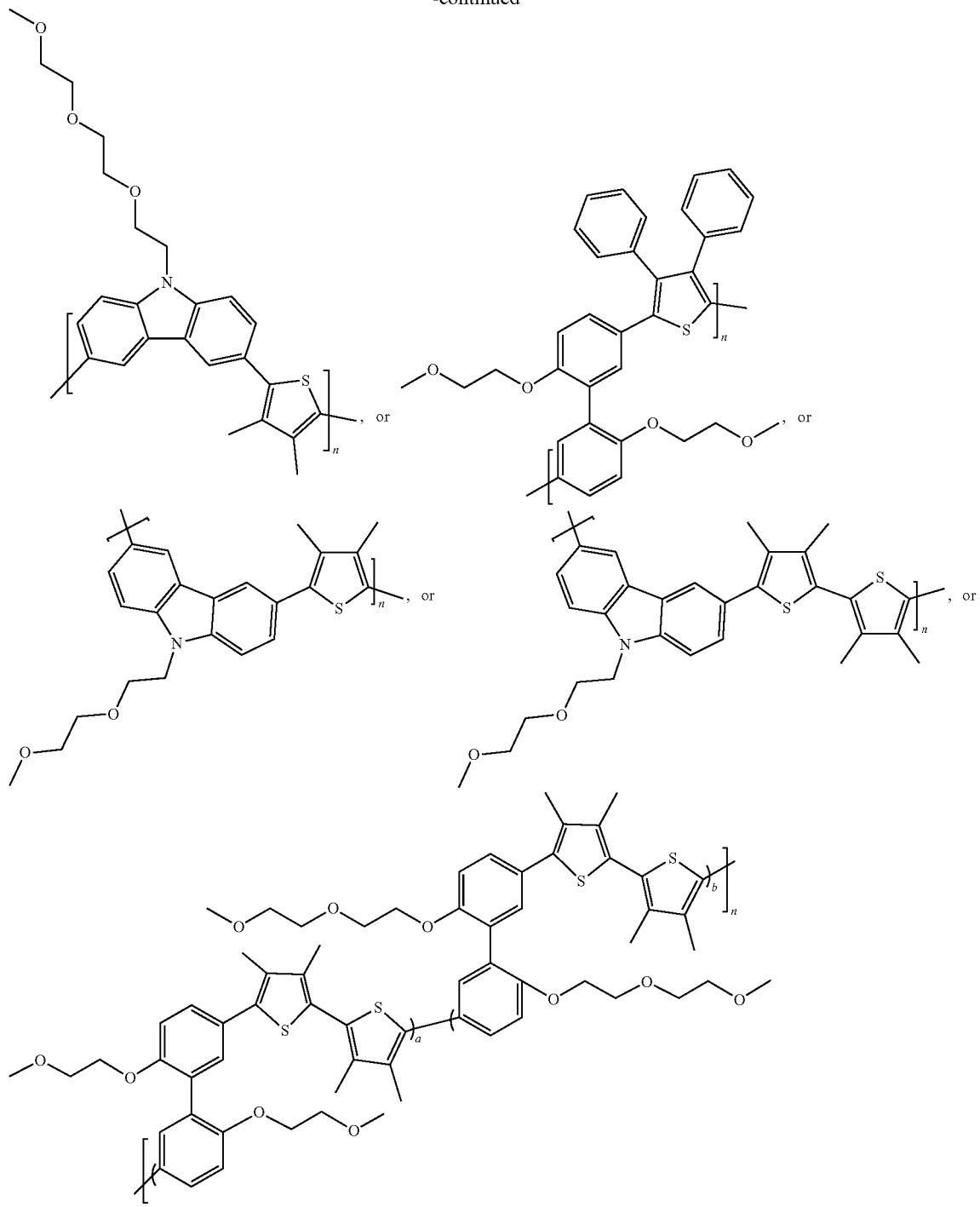

wherein n, and m are integers greater than 0, a and b are integers equal to or greater than 0 with at least one of a and b is greater than 0.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings below. For the purpose of illustrating the invention, the drawings show aspects of one or more embodiments of the invention. However, it should be understood that the present invention is not limited to the precise arrangements and instrumentalities shown in the drawings.

DETAILED DESCRIPTION OF EMBODIMENTS

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it was individually recited herein. Additionally, the singular forms "a" "an", and "the" include plural referents unless the context clearly dictates otherwise.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment, but maybe in some instances. Furthermore, the particular features, structures, or characteristics may be combined in any suitable manner in one or more embodiments.

The present disclosure is related to a new type of electrochromic polymers. The electrochromic polymer disclosed in this application consists of a polymer backbone comprising one or more meta-conjugated linkers (MCLs) and one or more aromatic moieties (Ars). Each of the one or more MCLs is partially conjugated with the one or more Ars at meta positions of the one or more MCLs to form the polymer backbone of an electrochromic polymer. In some embodiments, the electrochromic polymer disclosed in this application consists of a repeat unit comprising one or more MCLs and one or more Ars, where meta-conjugation is introduced along the polymer backbone through the use of the MCLs. In some embodiments, the electrochromic polymer is anodically-coloring electrochromic polymer (AC-ECP), becoming colored when it is oxidized.

Figure 1A:
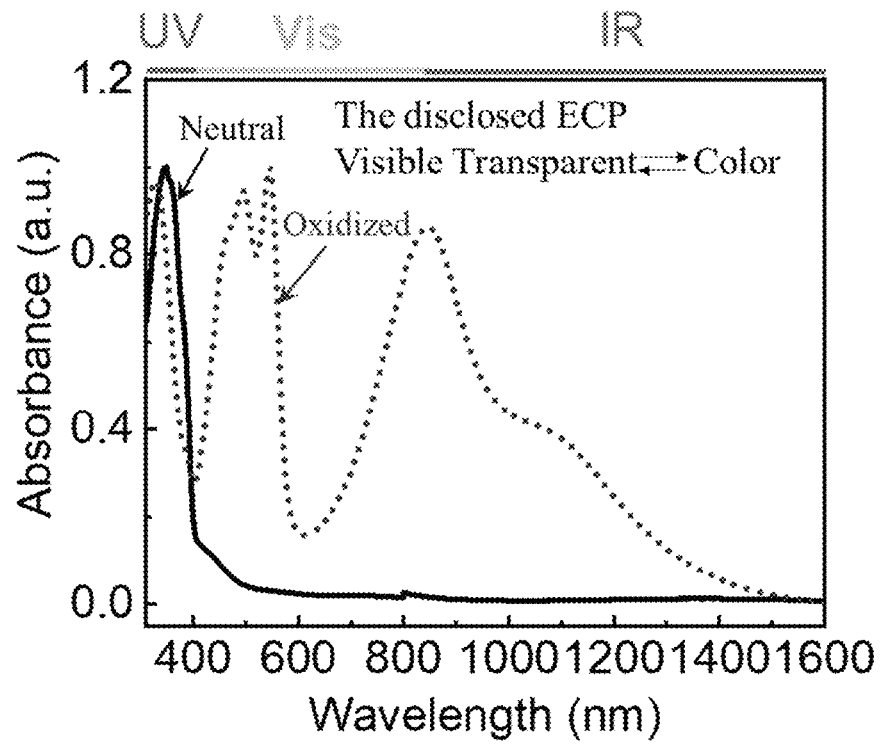
FIGS. 1(A)-(B) are diagrams representing the different color changing mechanisms of the disclosed ECP (FIG. 1(A)) compared to conventional ECP (FIG. 1(B)).
Figure 1B:
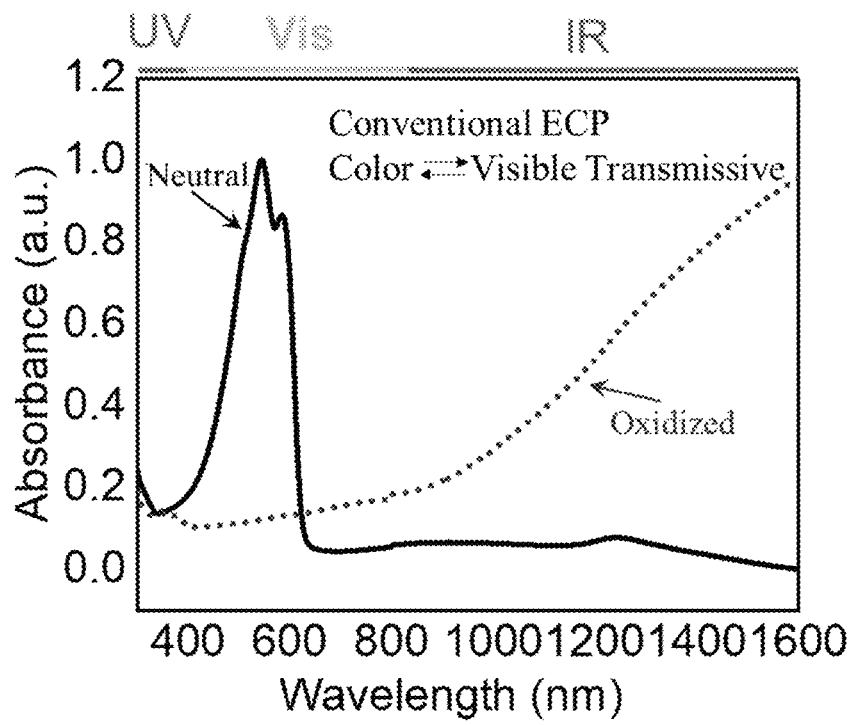

As illustrated in FIG. 1, conventional conjugated ECPs (FIG. 1(B)) are fully conjugated and have strong absorbance in the visible light region and are thus colored in their neutral state, while when oxidized (oxidized state), their absorption is shifted toward near-IR region and they become transmissive. However, the oxidized polymers still have weak absorption in the visible light region, leading to residue colors. On the other hand, as illustrated for one example disclosed ECP in FIG. 1(A), the ECP exhibits substantially no absorption after 450 nm in the neutral state and has several absorption peaks in visible light range and the near infrared range in the oxidized state, demonstrating coloring in the visible light range and near-infrared absorbing.

The disclosed electrochromic polymers allows passing or blocking of visible light and near-IR light to be synchronized, which is in one embodiment very useful in an electrochromic window for the management of solar heat gain. The disclosed electrochromic polymers are transparent in the neutral state, and are colored and IR-absorbing in the oxidized state, which are highly desired in order to achieve a high optical contrast, a high transmittance and a synergistic solar-heat gain.

The disclosed electrochromic polymers are transparent in the visible light region in the neutral state and are colored in the oxidized state. For example, the disclosed electrochromic polymers may have a transmittance of at least 60% in the visible light range (e.g., 450-750 nm) in the neutral state. In some embodiments, the disclosed electrochromic polymers may have a transmittance of at least 65%, 70%, 75%, 80%, 85%, 90%, 92%, 95%, 98%, or above in the range of 450-750 nm in the neutral state. In some embodiments, the disclosed electrochromic polymers are transparent in the visible light range in the neutral state. In the oxidized state, the disclosed electrochromic polymers have absorption in the visible light range (e.g., about 360 to 750 nm) and the near-IR range (e.g., about 750 to 1600 nanometers), thereby being colored and near-infrared absorbing.

The disclosed electrochromic polymer has UV absorption and energy bandgap. An energy bandgap is the energy difference between the valence band of electrons and the conduction band. It is the minimum change in energy required to excite an electron up to a state in the conduction band where it can participate in conduction. Absorption onset ($\lambda_c$) is the wavelength at higher than which the polymer has no photon absorption. The energy bandgap can be calculated as 1240/wavelength of absorption onset. In some embodiments, the electrochromic polymers disclosed in this application have an absorption onset at equal to or less than 450 nm in the neutral state. In some embodiments, the disclosed electrochromic polymer has an absorption onset at equal to or less than 440 nm, 430 nm, 420 nm, 410 nm, 405 nm, or 400 nm in the neutral state. In some embodiments, the absorption maxima ($\lambda_{max}$, the wavelength at which the polymer has its strongest photon absorption) are less than 420 nm in the neutral state. In some embodiments, the absorption maxima are less than 410 nm or 405 nm or 400 nm in the neutral state. In some embodiments, the disclosed electrochromic polymer has an energy bandgap equal to or higher than 2.8 eV and less than 4.0 eV in the neutral state. In some embodiments, the disclosed electrochromic polymer has an energy bandgap equal to or higher than 2.9, 3.0 or 3.1 eV and less than 4.0 eV in the neutral state. In some embodiments, the disclosed electrochromic polymer is colorless (e.g., no absorbance in 400-750 nm or 410-750 nm or 420-750 nm) or yellow (e.g., tailing absorption in 400-500 nm, or 410-500 nm, or 420-500 nm or 400-480 nm, or 410-480 nm or 420-480 nm or 400-450 nm, or 410-450 nm or 420-450 nm) in the neutral state and is colored and visible and near-IR absorbing in the oxidized state. The oxidized electrochromic polymer has an absorption coefficient larger than $10^4$ cm$^{-1}$ in the visible and/or near-IR region and thus colored in the oxidized state.

Due to substantial lack of absorbance in the visible light range in the neutral state and high absorbance in the visible light range in the oxidized state, the disclosed electrochromic polymers demonstrate high optical contrast and high optical transmittance when comparing with conventional ECPs. In spite of their high bandgaps, the disclosed electrochromic polymers have relatively low oxidation potential in the ranges of 0.1-1.5 V inclusive versus Ag/AgCl electrode in some embodiments. In some embodiments, the disclosed electrochromic polymers have low oxidation potential in the ranges of 0.1-1 V inclusive versus Ag/AgCl electrode. The relatively low oxidation potential can benefit cycling durability of ECPs. Thus, the disclosed electrochromic polymers can be successfully incorporated into a device with a good cycling stability/reliability and a high optical contrast.

The MCL comprises at least one of an aromatic structure, or a fused aromatic structure, or the combinations thereof. The aromatic structure comprises a benzene or heterocyclic structure. The fused aromatic structure comprises a fused benzene structure or a fused heterocyclic structures or a fused benzene and heterocyclic structure. In some embodiments, the MCL comprises at least one of benzene, or naphthalene, or five-membered heterocycle, or benzene fused five-membered heterocycle, or a combination of these structures. Side chains or aromatic side chains can also be introduced onto the MCL to adjust its performance, for example, solubility or processability or stability.

In some embodiments, the one or more MCLs and the one or more Ars are arranged in an alternative or random fashion with a general formula of

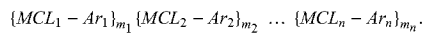

In the structure here, n is an integer higher than 0 and each of $m_1, m_2, \ldots, m_n$ is an integer equal to or higher than 0 with at least one of $m_1, m_2, \ldots, m_n$ is higher than 0. The one or more Ars are aromatic moieties, which may include one or more aromatic structures. Each of the one or more MCLs (or Ars) can be the same as or different from each other.

Meta-conjugation is introduced in the polymer backbone through the use of the one or more MCLs. Each of the one or more MCLs is partially conjugated in the polymer backbone by connecting with the one or more Ars through its meta-positions. For example, the meta-positions are two positions of the aromatic structure or a fused aromatic structure of the MCLs. When the meta-positions are connected, the pi electrons from an aromatic structure or a fused aromatic structure cannot be fully delocalized to another adjacently-connected unit through p-orbitals.

In some embodiments, an aromatic structure of the MCLs comprises a benzene structure or a five-membered heterocyclic structure, and the aromatic structure of the MCLs is substituted at meta-positions, which are the 1- and 3-positions on the aromatic structure. In some embodiments, a fused aromatic structure of the MCLs comprises naphthalene, and the fused aromatic structure is substituted at meta-positions, which are the 1- and 3-, or 1- and 4-, or 1- and 6-positions on naphthalene. In some embodiments, a fused aromatic structure of the MCLs comprises benzene fused with a five-membered heterocycle, and the fused aromatic structure is substituted at meta-positions, which are the 1- and 3-, or 1- and 5-positions on the benzene fused heterocycle.

Example structures of the one or more MCLs and corresponding meta-positions may include one of the followings:

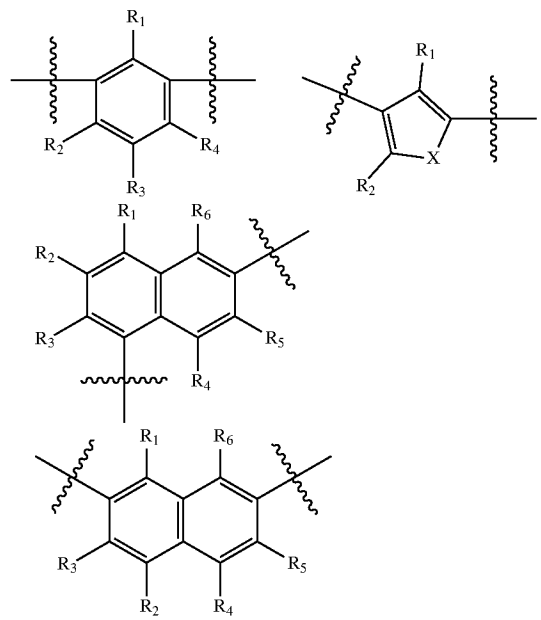

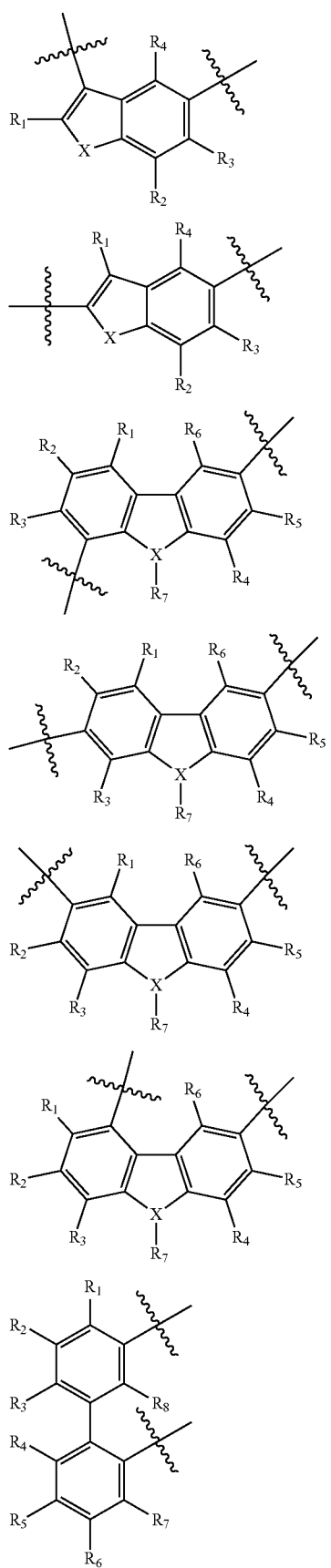
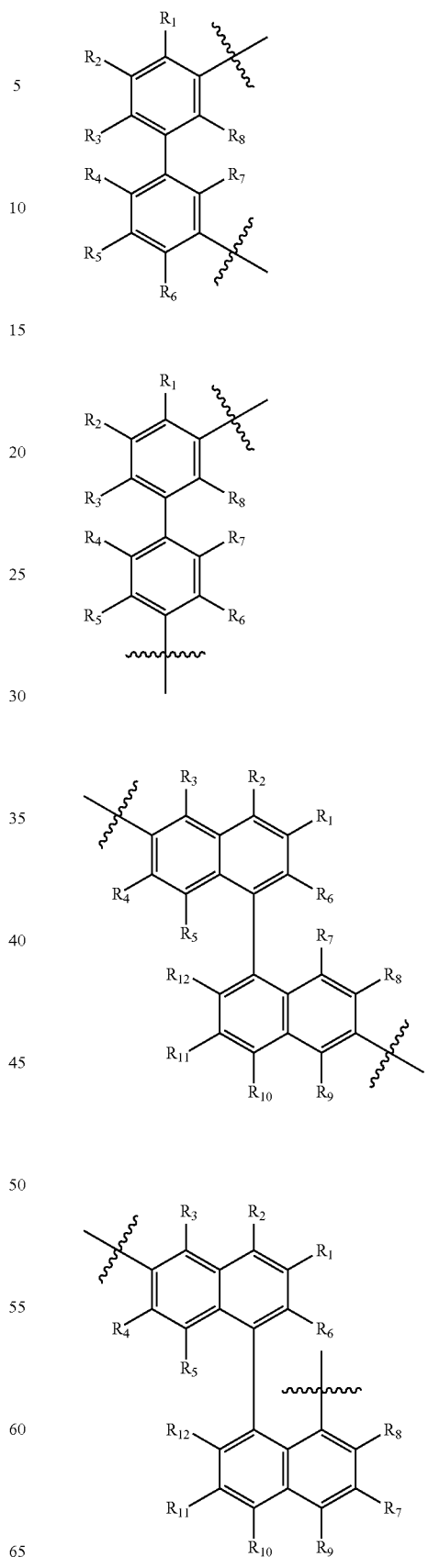

-continued
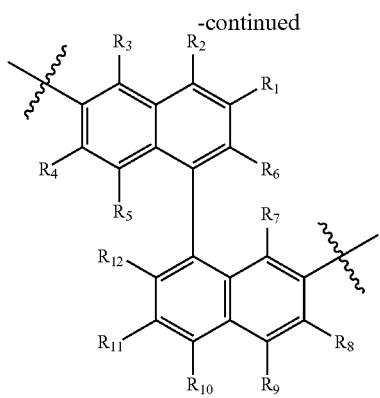
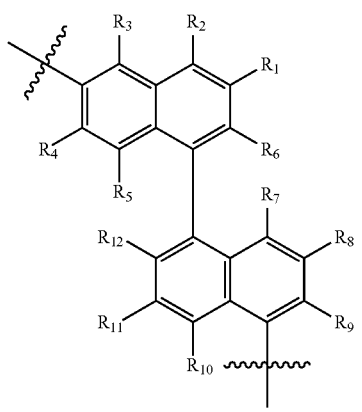
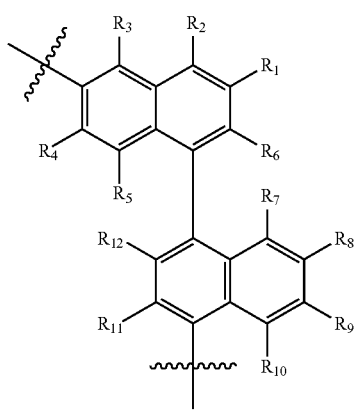
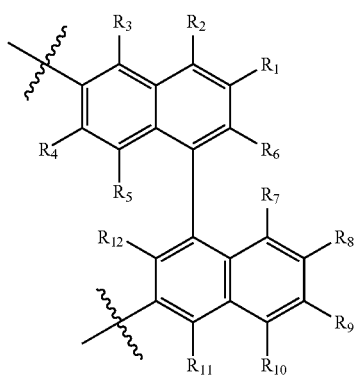
-continued
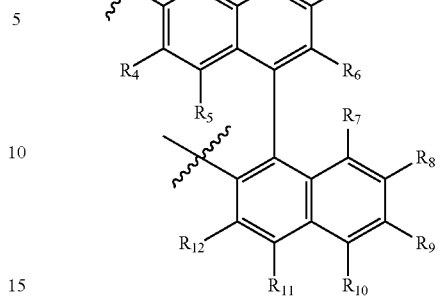
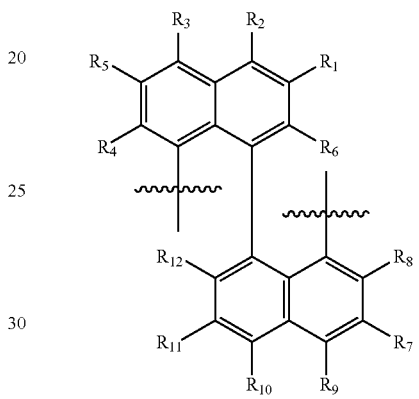
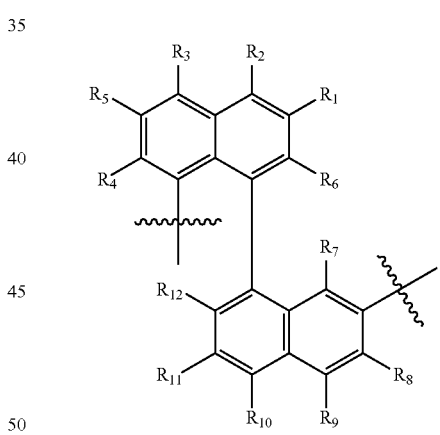
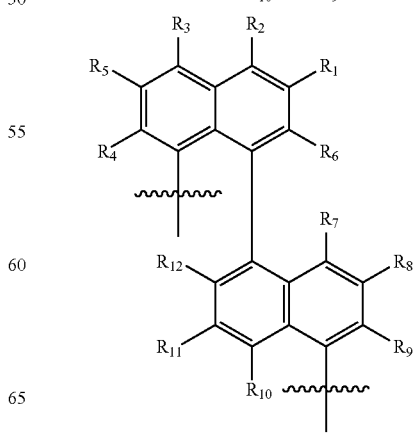

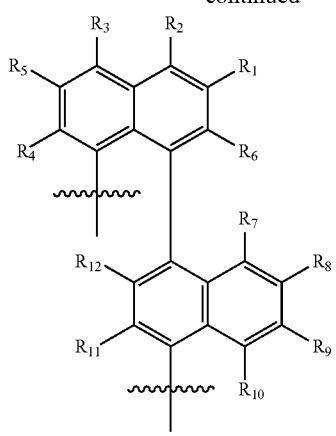
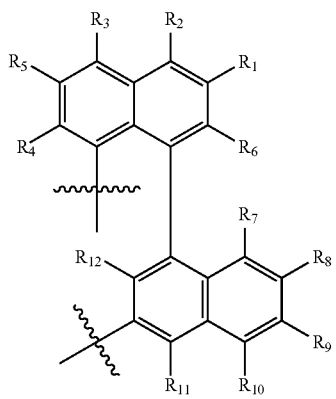
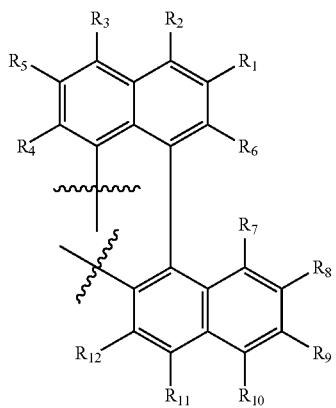
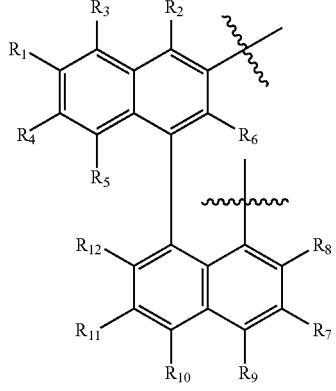
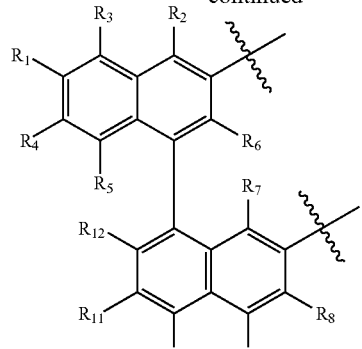
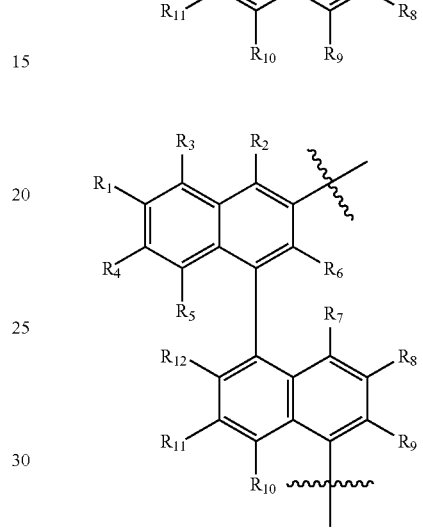
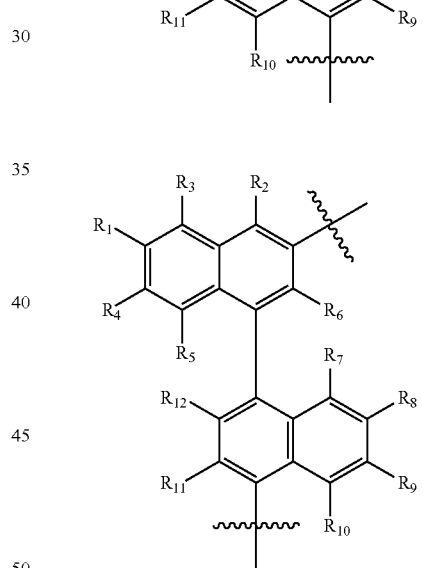
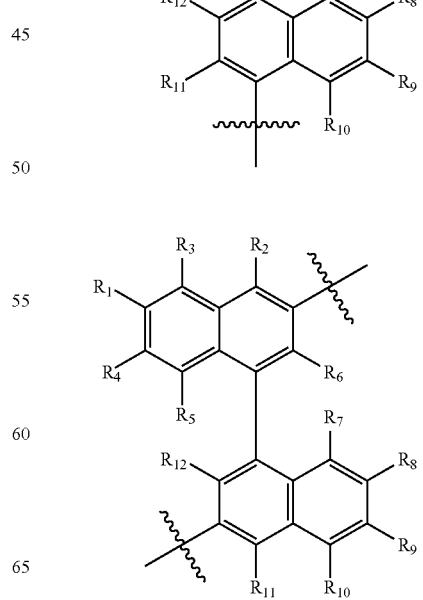

-continued
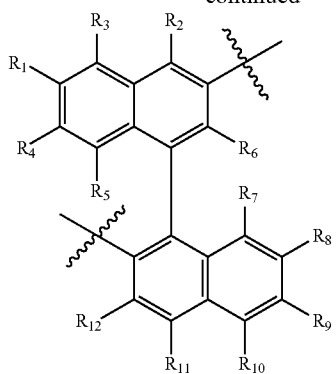
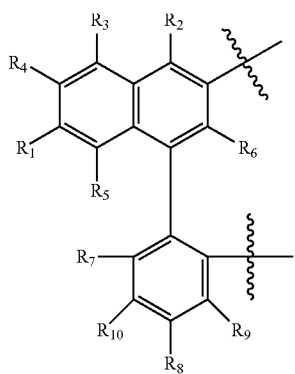
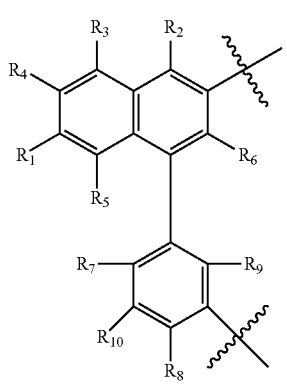
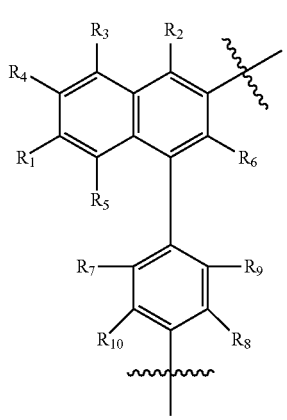
-continued
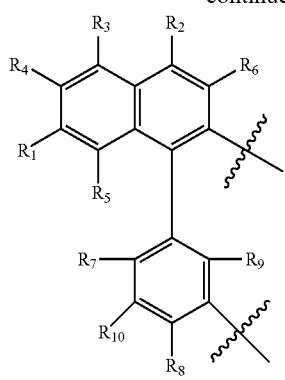
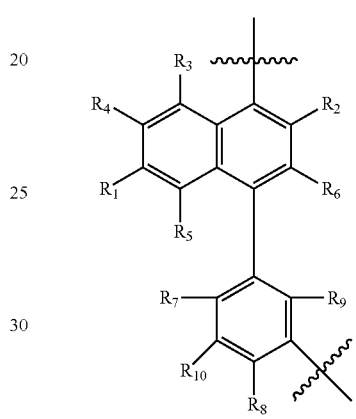
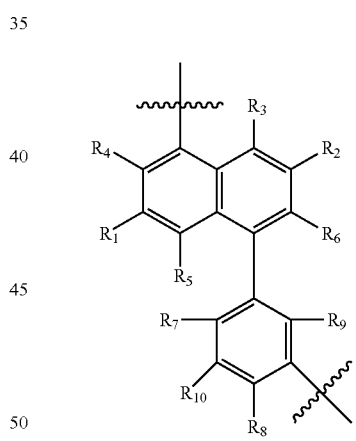
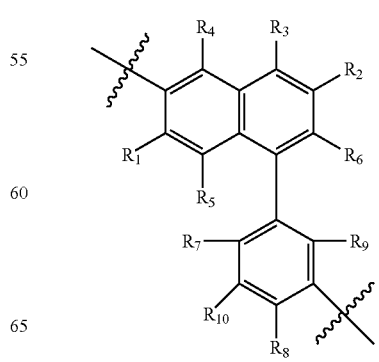

-continued
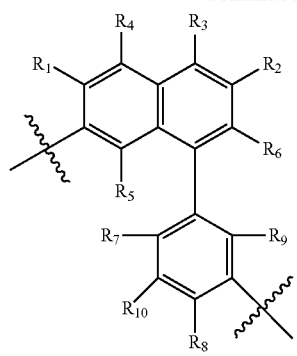
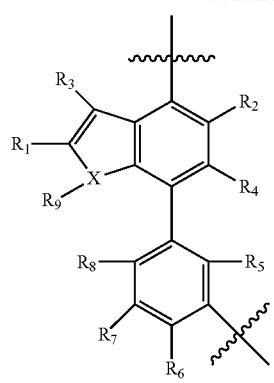
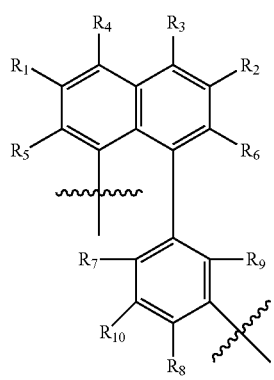
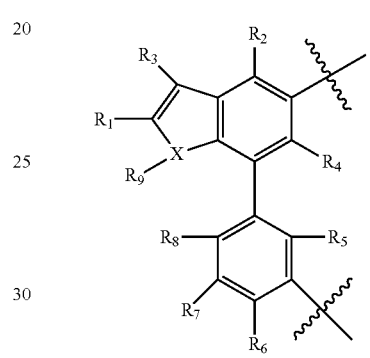
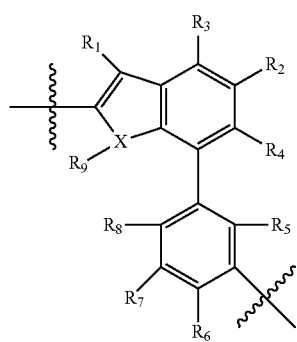
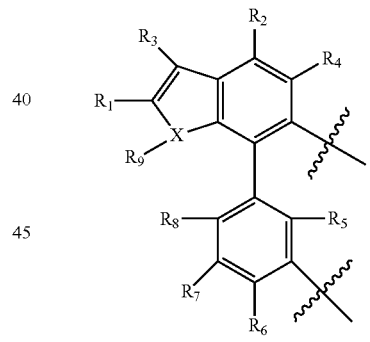
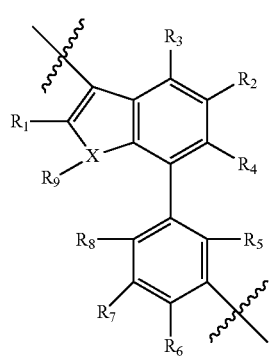
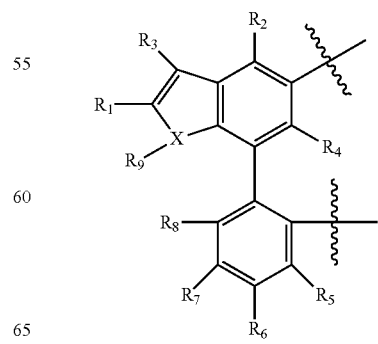

-continued
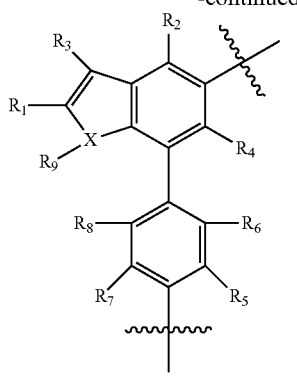
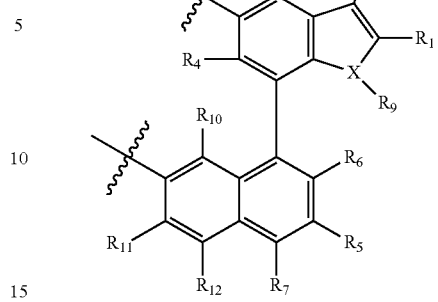
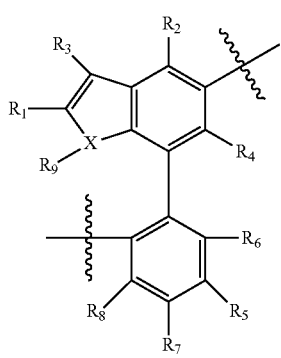
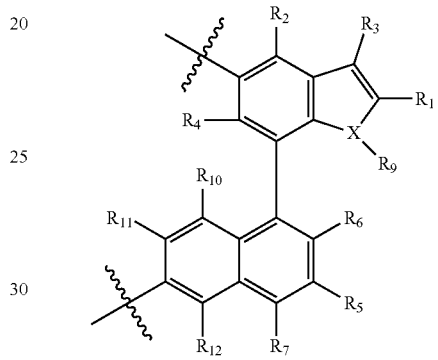
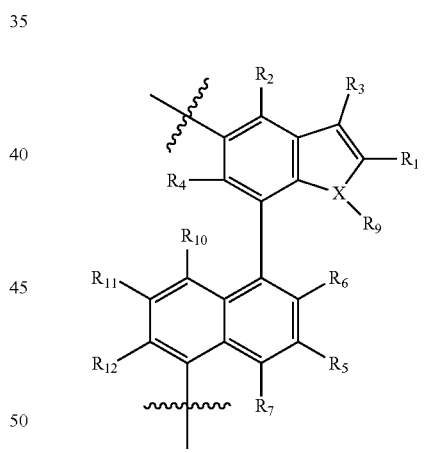
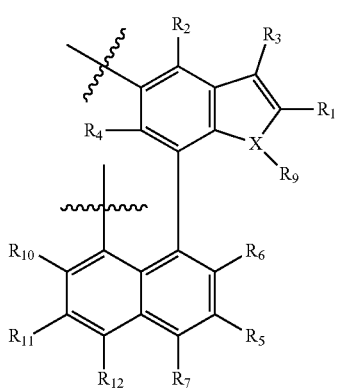
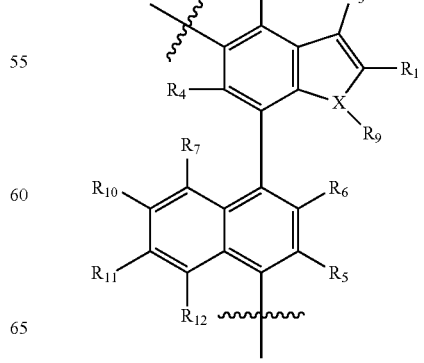

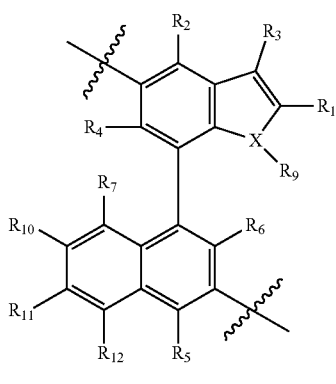

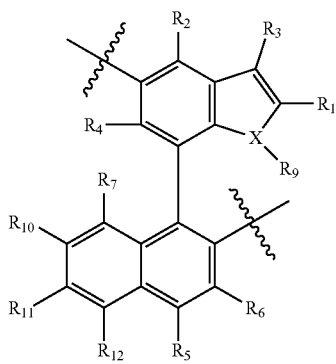

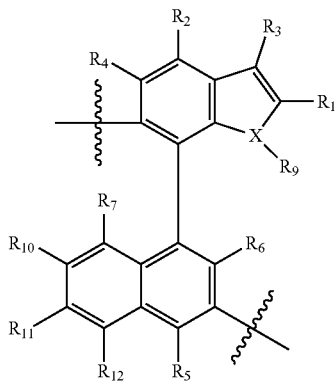

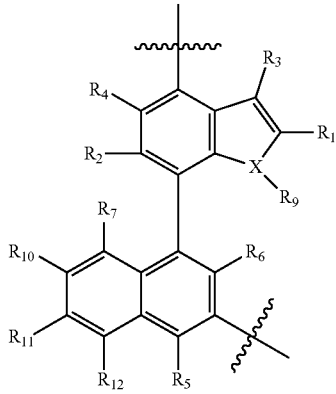

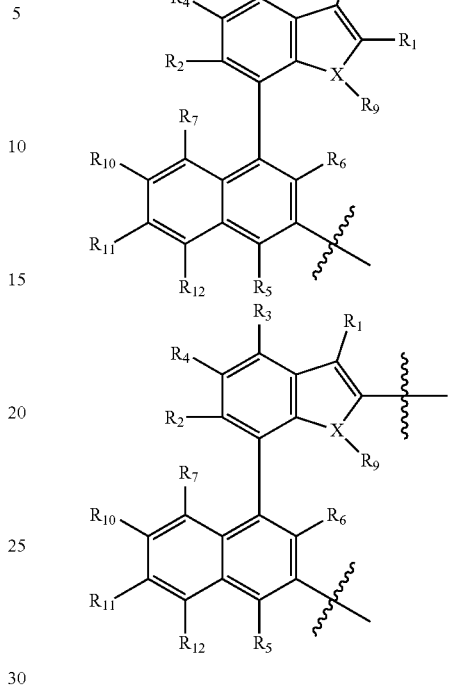

wherein X is S, Se, N, C, or O; $R_1$-$R_{12}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; and the wavy lines represent the meta-positions.

The one or more Ars may include, but is not limited to, any one of a thiophene-based unit, a furan-based unit, a selenophene-based unit, or a pyrrole-based unit with a formula of

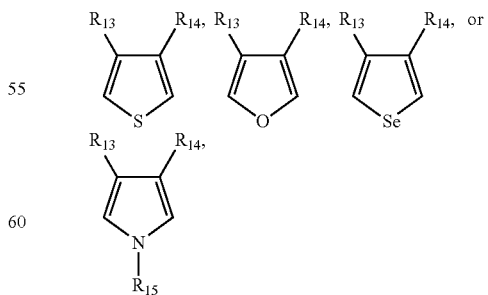

or any combination thereof.

In the structures above, each of $R_{13}$, $R_{14}$ and $R_{15}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

An example thiophene-based unit may include, but is not limited to, the formula of

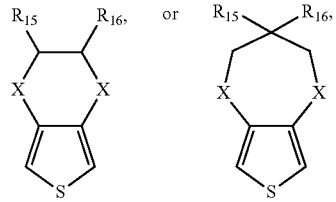

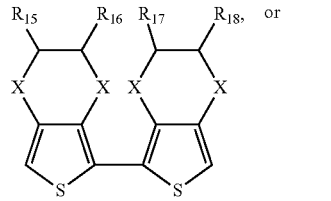

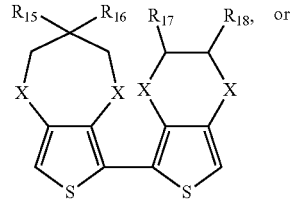

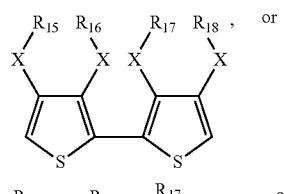

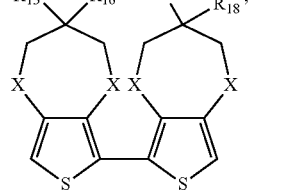

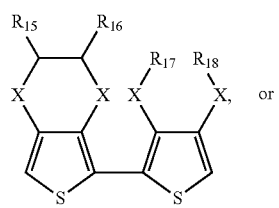

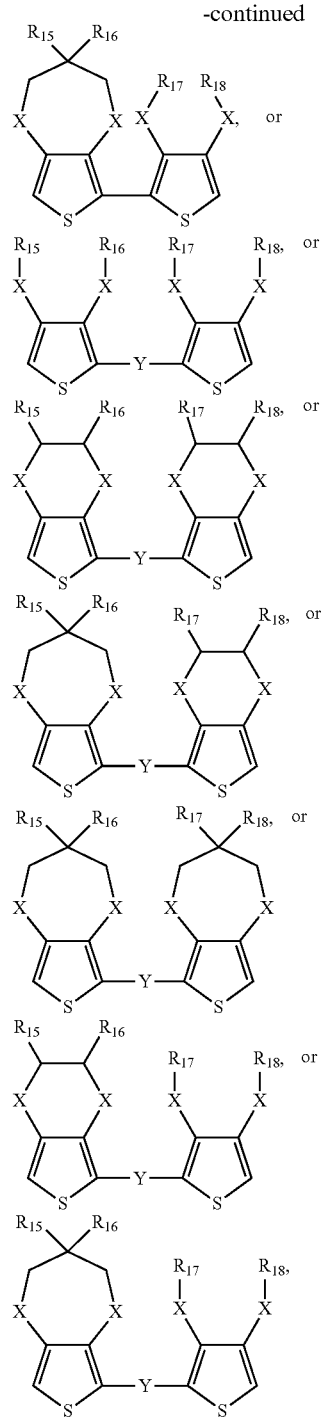

or a combination thereof.

In the structures above, X is S, Se, N, C, or O; each of $R_{15}$-$R_{18}$ is independently selected from the following substituents, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl. Y is any one or more of Ars, or aromatic structures, or fused aromatic structures, or a combinations thereof.

In some embodiments, the X in the thiophene-based unit is O.

By introducing meta-conjugation into the electrochromic polymer backbone, the electronic conjugation along the polymer backbone is interrupted and leads to a high bandgap (>2.0 eV). Thus, the disclosed electrochromic polymer appears highly transmissive (or even transparent) in the neutral state. Oxidation of the ECP results in a lower bandgap (<1.5 eV), and the absorbance of the polymer is red-shifted from UV region to visible and near-IR region. Thus, the polymer becomes highly colored.

The one or more Ars might include one or more aromatic structures or fused aromatic structures. By controlling the types and amounts of the Ars, the redox potentials of the disclosed electrochromic polymer can be easily tuned while maintaining its high transparency within the visible light range in the neutral state. For example, more electron-rich units (e.g., dioxythiophenes) can be introduced onto the backbone to make the polymer more favorable to be oxidized, thereby decreasing its onset potential and improving its electrochemical stability and electrochromic cycling stability. The redox potentials of the disclosed electrochromic polymer can also be adjusted by varying substituents on MCLs (e.g., introducing alkoxy side chains).

The disclosed electrochromic polymers can be dissolved in a solvent, for example, toluene or p-xylene, which can be used for solution-processable film casting processes. By controlling the concentration of the polymer solution, a polymer thin film with a controllable thickness can be obtained. Furthermore, the excellent solubility makes the disclosed electrochromic polymers compatible with various casting methods, for example, spin-coating, spray-coating, and drop-casting. Manufacturing friendly process makes its extended applications feasible.

Examples are shown in the following.

EMBODIMENTS

Example 1 ECP-1

In some embodiments, the disclosed ECP-1 has a formula of

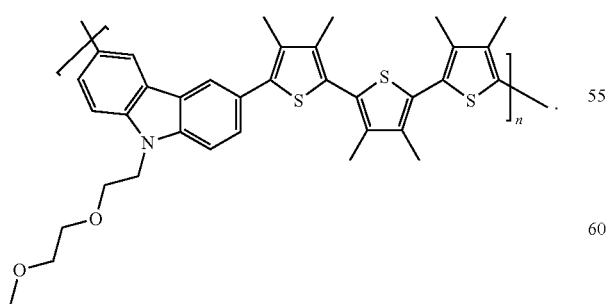

The ECP-1 is synthesized by preparing a carbazole-containing reaction unit and then polymerizing it with a dimer unit. The detail method includes the following steps:

Step 1: preparing a carbazole-containing reaction unit (compound 2).

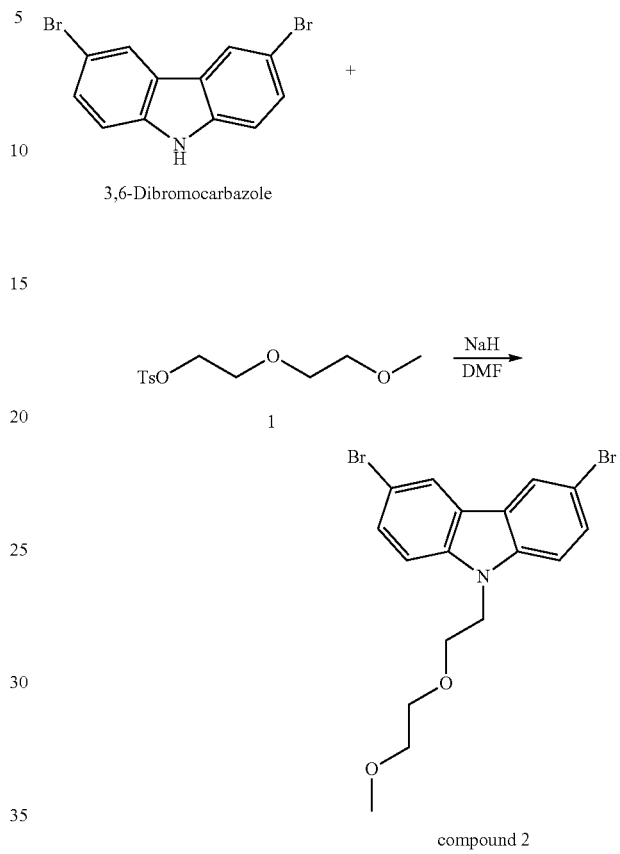

3,6-Dibromocarbazole is dissolved in DMF. Subsequently, 1.2 eq of NaH is added, and the mixture is stirred for 2 hours. Then 1.2 eq compound 1 is added into the reaction, and the mixture is stirred overnight. After that water is added into the reaction to precipitate out the solid. The suspension is filtered to get the desired product compound 2 as a white solid.

Step 2: polymerization: carbazole-containing reaction unit polymerizing with a dimer unit.

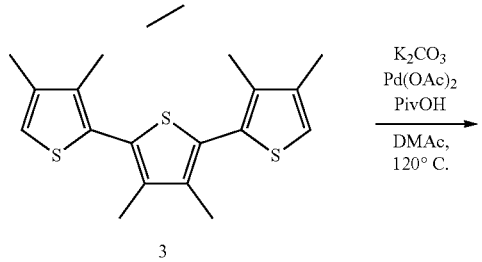

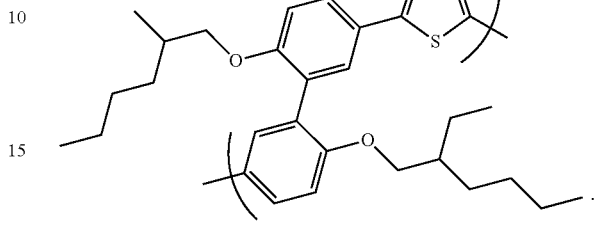

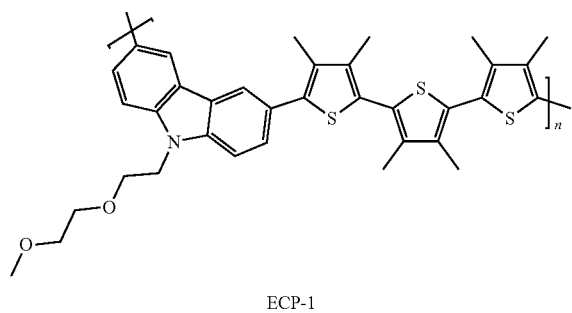

ECP-1

Compound 2 (1 eq), compound 3 (1 eq), K₂CO₃ (2.6 eq), PivOH (0.3 eq), Pd(OAc)₂, (0.02 eq) are added into a Schenk tube. Then vacuum (3-5min) and refill the tube with nitrogen. Repeat this procedure for three times. Subsequently, nitrogen degassed solvent Dimethylacetamide (DMAc) is added, and the mixture is heated to 120° C. and last for 14 hours. Then the mixture is poured into methanol to precipitate out the crude polymer solid. Filter to get the solid and re-dissolve the solid into chloroform and wash with water for three times. The chloroform solution is added into large amount of methanol and precipitate out the polymer. The suspension is filtered to get the desired product polymer ECP-1.

Figure 2:
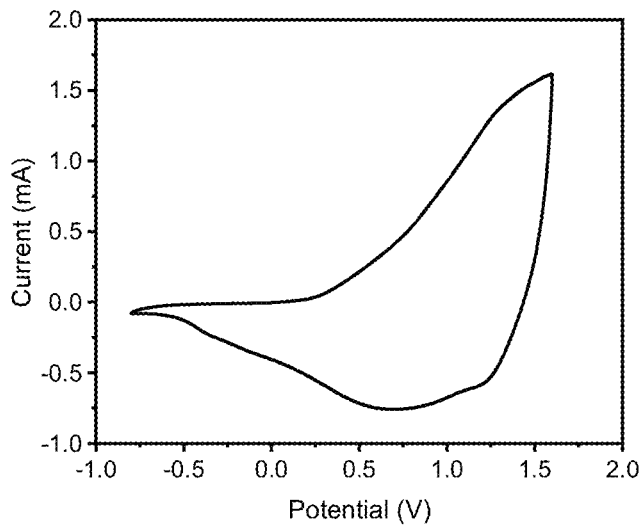
FIG. 2 is the CV data of an exemplary solid-state device using an example ECP-1, according to one embodiment.
Figure 3:
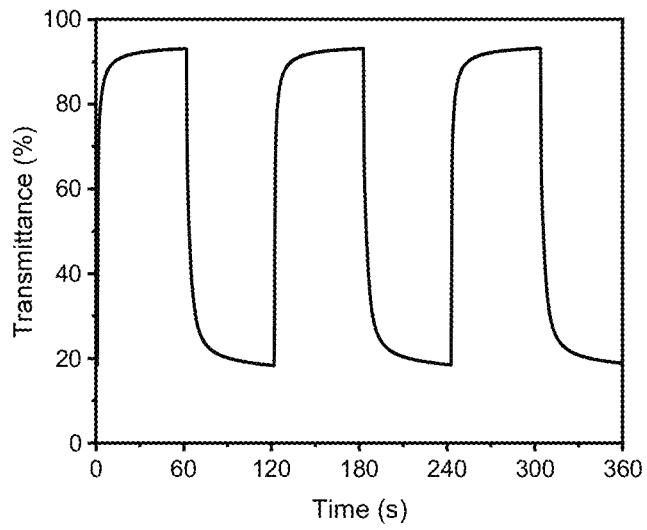
FIG. 3 is the switching kinetics of the exemplary solid-state device using the example ECP-1 at 545 nm, according to one embodiment.
Figure 4:
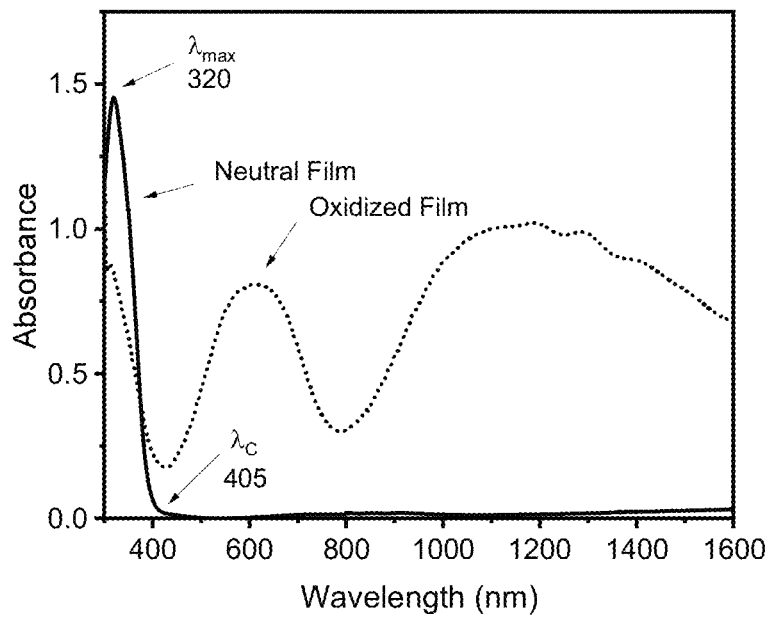
FIG. 4 are the absorbance spectra of the exemplary ECP-1 thin film at different voltages, according to one embodiment.

The obtained ECP-1 has an oxidation potential of around 0.75 V (vs. Ag/AgCl) and an energy bandgap of higher than 3.0 eV. The ECP-1 is fabricated into a solid-state ECD with ECP-1 used as the electrochromic layer, 0.2M of LiTFSI in PEGDA as the electrolyte, and VOx as the ion storage layer. The solid-state ECD can be stably switched between −0.5 V to 1.5 V (FIG. 2). The neutral state and oxidized absorbance spectra of the ECP-1 are shown in FIG. 4 with λ c of 405 nm and λ max of 320 nm. The solid-state ECD shows a high transparency with transmittance as high as 93% in the neutral state (FIG. 3), and switches to a bright blue color when ECP-1 is oxidized with one absorption peak at about 614 nm and another boarder absorption band at the near-IR region, around 900-1100 nm (FIG. 4). The optical contrast of the solid-state ECD is about 75% (FIG. 3).

Example 2 ECP-2

In some embodiments, the disclosed ECP-2 has a formula of

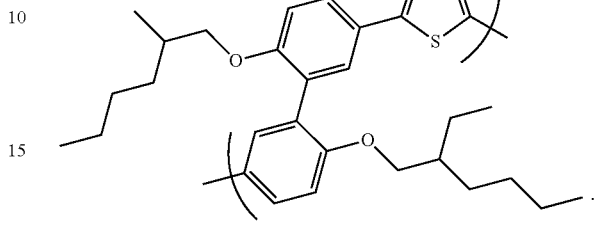

The ECP-2 is synthesized by first preparing a substituted benzene reaction unit and then polymerizing it with an acyclic dioxythiophene (AcDOT) unit. The detail method includes the following steps:

Step 2-1: preparing a benzene-containing reaction unit (compound 4) by two steps.

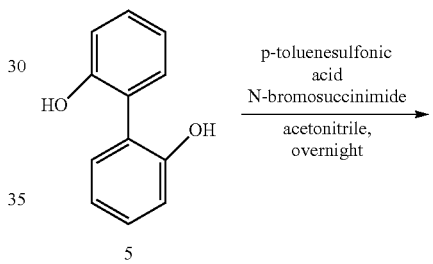

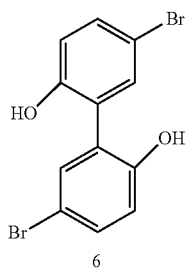

Compound 5 and p-toluenesulfonic acid are dissolved in acetonitrile. Subsequently, N-bromosuccinimide is added, and the mixture is agitated overnight. The suspension is filtered to get the desired product. The product compound 6 is a white solid.

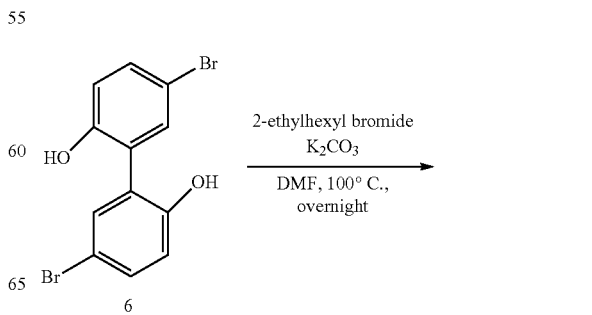

-continued

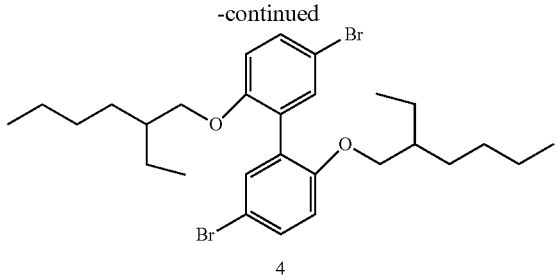

4

Compound 6 is dissolved in DMF under $N_2$. $K_2CO_3$ is added to the solution, and the reaction mixture is stirred for 15 mins, after which 2-ethylhexyl bromide is added. The reaction mixture is stirred at 100° C. overnight. The reaction is stopped and cooled down to room temperature. The solvent is removed in vacuum, and the residue is dissolved in diethyl ether. The organic phase is washed with water, and the aqueous phases are extracted with ethyl acetate. The combined organic phases are dried, and the volatiles is removed by vacuum. The crude is passed through a small silica column, and the solvent is dried in vacuum to get the compound 4 as a yellow oil.

Step 2-2: polymerization: The polymerization method is similar to that in step 1-2 with the reaction units of the substituted benzene reaction unit (compound 4) and AcDOT (compound 8) with a structure of

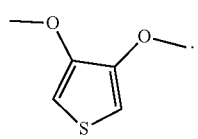

Compound 8

Figure 5:
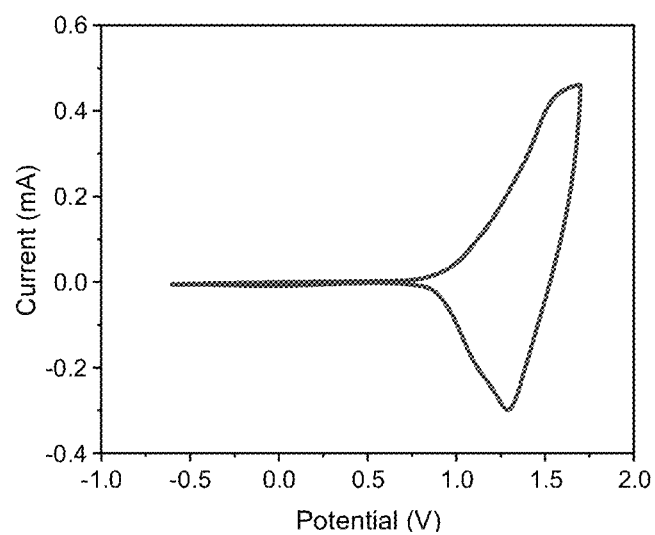
FIG. 5 is the CV data of an exemplary solid-state device using another example ECP-2, according to one embodiment.
Figure 6:
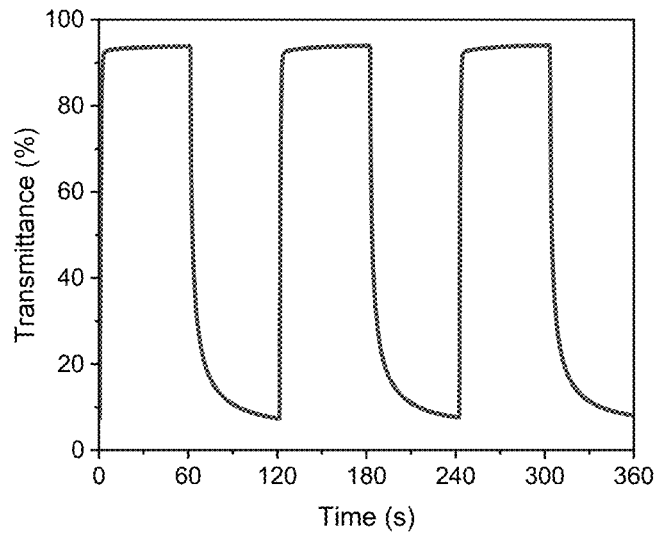
FIG. 6 is the switching kinetics of the exemplary solid-state device using the example ECP-2 at 550 nm, according to one embodiment.
Figure 7:
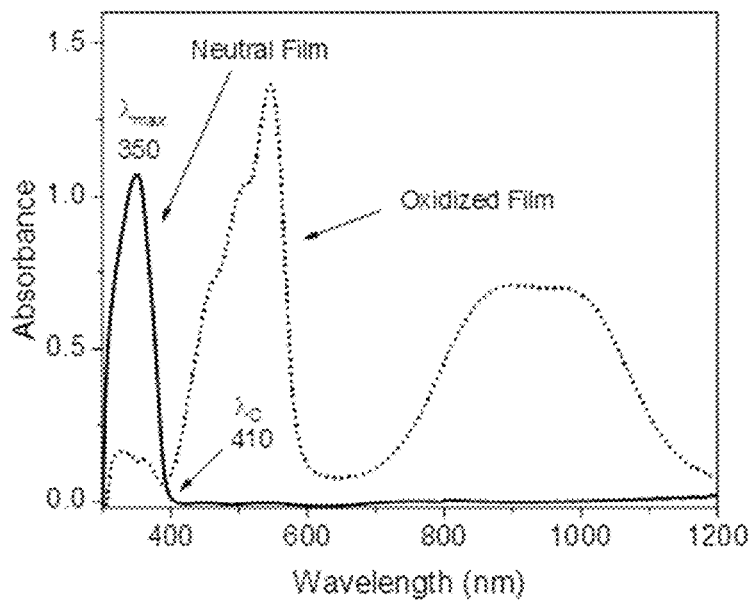
FIG. 7 are the absorbance spectra of the exemplary ECP-2 thin film at different voltages, according to one embodiment.

The obtained ECP-2 has a oxidation potential around 0.95 V (vs. Ag/AgCl) and an energy bandgap higher than 3.1 eV. The ECP-2 is fabricated into a solid-state ECD with ECP-2 used as the electrochromic layer, 1M of $LiPF_6$ in PEGMEA as the electrolyte, and $VO_x$ as the ion storage layer. The solid-state ECD can be stably switched between −0.6 V to 1.7 V (FIG. 5). The neutral state and oxidized state absorbance spectra of the ECP-2 are shown in FIG. 7 with $\lambda_c$ of 410 nm and $\lambda_{max}$ of 350 nm. The solid-state ECD shows high transparency with transmittance as high as 94% at neutral state at 550 nm (FIG. 6), and switches to bright red color when ECP-2 is oxidized with one absorption peak at around 546 nm and another broader absorption band at the wavelength around 800-1100 nm (FIG. 7). The optical contrast of the solid-state ECD is 87% (FIG. 6).

Example 3 ECP-3

In some embodiments, the disclosed ECP-3 has a formula of

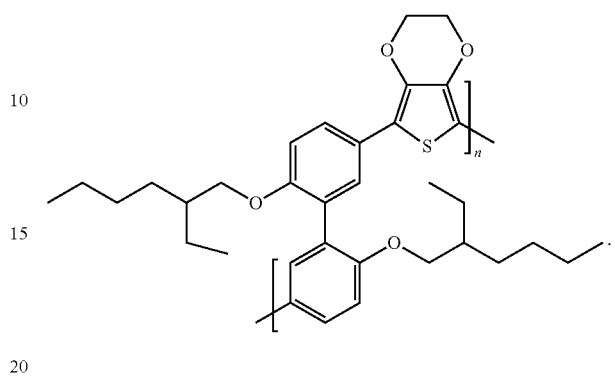

ECP-3 is synthesized by preparing a benzene-containing reaction unit and polymerizing it with a ProDot unit. The detail method includes the following steps:

Step 3-1: the same as Step 2-1

Step 3-2: polymerization: The polymerization method is similar to that in step 1-2 with the different reaction units of benzene-containing reaction unit (compound 4) and 3,4-Ethylenedioxythiophene (EDOT, compound 9) with a structure of Compound 9

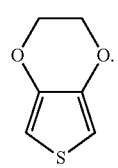

Example 4 ECP-4

In some embodiments, the disclosed ECP-4 has a formula of

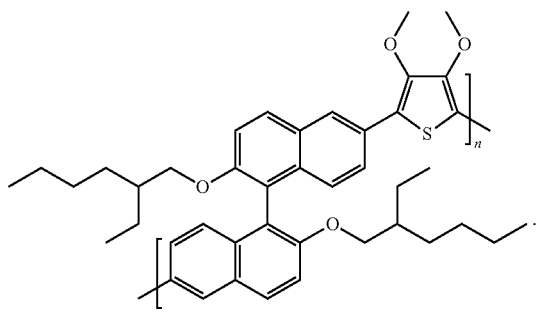

The ECP-4 is synthesized by preparing a naphthalene-containing reaction unit and then polymerizing it with an AcDOT unit. The detail method includes the following steps:

Step 4-1: preparing naphthalene-containing reaction unit (compound 10) by two steps.

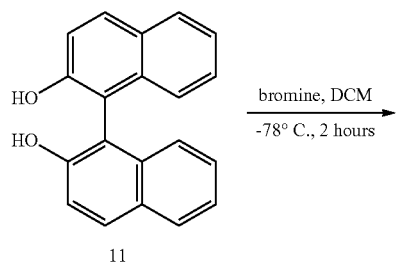

11

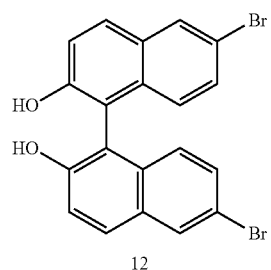

12

To a solution of compound 11 in dichloromethane was added dropwise a solution of bromine in dichloromethane over 15 minutes at −78° C. The reaction mixture is stirred for 2 hours at −78° C. and then warmed gradually to room temperature and stay at room temperature for an additional 2 hours. The excess bromine was quenched by saturated aqueous sodium sulfite solution and stirred for 2 hours at room temperature. After extraction with dichloromethane, the combined organic layer was washed with brine, dried over sodium sulfate, and concentrated in vacuum.

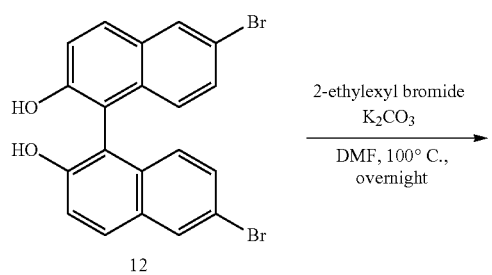

12

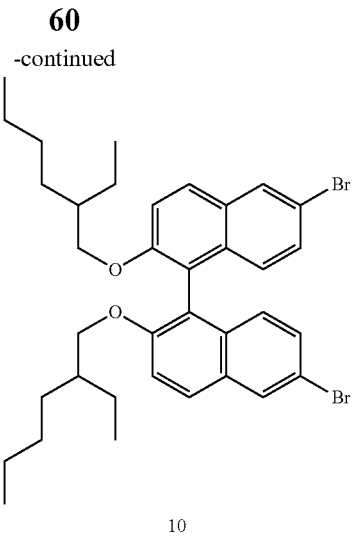

10

Compound 12 is dissolved in DMF under $N_2$, $K_2CO_3$ is added to the solution, and the reaction mixture is stirred for 15 minutes, after which 2-ethylexyl bromide is added. The reaction mixture is stirred at 100° C. overnight. The reaction is stopped and cooled down to room temperature. The solvent is removed in vacuum, and the residue is dissolved in diethyl ether. The organic phase is washed with water, and the aqueous phases are extracted with ethyl acetate. The combined organic phases are dried by vacuum.

Step 4-2: polymerization: The polymerization method is similar to that in step 1-2 with the different reaction units of the naphthalene-containing reaction unit (compound 10) and AcDOT (compound 8).

Example 5 ECP-5

In some embodiments, the disclosed ECP-5 has a formula of

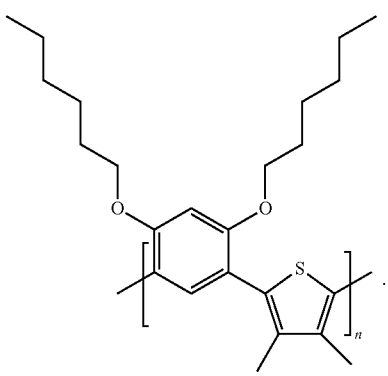

The ECP-5 is synthesized by a similar polymerization method to that in step 1-2 with the different reaction units of 1,5-dibromo-2,4-bis(hexyloxy)benzene and 3,4-dimethylthiophene.

In some embodiments, the disclosed ECP has a formula of
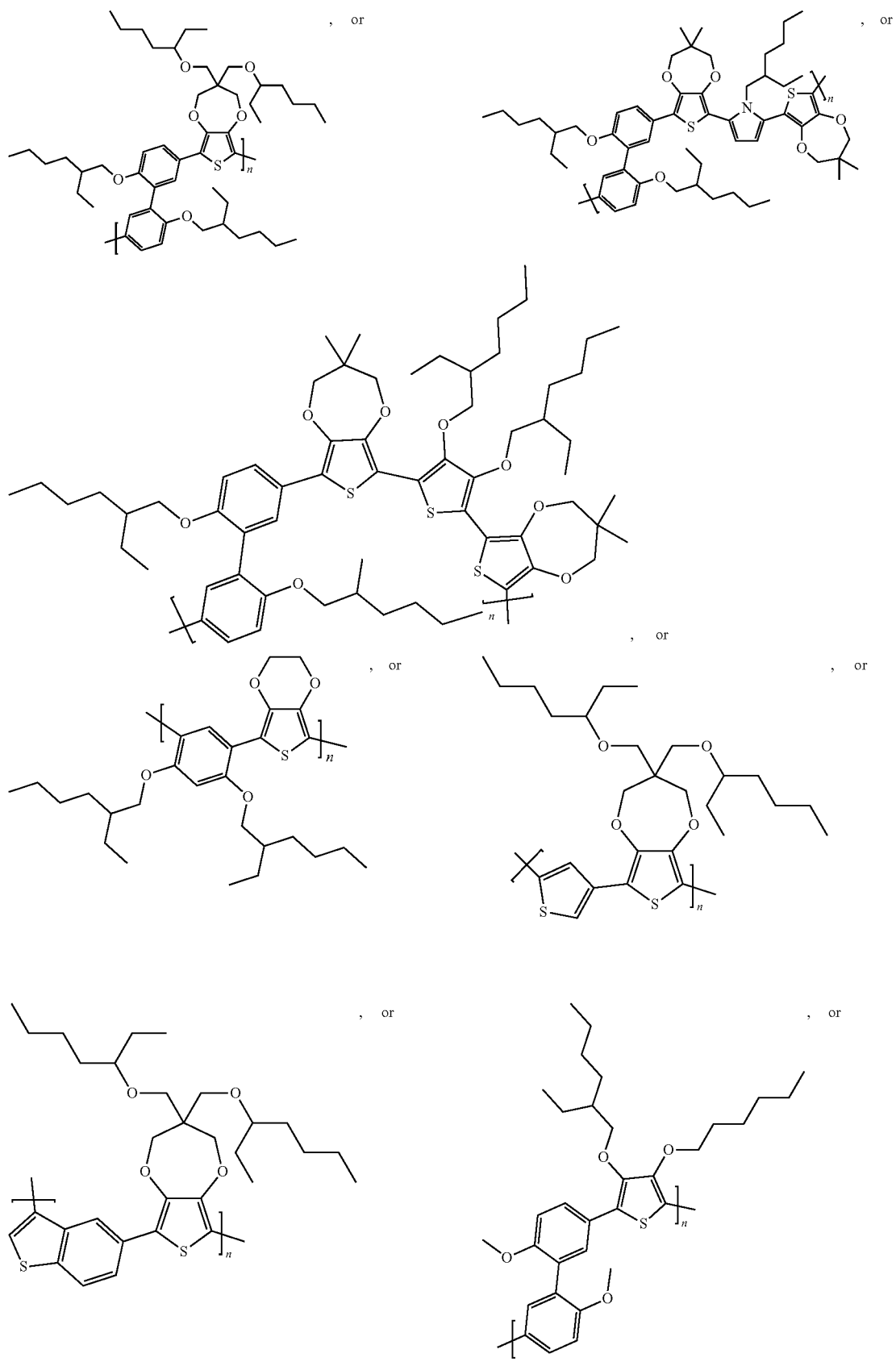

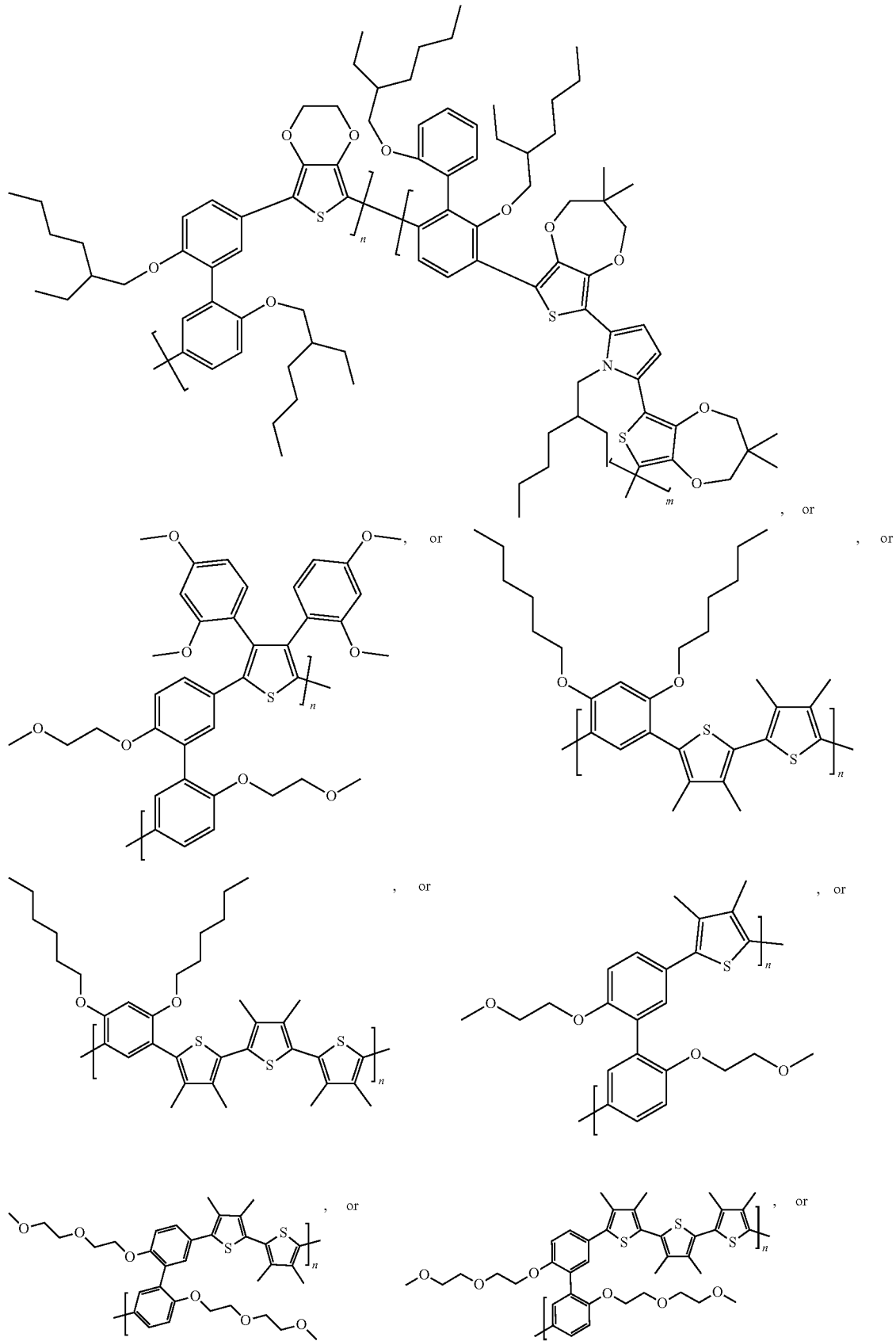

-continued
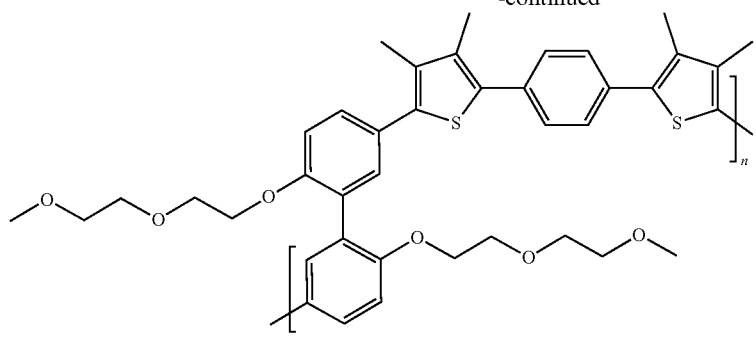
, or
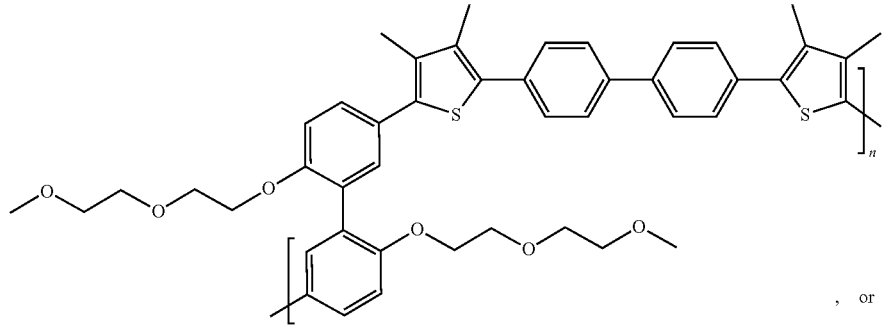
, or
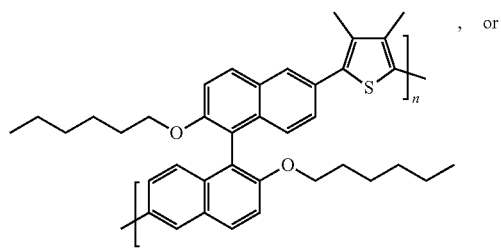
, or
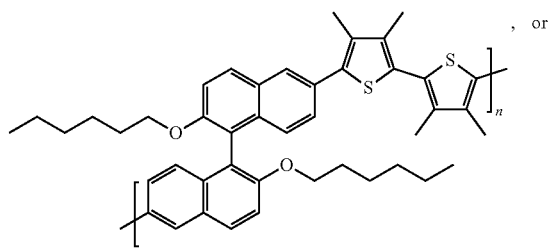
, or
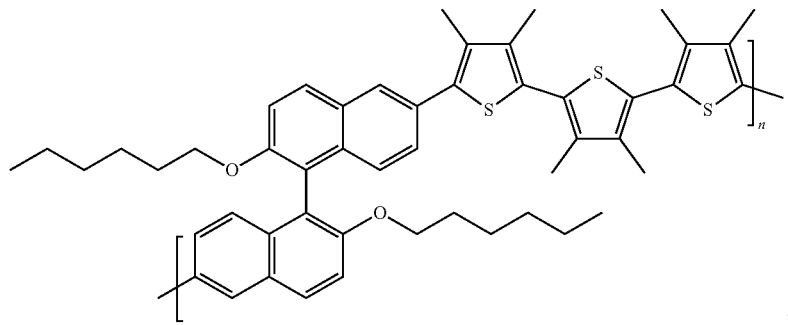
, or
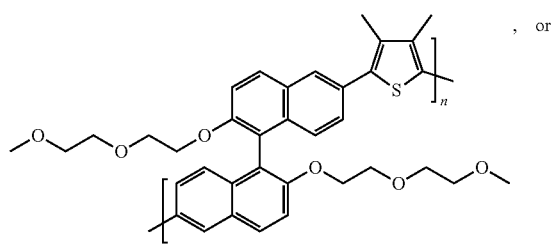
, or
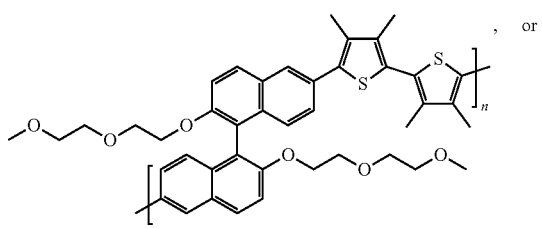

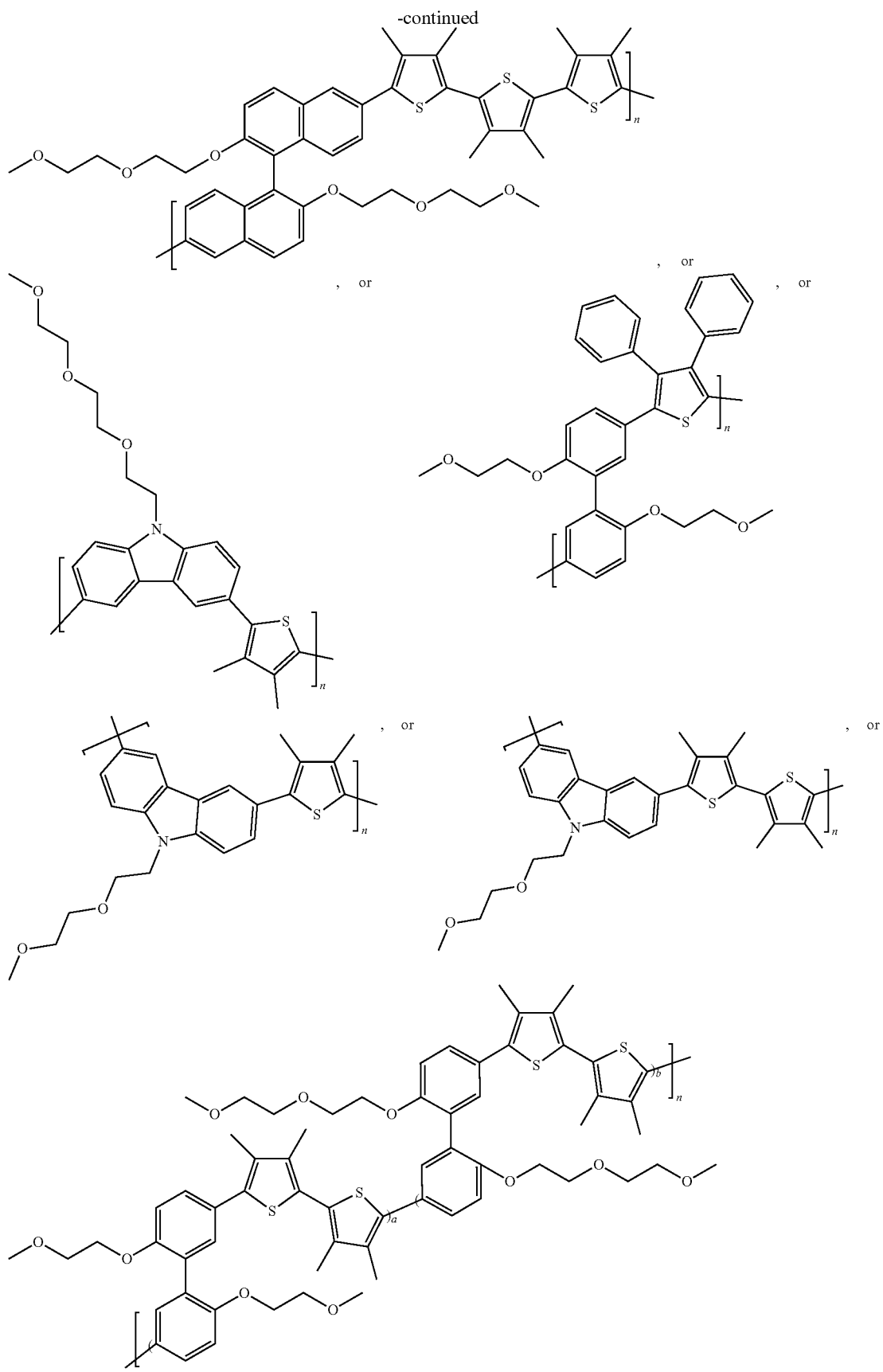

wherein n and m are integers greater than 0, a and b are integers equal to or greater than 0 with at least one of a and b is greater than 0.

In another aspect, the disclosed polymers can have fluorescent emission and can be applied to fluorescent products.

In conventional conjugated electrochromic polymers, the formation of polaron and bipolaron upon electrochemical doping lowers the energy of the optical transition, resulting in red-shift of the absorption from the visible region to the near-IR region and manifesting as color-to-transmissive change. Consequently, their doped state possesses residue absorption throughout the visible region. As the film thickness increases, this residue absorption becomes more severe, and the residue color appears. Thus, conjugated electrochromic polymers exhibit relatively low optical contrast and contrast ratio, a major factor that limits the further adoption of polymer-based ECDs in applications.

In contrast to conventional conjugated ECPs which undergo color-to-transmissive change, the disclosed novel ECPs have transparent-to-colored change. The disclosed polymers exhibit higher energy band gaps so that they absorb light in the UV region without absorption in the visible region in their neutral state, resulting in a transparent state, and in some embodiments, almost 100% transparent. For example, polymers containing chromophore group triarylamine attain transparent-to-colored electrochromic switching. Some conventional small molecules based on ethylenedioxythiophene derivatives that can switch from a transparent to a colored state. However, such designs also give rise to specific challenges. Firstly, these polymers usually exhibit poor switching stability. This is due to the fact that the charges formed in the doped state are unable to be delocalized along the polymer chain, resulting in limited stability and durability. Secondly, electrochromic devices based on organic small molecules are usually in the solution phase, thus the color change depends on the diffusion of molecules onto the electrode, leading to slow switching speeds, intermediate colors, and hampering the applications in flexible devices.

The disclosed electrochromic polymers exhibit almost 100% transmittance (e.g., 85%-99.9%) in the neutral state while showing high absorption in the oxidized state, leading to the highest recorded optical contrast and contrast ratio. The polymer backbone includes or consists of meta-conjugated linkers (MCL) and aromatic moieties (Ars) as described above. The MCL connects the aromatic moieties at the meta position, interrupting the charge delocalization. Therefore, the band gap of the disclosed polymer is increased by meta-conjugation so that the absorption of the neutral polymer could be centered in the UV region to achieve an almost 100% transparent state. On the other hand, the MCL and aromatic moieties provide the conjugation to accomplish low oxidation potential for the transparent-to-colored switching and high switching stability. The color of the polymers can be easily controlled by adjusting the conjugation length of MCL and aromatic moieties. In some embodiments, the disclosed polymers may be made from MCLs, such as carbazole, biphenyl, and binaphthanlene, and thiophenes as aromatic moieties. The disclosed polymers based on this inventive concept show wide color tunability and good electrochromic properties, including optical contrast of over 95% and switching stability of more than 10000 cycles.

EXAMPLES

In the disclosed polymer, each meta-conjugated polymer contains aromatic comonomers which are connected by MCL at meta-position. We design a series of polymers containing carbazole (CBZ), biphenyl (BP), and binaphthalene (BNP) as MCL and varying the number of thiophenes (T1, T2 and T3) to change the length of the aromatic moieties. The structures of these designs are shown below.

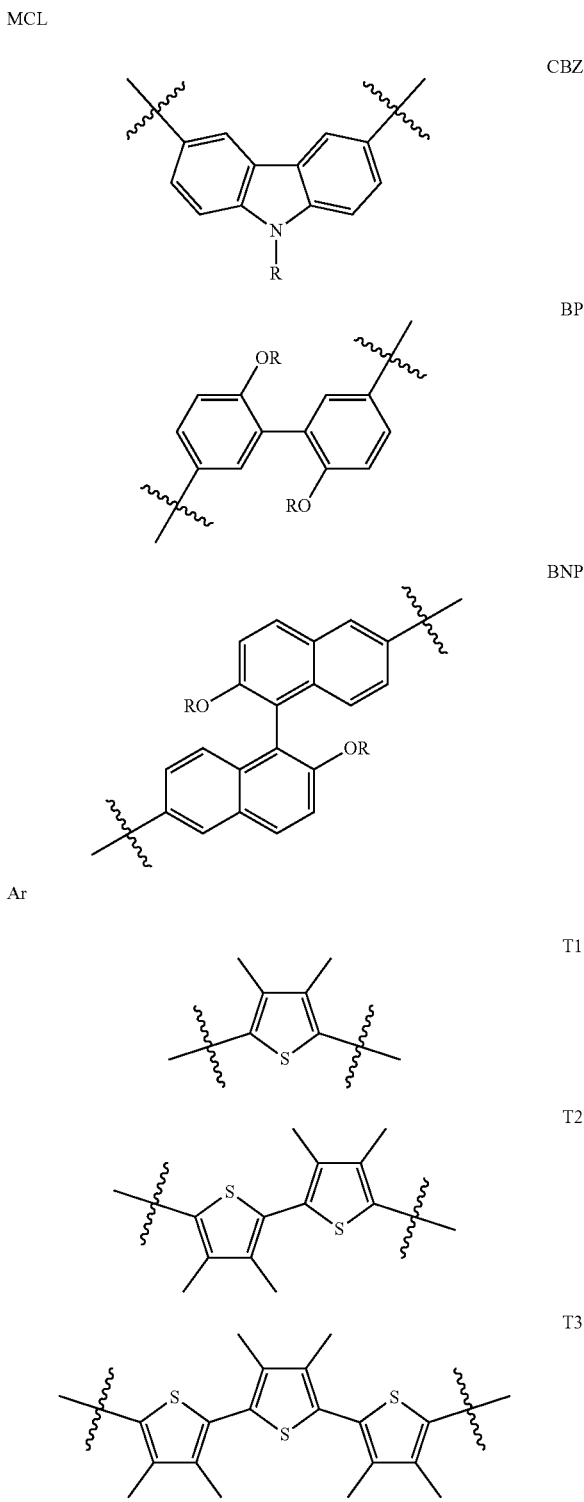

meta-Conjugated

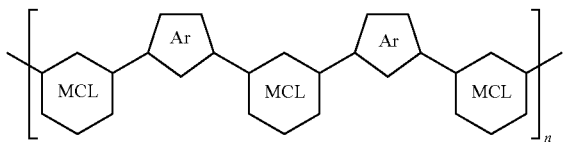

Figure 8A:
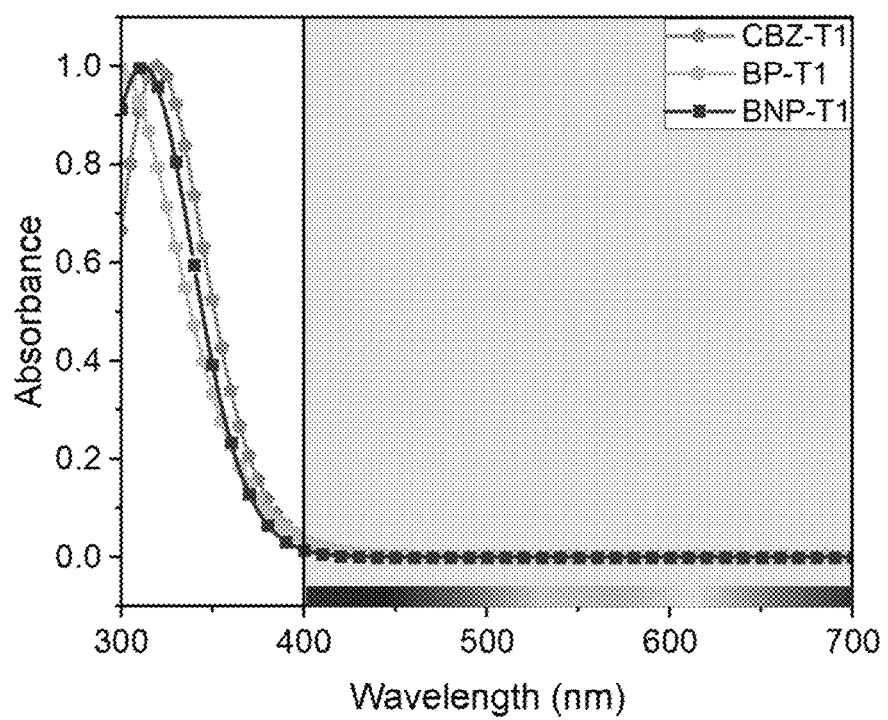
FIG. 8(A) illustrates calculated neutral state UV-Vis spectra of the disclosed meta-conjugated polymers with three representative MCLs, according to some embodiments.
Figure 8B:
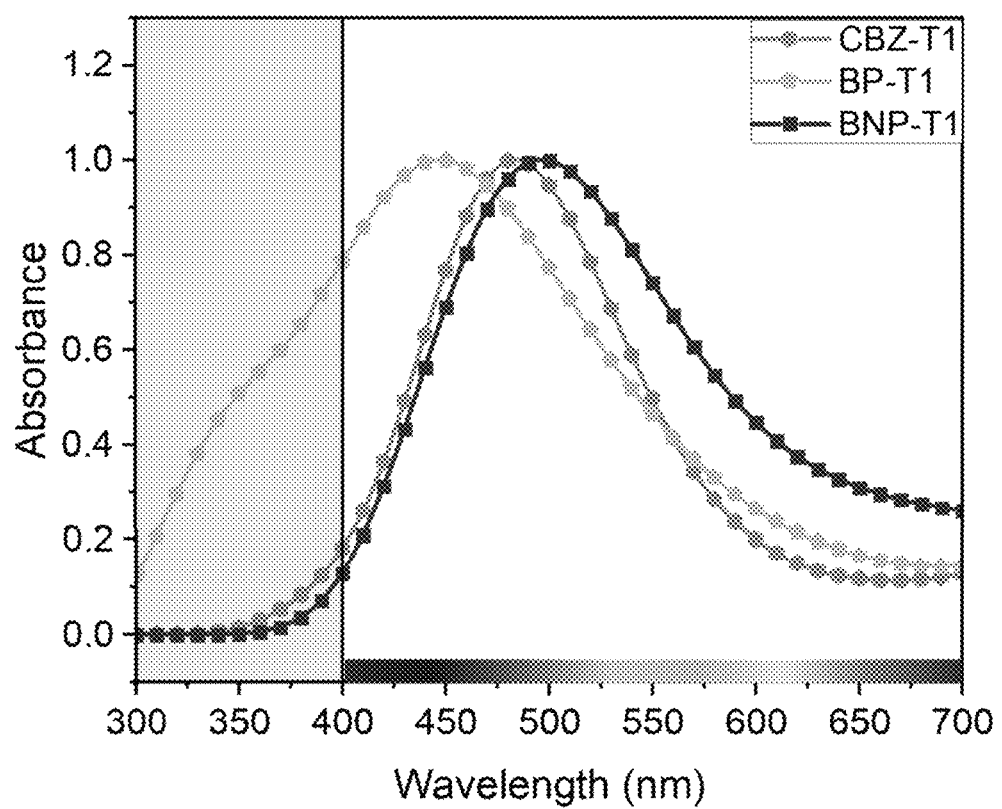
FIG. 8(B) illustrates calculated oxidized state UV-Vis spectra of the disclosed meta-conjugated polymers with three representative MCLs, according to some embodiments.

In order to guide experiment and probe the design paradigm from a molecular orbital perspective, density functional theory (DFT) calculations are performed on these meta-conjugated polymers and theoretical spectra are generated for the neutral and radical cation states. The absorption spectra of CBZ-T1, BP-T1, and BNP-T1 in their neutral states exhibit almost 100% transparency in the visible region, with notable absorption occurring solely in the UV region (FIG. 8(A)). While CBZ-T1 and BNP-T1 manifest a slightly red-shifted absorption onset compared to BP-T1, all three polymers maintain absorption wavelengths below 400 nm. In the radical cation (oxidized) states, the absorption in the UV region decreases, leading to an increase in absorption within the visible region (FIG. 8(B)). This transparent-to-colored electrochromism can be further explained by the geometric change of the polymer from neutral to radical cation states. The polymers have a non-planar structure in their neutral state with torsional angles around 50 to 60 degrees between the MCL and adjacent thiophene. This non-planar structure and significant torsional hindrance impede charge delocalization, increasing the neutral polymer's band gap, so polymer absorbs in solely in UV region. Whereas, in radical cation state, the polymer is planarized with the decrease in torsional angles 25 to 40, and thus charges could delocalize along the polymer chain, and the absorption undergoes a red shift to the visible region for coloration. In contrast with BP-T1, the radical cation absorption of CBZ-T1 and BNP-T1 is more red-shifted due to enlarged conjugation from the BNP unit.

The length of aromatic moieties has impact on the optical properties of the polymer. In their neutral states, CBZ-T1, CBZ-T2, and CBZ-T3 exhibit nearly identical absorption spectra, suggesting that the number of thiophene units does not affect the band gap of the polymers in the neutral states. Based on calculation, the torsional angles between MCL and thiophene remain nearly equivalent across polymers as the number of thiophene increases, thus resulting in their corresponding absorption in the UV region to achieve transparency. However, in the radical cation state, increasing the number of thiophene units leads to a red shift in the spectra. Consequently, the radical cation polymers display distinct colors, specifically orange, purple, and blue, corresponding to CBZ-T1, CBZ-T2, and CBZ-T3, respectively. This color variation can be attributed to the significant torsional angle change between thiophenes. In the case of moving from polymers with one thiophene (CBZ-T1) to two thiophene (CBZ-T2), a change in torsional angle (~5 degrees) has been observed. A similar trend has been observed while moving from 2 T to 3 T with torsional angles ~15 degrees, respectively. MCL could hinder the charge delocalization of the neutral polymer and result in almost 100% transparency. The color of the polymer in radical cation state could be tuned by adjusting/varying the conjugation length of the polymer.

Example Synthesis of Electrochromic Polymers

The MCL monomers of carbazole, biphenyl and binaphthalene are synthesized with different enlarged conjugation. Different sidechains are added on the MCL to adjust the solubility and polarity of the polymers. Then the oligomer 3,4-dimethylthiophene T1, T2 and T3 are made. After getting the monomers, Direct Arylation Polymerization (DArP) is applied to make the nine meta-conjugated transparent electrochromic polymers. Each meta-conjugated polymer solution is spin coated onto an ITO glass as working electrode and placed in a cuvette for the electrochemical and optical measurements. The location of the oxidized state absorption peaks indicates the red-shifting trend upon incorporation of longer aromatic moieties. The disclosed techniques allow rationally shifting of the absorption peak, which allows access to a large variety of colors throughout the visible region. In some embodiments, the oxidized polymers with different length of aromatic moieties display distinct colors, specifically orange, purple, and blue, corresponding to T1, T2, and T3 for BP and CBZ polymers, respectively. The CIELAB color coordinates of all polymers in their neutral and oxidized states are obtained. The neutral state polymers possess L*a*b* values close to (100, 0, 0), which is completely transparent. In oxidized state, these polymers cover a wide range in the color space, which provide the potential for color mixing. By varying a conjugation length of the one or more MCLs and the one or more Ars, the disclosed electrochromic polymer can be controlled to design for a wide range of colors. In addition, by blending different disclosed electrochromic polymers with different colors with different ratios, another new batch of colors can be produced, which greatly enriches the color library. Furthermore, unlike the conventional electrochromic polymer blends, due to the close oxidation potentials from the disclosed electrochromic polymers, the disclosed electrochromic polymer blends do not have any intermediate color issue which is on the other hand commonly observed by the conventional electrochromic polymer blends. In some embodiments, due to its high transmittance, the disclosed electrochromic polymers or blends have a high optical contrast and good stability with a big color library without any intermediate color. This disclosed electrochromic polymer/device can be used in a variety of applications including smart windows and glasses, biosensors, electronic papers, displays, Augmented Reality (AR), Virtual Reality (VR), Mixed Reality (MR), patterned electrochromic displays, curtain wall and sunroof.

The electrochemical properties of the polymers are evaluated by cyclic voltammetry and differential pulse voltammetry (DPV). The polymers exhibit quasi-reversible oxidations. Upon examination of the polymers via DPV, CBZ-T1, CBZ-T2 and CBZ-T3 exhibit one peak indicating the formation of radical cation. However, polymers containing BP and BNP unit show two peaks as the second peak corresponding to the formation of dication. This oxidation renders the electrochemistry irreversible and causes the formation of a new absorption peak in the visible range. It is worth noting that all polymers exhibit relatively low oxidation onset potential (CBZ polymers about 0.6-0.8 V vs Ag/AgCl; BP polymers about 0.8-1.0 V vs Ag/AgCl; BNP polymers about 0.8-1.0 V vs Ag/AgCl), which is attributed to the conjugation from aromatic moieties. The low oxidation onset potential is beneficial for the electrochemical stability of polymers since undesirable side reactions could be avoided such as water oxidation. Overall, CBZ polymers possess a lower oxidation onset potential and a better reversibility at higher potential, although these meta-conjugated polymers are quite similar in their characteristics.

The lower energy absorption peak is a result of the electronic transition from the singularly occupied molecular orbital with an electronic spin down (Sβ) to the lowest unoccupied molecular orbital (Lβ). Therefore, the disclosed meta-conjugated polymer is capable for the modulation of both visible light and near IR synchronously.

The disclosed techniques allow the color tunability of meta-conjugated electrochromic polymers and their low oxidation potentials. The techniques can also be used to provide black color electrochromism by blending vibrantly colored chromophores whose collective absorption entirely covers the visible spectrum. The inventors discover that blending of the disclosed polymers can produce desired colors. In some embodiments, CBZ-T1 (orange) and CBZ-T3 (blue) meta-conjugated polymers are used for blending to obtain transparent-to-black electrochromics. When making blends, the absorption coefficients of the polymers in their oxidized states are employed to determine the proper ratios of the polymers to blend to obtain the black color. Beer-Lamber plots of the polymer films show the nearly identical absorption coefficient of CBZ-T1 and CBZ-T3 in oxidized states, thus the mass ratio of the CBZ-Blend is determined as 1:1. Other mass ratios of blending or blending of different disclosed polymers can be used to make other desirable colors.

Figure 9A:
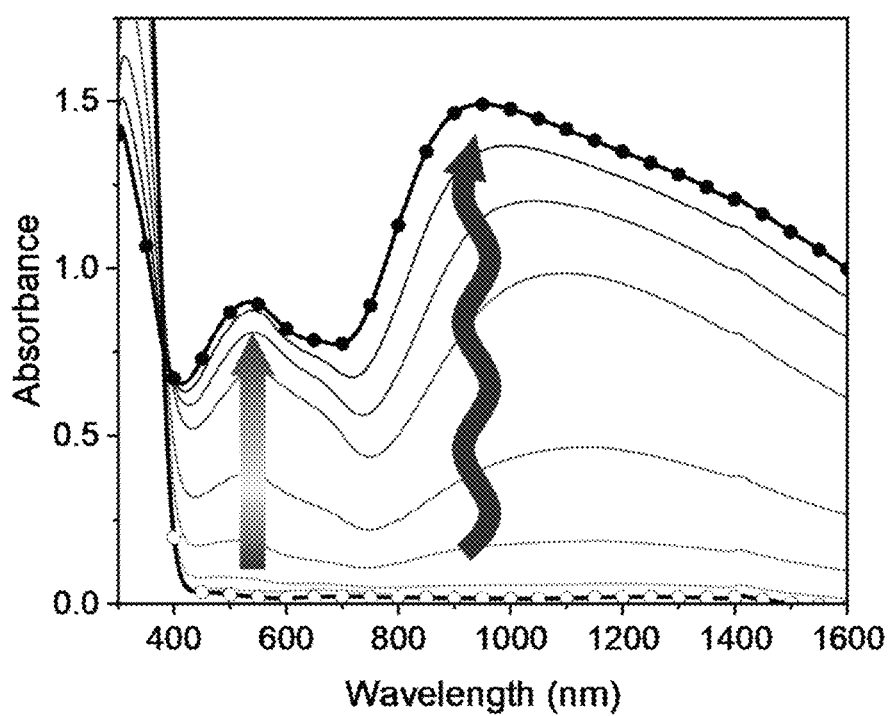
FIG. 9(A) illustrates absorption spectro-electrochemistry from neutral state transitioning to oxidized state of the CBZ-Blend with a film thickness of 300 nm, according to some embodiments. From the bottom line to the top line, the potential is respectively 0.6 v, 0.65 v, 0.7 v, 0.75 v, 0.8 v, 0.85 v, 0.9 v, 0.95 v, 1.0 v versus Ag/AgCl.
Figure 9B:
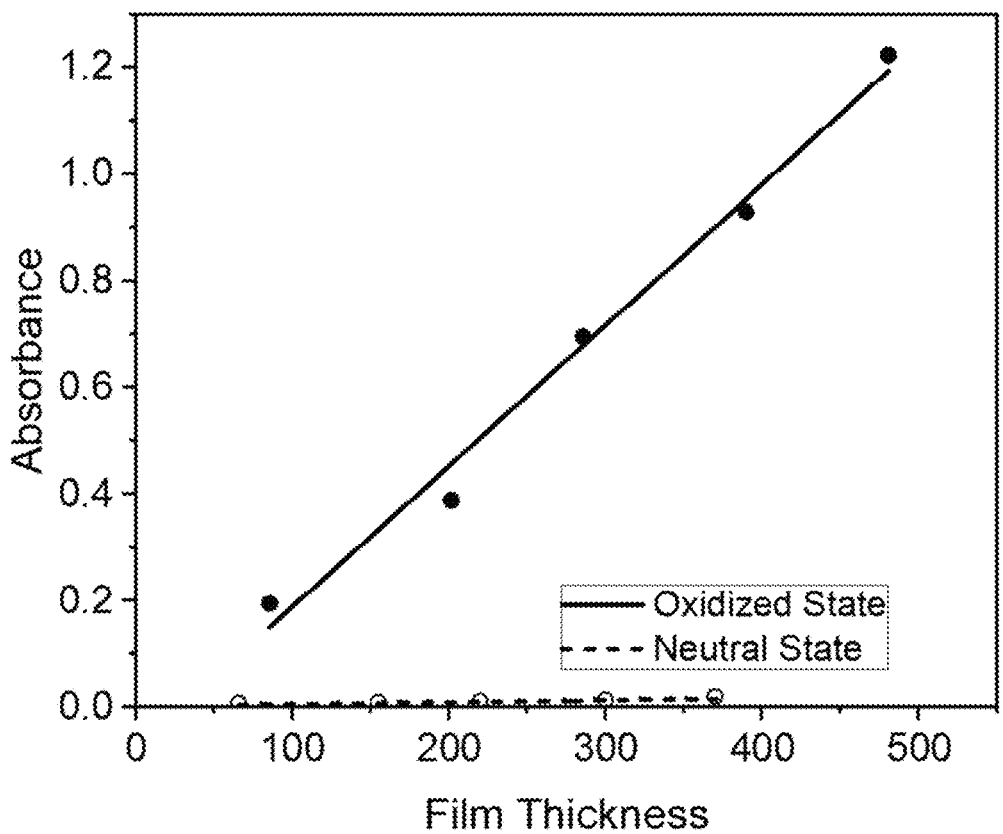
FIG. 9(B) illustrates Beer-Lambert plots of CBZ-Blend in the neutral state (dashed line) and oxidized state (solid) at 550 nm.
Figure 9C:
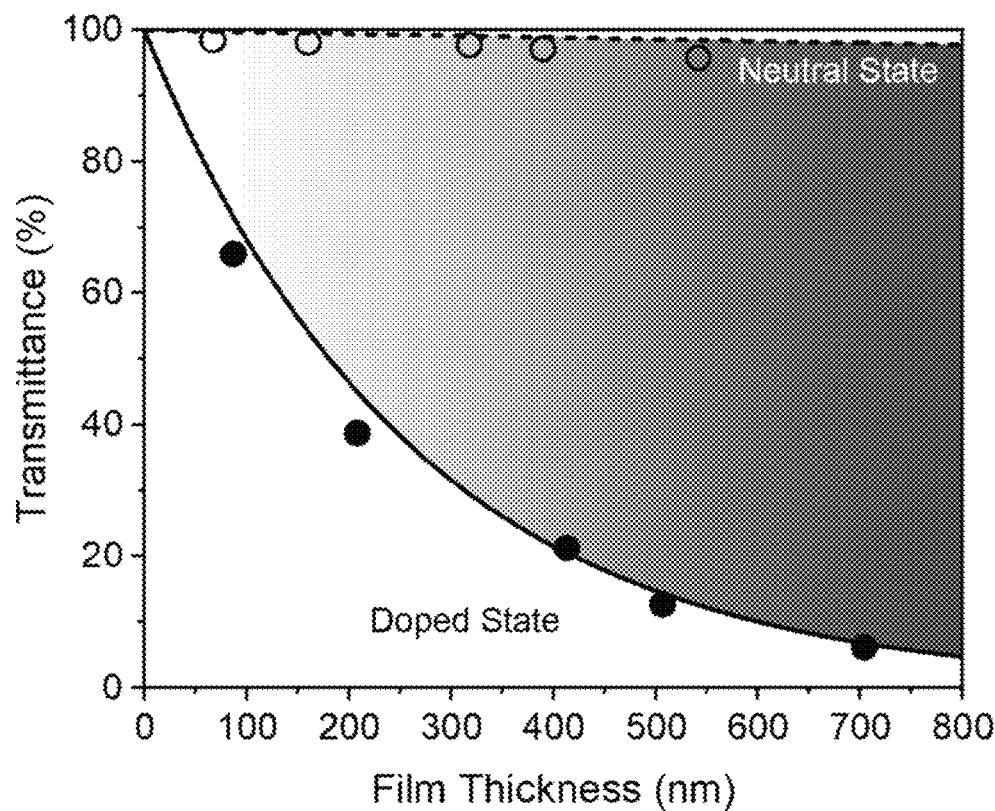
FIG. 9(C) illustrates the transmittance of CBZ-Blend at 550 nm in neutral and oxidized states as a function of film thickness, according to some embodiments. Experimental results are in dots and calculated results are in solid and dashed lines.
Figure 9D:
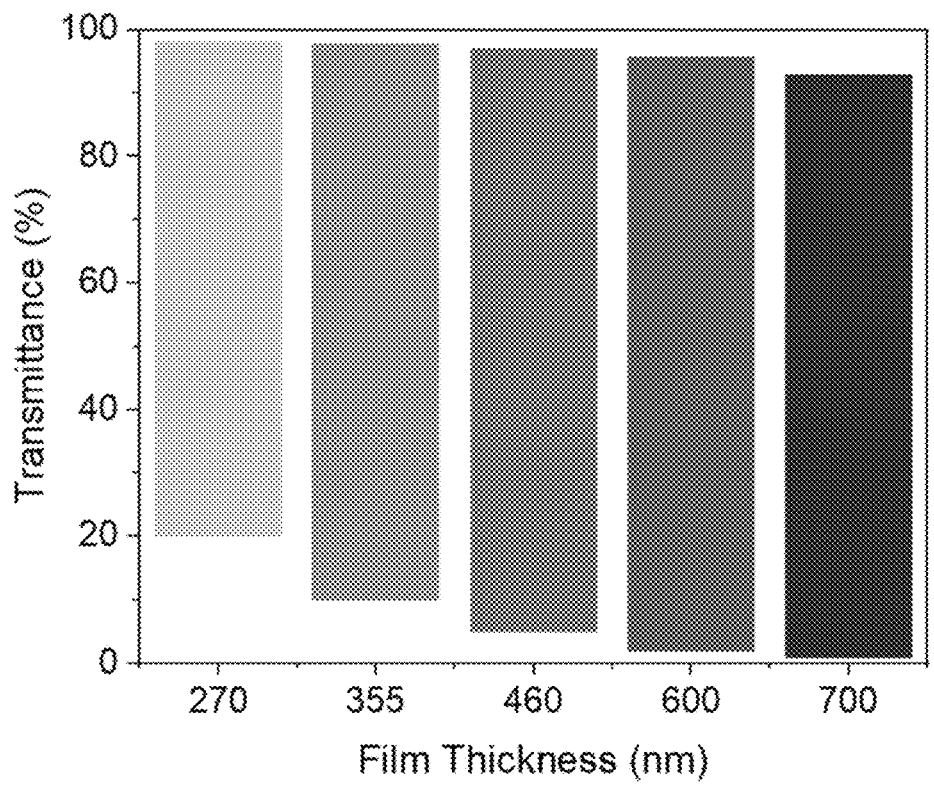
FIG. 9(D) illustrates the transmittance of CBZ-Blend in both neutral and oxidized states of the EC layer at different thicknesses, according to some embodiments.

The absorption spectro-electrochemistry of the CBZ-Blend with a film thickness of 300 nm is shown in FIG. 9(A). The neutral film possesses an absorption onset at 400 nm indicating almost 100% transparency in visible region. Oxidation of CBZ-Blend to the radical cation state gives rise to two broad absorptions in visible and near-IR region, with λmax at 550 and 950 nm, demonstrating the synchronized modulation of light and heat. A number of CBZ-Blend films with different film thickness are prepared and the absorption coefficient is derived from the Beer-Lambert plot as shown in FIG. 9(B). The neutral (bleached) state absorption coefficient for CBZ-Blend is approximated to be $5 \times 10^2$ cm$^{-1}$, which is 2 orders of magnitude lower than the oxidized (colored) state value, $3.7 \times 10^4$ cm$^{-1}$. The transmittance of the neutral and oxidized states are plotted as a function of film thickness using the respective absorption coefficient values as shown in FIG. 9(C). When the film is thin, the transmittance of both the neutral state and the oxidized state can be nearly 100%. Since the neutral state absorption coefficient is close to zero, the transmittance remains nearly 100% and undergoes minimal decay as the film becomes thicker. In some embodiments, the optical contrast between the neutral and oxidized states can reach nearly 100%, e.g., 80%, 85%, 90%, 95%, 96%, 97%, 98%, 99%, or more, or between any of the above values. FIG. 9(D) illustrates the transmittance of CBZ-Blend in both neutral and oxidized states of the electrochromic layer at different thicknesses according to some embodiments. The optical contrast is equal to the difference of transmittance in both neutral and oxidized states. For different film thicknesses (270-700 nm) measured in neutral state, the optical contrasts shown in FIG. 9(D) are respectively 78%, 87.7%, 92.1%, 93.3%, and 92%. The contrast ratio is calculated by the ratio of transmittance at the neutral state versus the transmittance at the oxidized state. For different film thicknesses (270-700 nm) measured in neutral state, the contrast ratios shown in FIG. 9(D) are respectively 4.9%, 9.8%, 19.4%, 47.65%, and 93%. As shown in FIG. 9(D), the optical contrast of the disclosed electrochromic film increases with the film thickness. When the disclosed EC film thickness increases, the response time would be increased. When the film thickness is greater than 1500 nm, the disclosed EC device can have a great optical contrast, e.g., about 96% with transmittance of 96% in the neutral state and about 0.06% in the oxidized state of the EC layer, the device can have slow response time, e.g., about 1 minute. When the film thickness increases, the transmittance of the EC layer in the neutral state can decrease to some minor degree. However, the transmittance of the EC layer in the oxidized state can greatly decrease, thus with the film thickness increases, the optical contrast (transmittance difference between the neutral state and the oxidized state) of the EC layer greatly increases. However, limited by the increased response time with the thickness increasement, in some embodiments, the film thickness of the disclosed EC layer is limited to 1500 nm or less. In some embodiments, the film thickness of the disclosed EC layer is limited to 1200 nm, 1000 nm, 900 nm, 800 nm, 700 nm, 600 nm, 500 nm, 400 nm, 300 nm, 200 nm, or 100 nm, to obtain the response time of less than 1 second.

The disclosed meta-conjugated electrochromic polymer layers exhibit ultrahigh optical contrast and fast switching speed. They also exhibit high stability, including photostability and electrochromic switching stability. The photostability is examined by exposing the encapsulated polymer films to a solar simulator matching a standard air mass 1.5 illuminant. Their absorption spectra are measured and the maximum absorption as a function of irradiation time is plotted. The results indicate the disclosed polymers stable even when used with other materials, such as ITO, electrolyte, and ion storage layer (e.g., nano ITO particles). To reveal the cycling stability of the polymer thin film, 10,000 CV switching cycles are applied in a 3-electrode set up, where the voltage is applied from –0.2 V to 1.0 V at 80 mV/s. The transmittance of neutral and colored state is recorded every 1000 cycles. The optical contrast of the polymer decreased by 10%, suggesting that the meta-conjugated polymers are suitable for long-term performance.

Figure 10:
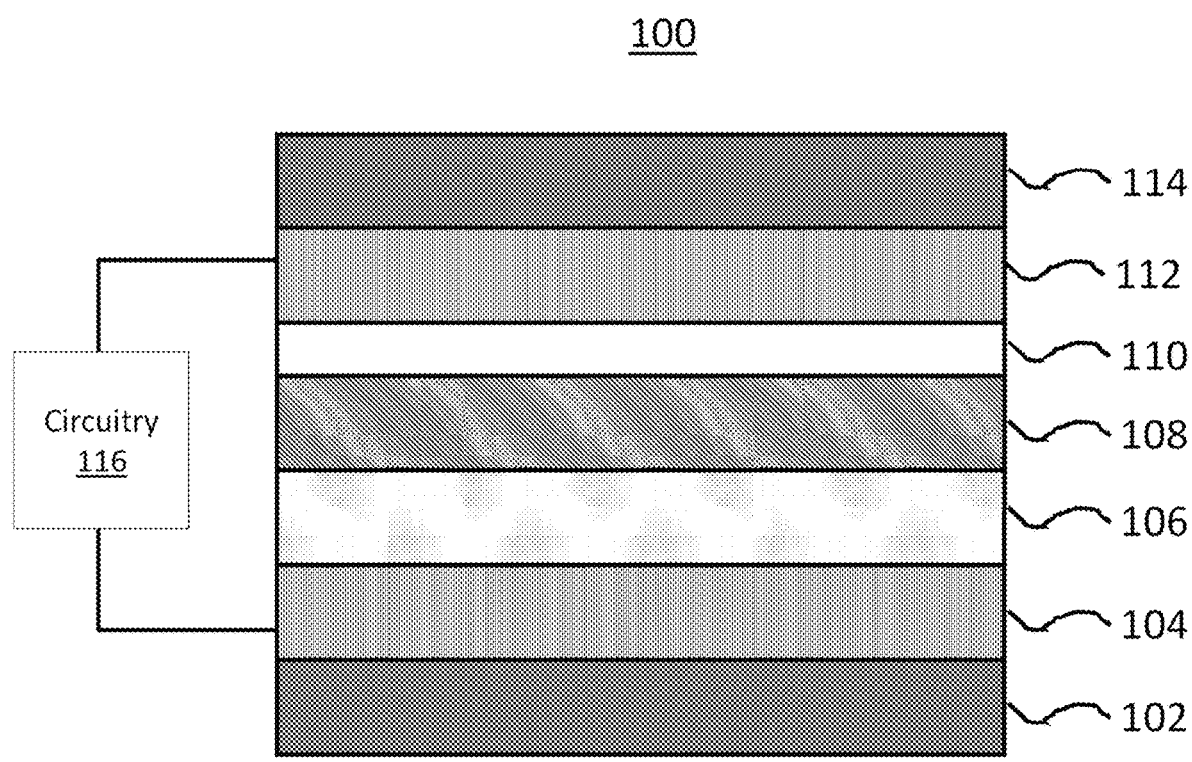
FIG. 10 depicts a cross-section view of an electrochromic device, according to one example embodiment of the present disclosure.

As shown in FIG. 10, an electrochromic device 100 according to some example embodiments may have a first insulating substrate 102, a first conducting layer 104 disposed over the first insulating substrate 102, an electrochromic layer 106 disposed over the first conducting layer 104, an electrolyte layer 108 disposed over the electrochromic layer 106, a second conducting layer 112 disposed over the electrolyte layer 108, a second insulating substrate 114 disposed over the second conducting layer 112, and circuitry 116 to operate the electrochromic device 100. In some embodiments, the electrochromic device 100 may further includes an ion storage layer 110 disposed between the second conducting layer 112 and the electrolyte layer 108. The electrochromic layer 106 may include an electrochromic polymer as disclosed above. For example, the electrochromic polymer includes or consists of a polymer backbone including one or more meta-conjugated linkers (MCLs) and one or more aromatic moieties (Ars), wherein each of the one or more MCLs is partially conjugated with one of the one or more Ars at a meta position of the one or more MCLs. In some embodiments, a thickness of the electrochromic layer 106 is from 10 nm to 1500 nm resulting in transmittance of 85%-99.9% at a wavelength of 550 nm at a neutral state of the electrochromic layer. For example, a thickness of the electrochromic layer 106 from 10 nm to 1500 nm yields a transmittance of 85%, 87%, 90%, 92%, 95%, 96%, 97%, 98%, 99%, 99.9% or between any two of the above numbers. The electrochromic device 100 has transmittance of 60% or more at a wavelength of 550 nm at a bleached state of the device. For example, by tuning the material and thickness of the electrochromic layer 106, the electrochromic device 100 may have at its bleached state transmittance of 60%, 65%, 70%, 75%, 80%, 85%, 90%, 92%, 95%, 96%, 97%, 98%, or 99%, or between any two of the above numbers.

In some embodiments, the electrochromic layer has transmittance of 40%-0.1% at a wavelength of 550 nm at an oxidized state of the electrochromic layer. For example, the electrochromic layer at the oxidized state has transmittance at a wavelength of 550 nm of 40%, 35%, 30%, 25%, 20%, 15%, 10%, 9%, 8%, 7%, 6%, 5%, 4%, 3%, 2%, 1%, 0.9%, 0.8%, 0.7%, 0.6%, 0.5%, 0.4%, 0.3%, 0.2%, or 0.1%, or between any two of the above numbers.

In some embodiments, the electrochromic layer 106 has an optical contrast of 60% or more. For example, the electrochromic layer 106 may have an optical contrast of 60%, 65%, 70%, 75%, 80%, 85%, 90%, 95%, 96%, 97%, 98%, 99%, or between any two of the above numbers.

In some embodiments, when the electrochromic device 100 includes the ion storage layer 110, the ion storage layer 110 has transmittance of 80% or more at a wavelength of 550 nm. In some embodiments, the ion storage layer 110 may include (1) one or more oxides of metal elements in Group 4-12, or (2) a mixture of the oxides, or (3) one of the oxides doped by a different metal oxide, or (4) a transition-metal complex, or (5) one or more of redox-active polymers including redox active nitroxyl, galvinoxyl radical polymers and conjugated polymers.

In some embodiments, the ion storage layer 110 includes ITO particles, wherein the ion storage layer has transmittance of 90% or more at a wavelength of 550 nm. In some embodiments, the ITO particles may be nanoparticles having a size of 1-900 nm.

In some embodiments, at least one of the first conducting layer 104 and the second conducting layer 112 includes ITO, aluminum zinc oxide (AZO), fluorine doped tin oxide (FTO), silver nanowires, graphene, carbon nanotube, metal mesh based transparent conductive electrodes, silver-nanoparticle ink, or an organic conductive polymer.

In some embodiments, the electrochromic device 100 has an optical contrast of 60% or more. For example, the electrochromic device 100 may have an optical contrast of 60%, 65%, 70%, 75%, 80%, 85%, 90%, 95%, 96%, 97%, 98%, 99%, or between any two of the above numbers.

In some embodiments, a color of the electrochromic layer 106 at an oxidized state is varied by varying a conjugation length of the one or more MCLs and the one or more Ars.

In some embodiments, the electrochromic layer 106 includes a blend of different electrochromic polymers without an intermediate color. The structures of the polymer(s) in the electrochromic layer 106 are explained above and will not be repeated for brevity.

Figure 9E:
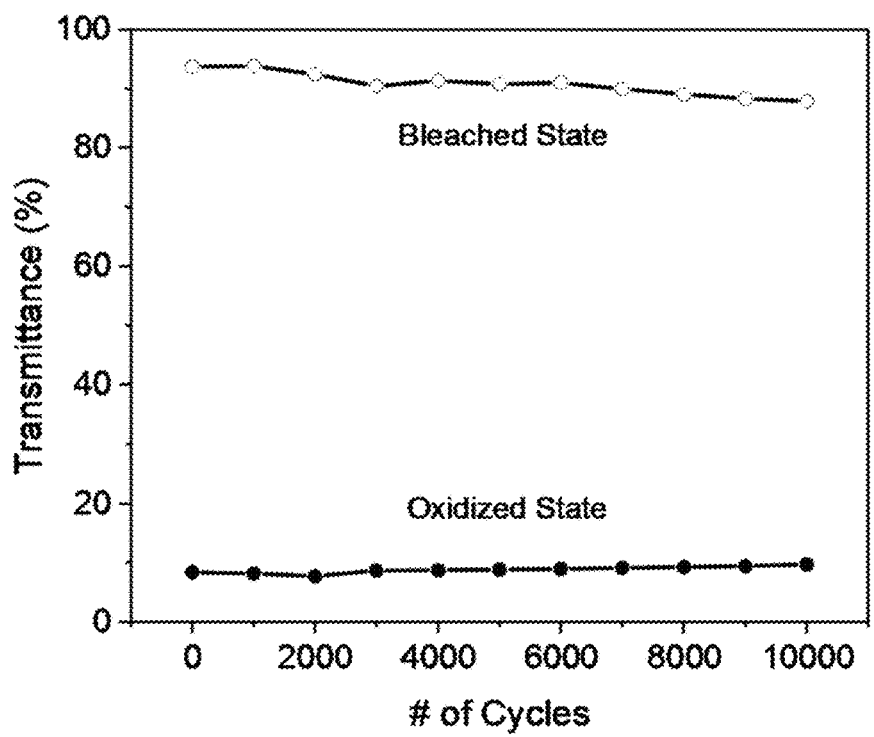
FIG. 9(E) illustrates the transmittance of CBZ-Blend in both neutral (bleached) and oxidized states of the EC layer under 10000 cycles, according to some embodiments.

This disclosure further provides an electrochromic device that can be switch between transparent and black. The electrochromic materials that can switch reversibly between black and transmissive states holds great significance for various commercial and military applications. For example, the inventors discover that CBZ-T1 and CBZ-T3 possess similar absorption coefficient, therefore mix CBZ-T1 (transparent-to-orange switching) and CBZ-T3 (transparent-to-blue switching) at mass ratio of 1:1 to obtain transparent-to-black electrochromic device. The configuration of the transparent-to-black electrochromic device is similar to the electrochromic device 100 explained above. The device is assembled in a two-electrode configuration by using CBZ-T1 and CBZ-T3 mixture as electrochromic layer and nano ITO particle as ion storage layer (at 1.5 μm). In the spectroelectrochemistry study, the potential of the device is increased from −0.6 to 2.4 V. As the potential is increased, transmittance in the visible region decrease due to the oxidation of CBZ-T1 and CBZ-T3 mixture, and the device switches from transparent state to black state. The potential is increased until no further changes in transmittance are observed and the optical contrast is 88% (1-89%). The transmittance spectra are referenced to air, which means the transmittance loss includes glass, ITO, electrolyte layer, and ion storage layer. The CIE L*a*b* color coordinates at different voltage are investigated. As the potential increases, the lightness (L*) in CIE L*a*b* color coordinates decrease from 95 to 36, with a* and b* maintaining close to 0, indicating the transparent-to-black color switching without intermediate color. To reveal the cycling stability of the device, 10000 CV switching cycles are applied and the transmittance spectra are measured. The transmittance at 550 nm of the transparent state and colored state of the device indicates that the optical contrast dropped slightly from its original value of 85% to 78% (shown in FIG. 9(E)), representing the best cycling stability of black electrochromic device with such high optical contrast.

In summary, meta-conjugated polymers that enable transparent-to-colored electrochromic switching with a wide color range, ultra-high optical contrast, low oxidation potential, and excellent switching stability have been provided in this disclosure. A transparent-to-black electrochromic device based on polymer blending has been successfully obtained with the optical contrast above 91% and contrast ratio of 91%, representing the best performing black electrochromics. This approach to access transparent electrochromic polymers opens up promising prospects in future electrochromic innovations.

The disclosed electrochromic device can be utilized in various applications, such as smart windows and glasses, biosensors, electronic papers, displays, Augmented Reality (AR), Virtual Reality (VR), Mixed Reality (MR), patterned electrochromic displays, curtain wall and sunroof. Note that for conventional EC devices, the bleached state of the device is corresponding to the oxidized state of EC layer. However, for the disclosed EC device, the bleached state of the device is corresponding to the neutral state of EC layer.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the disclosure be defined by the following claims and their equivalence.

What is claimed is:
1. An electrochromic device, comprising:
a first insulating substrate;
a first conducting layer disposed over the first insulating substrate;
an electrochromic layer disposed over the first conducting layer, wherein the electrochromic layer comprises an electrochromic polymer having a polymer backbone comprising one or more meta-conjugated linkers (MCLs) and one or more aromatic moieties (Ars), wherein each of the one or more MCLs is partially conjugated with one of the one or more Ars at a meta position of the one or more MCLs; wherein the electrochromic polymer is colorless in a neutral state of the electrochromic layer;

an electrolyte layer disposed over the electrochromic layer;

a second conducting layer disposed over the electrolyte layer; and a second insulating substrate disposed over the second conducting layer, wherein a thickness of the electrochromic layer is from 10 nm to 1500 nm resulting in transmittance of 85%-99.9% at a wavelength of 550 nm at the neutral state of the electrochromic layer; and wherein the electrochromic device has transmittance of 60% or more at a wavelength of 550 nm at a bleached state of the device.

2. The electrochromic device of claim 1, wherein the electrochromic layer has transmittance of 40%-0.1% at a wavelength of 550 nm at an oxidized state of the electrochromic layer.

3. The electrochromic device of claim 1, further comprising an ion storage layer, wherein the ion storage layer is disposed between the electrolyte layer and the second conducting layer and has transmittance of 80% or more at a wavelength of 550 nm.

4. The electrochromic device of claim 3, wherein the ion storage layer comprises one or more oxides of metal elements in Group 4-12, or a mixture of the oxides, or one of the oxides doped by a different metal oxide, or a transition-metal complex, or one or more of redox-active polymers including redox active nitroxyl, galvinoxyl radical polymers and conjugated polymers.

5. The electrochromic device of claim 3, wherein the ion storage layer comprises indium tin oxide (ITO) particles, wherein the ion storage layer has transmittance of 90% or more at a wavelength of 550 nm.

6. The electrochromic device of claim 1, wherein at least one of the first conducting layer and the second conducting layer comprises ITO, aluminum zinc oxide (AZO), fluorine doped tin oxide (FTO), silver nanowires, graphene, carbon nanotube, metal mesh based transparent conductive electrodes, or silver-nanoparticle ink or an organic conductive polymer.

7. The electrochromic device of claim 1, wherein the electrochromic layer has an optical contrast of 60% or more.

8. The electrochromic device of claim 1, wherein the electrochromic device has an optical contrast of 60% or more.

9. The electrochromic device of claim 1, wherein a color of the electrochromic layer at an oxidized state is varied by varying a conjugation length of the one or more MCLs and the one or more Ars.

10. The electrochromic device of claim 1, wherein the electrochromic layer comprises a blend of electrochromic polymers without an intermediate color.

11. The electrochromic device of claim 1, wherein each of the one or more MCLs and corresponding meta positions comprise one of the following formulas:

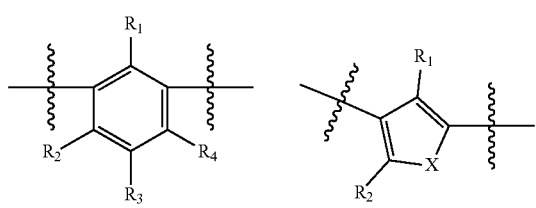

-continued

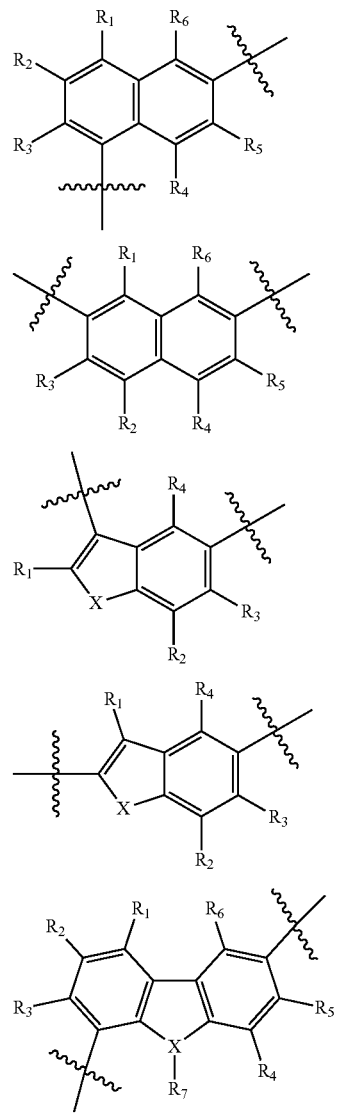

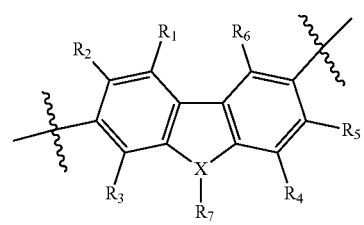

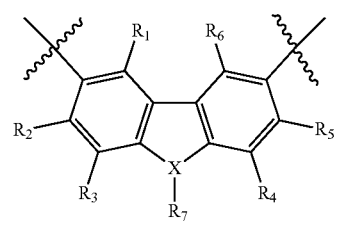

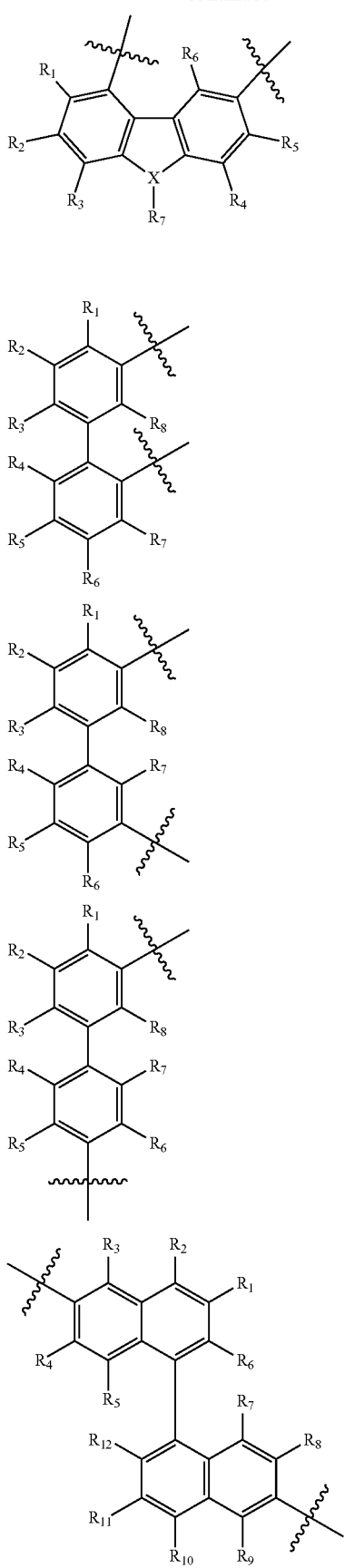
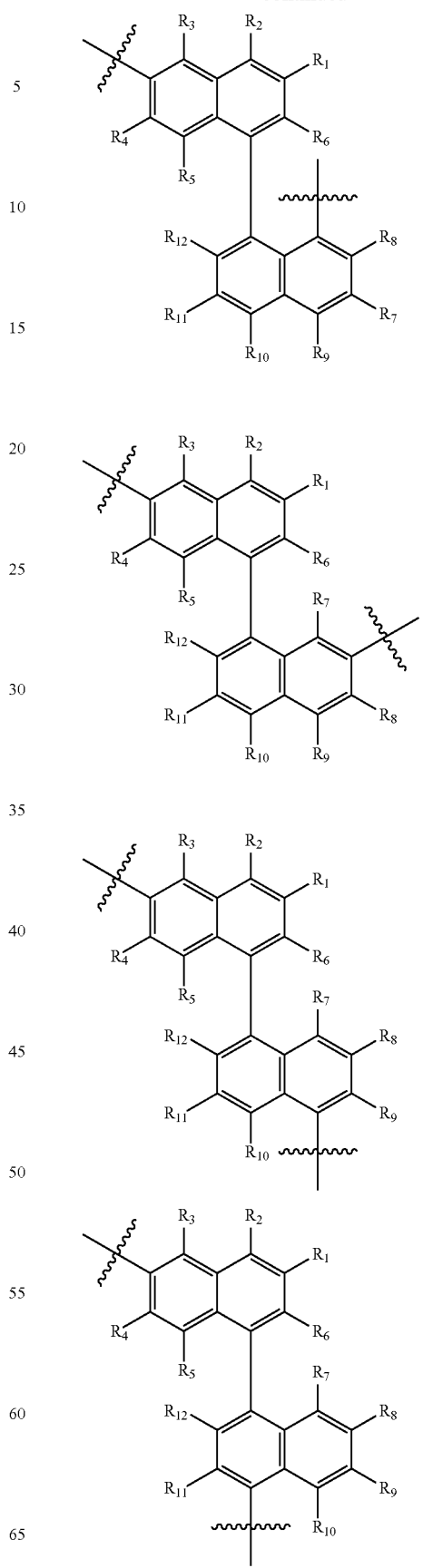

81
-continued
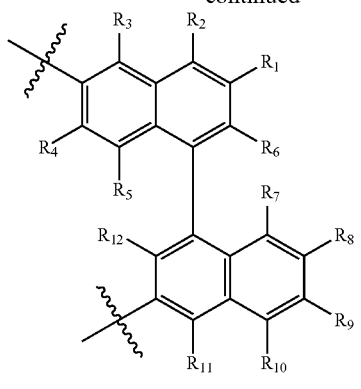
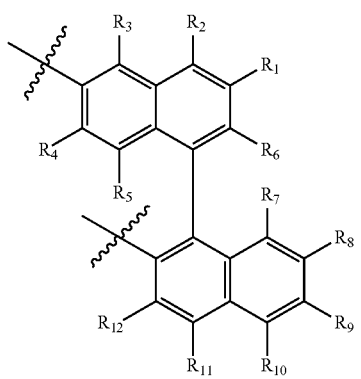
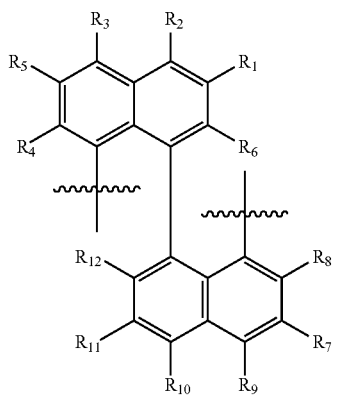
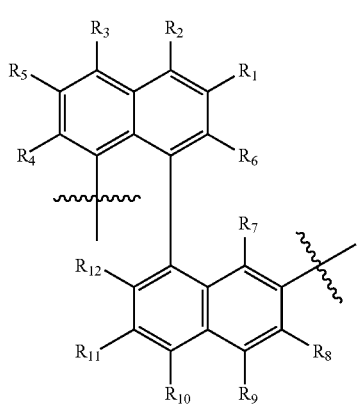
82
-continued
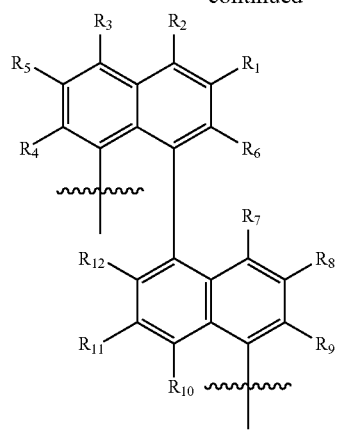
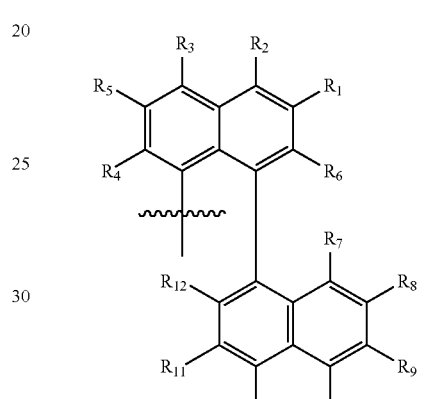
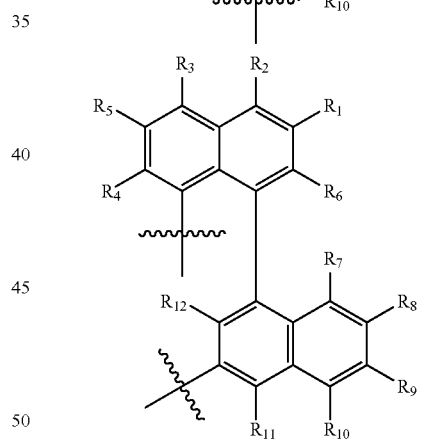
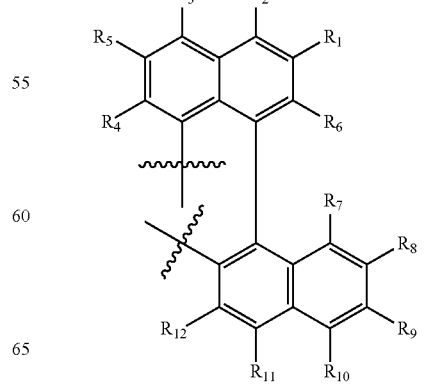

-continued
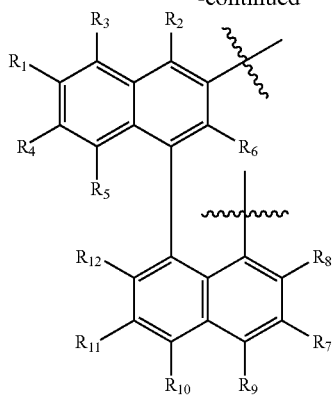
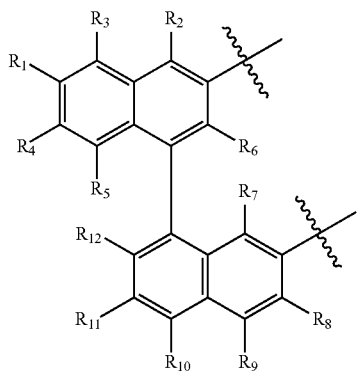
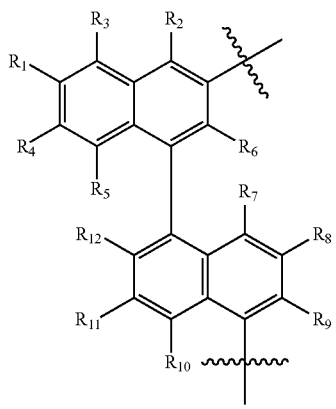
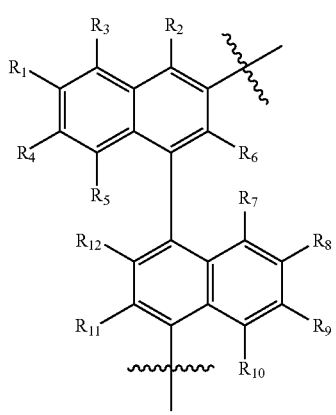
-continued
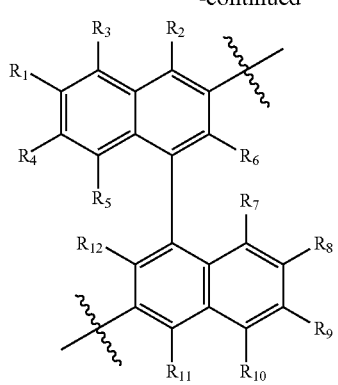
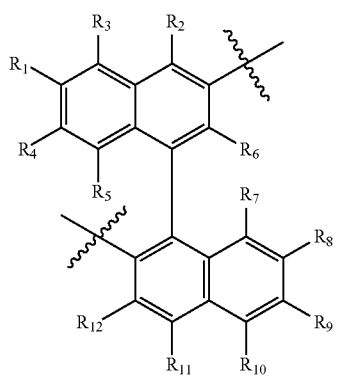
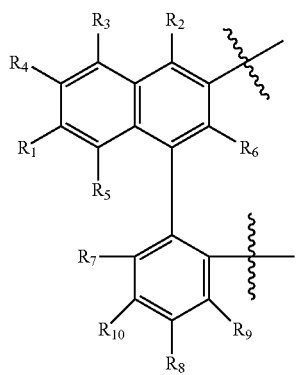
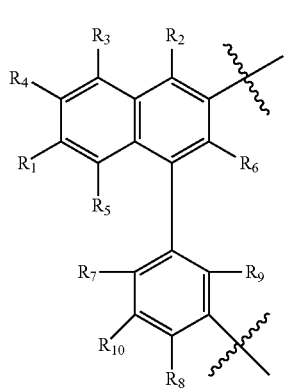

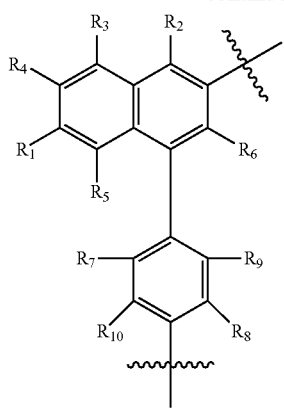
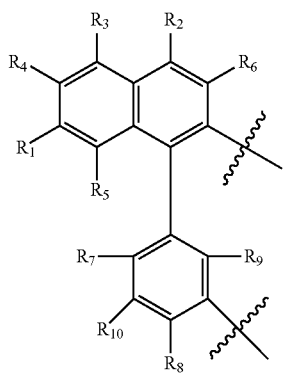
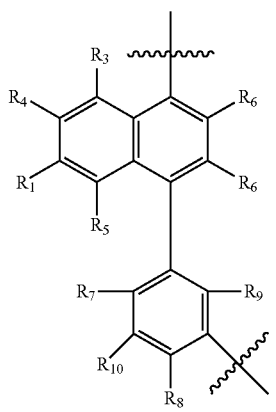
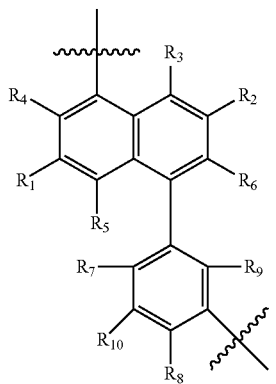
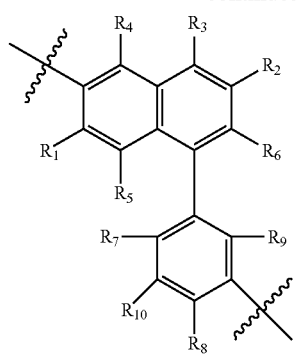
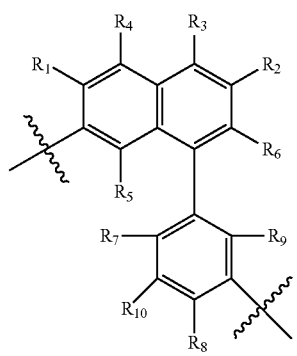
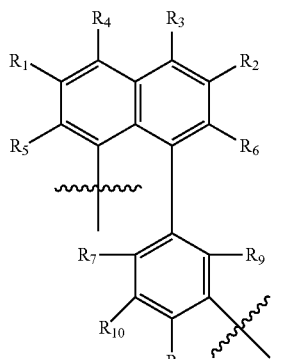
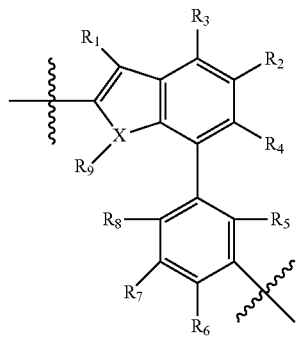

87
-continued
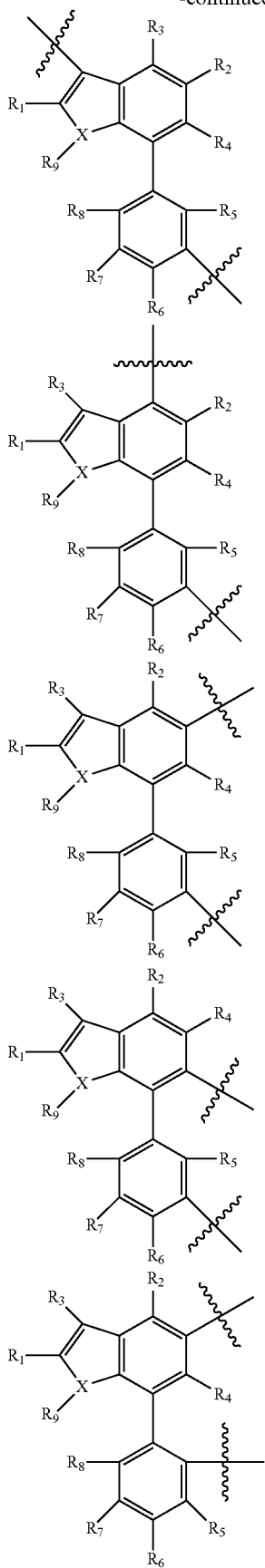
88
-continued
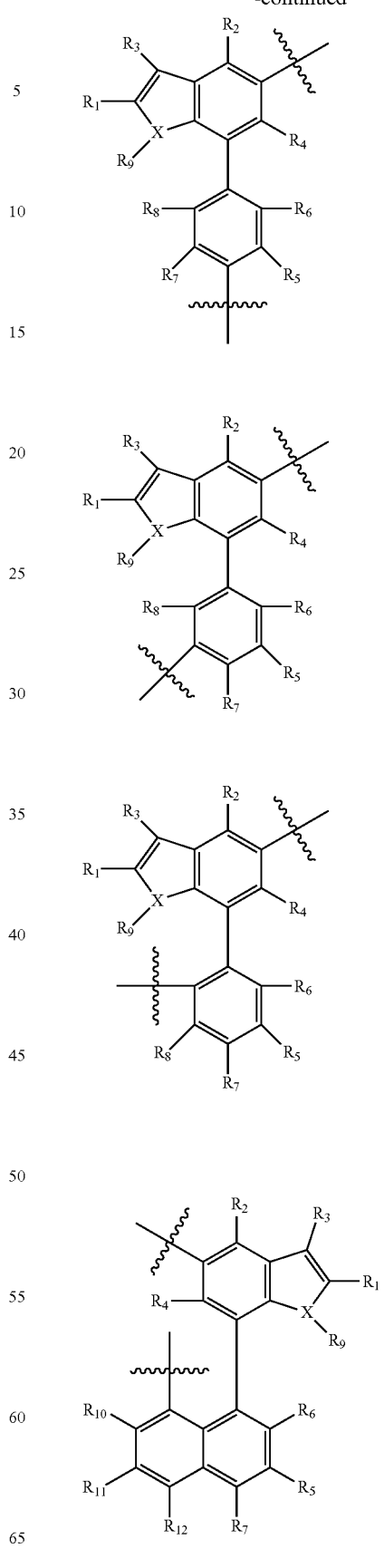

-continued
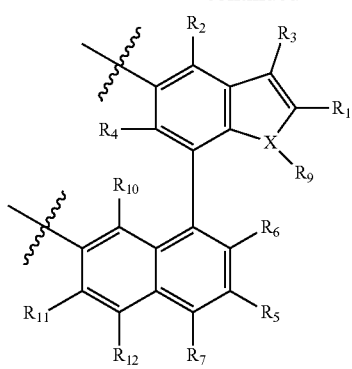
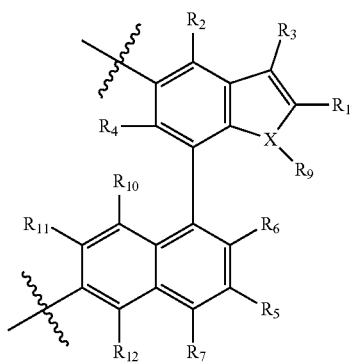
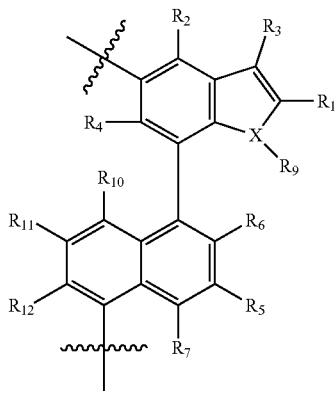
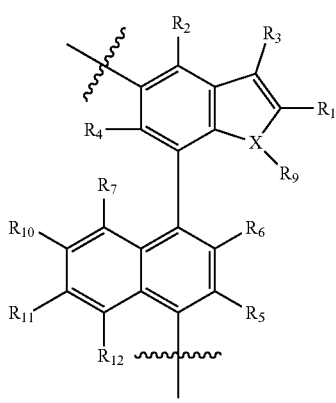
-continued
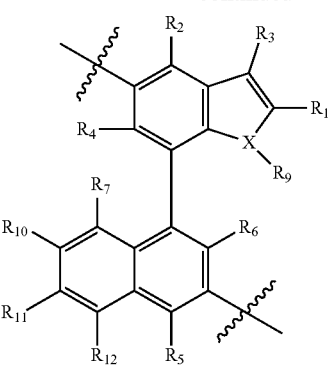
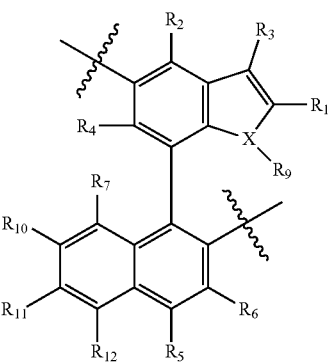
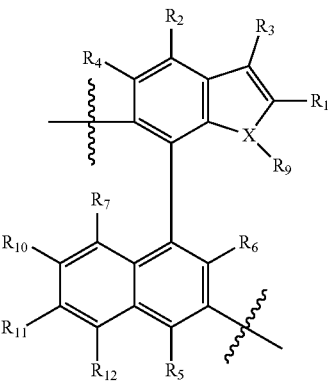
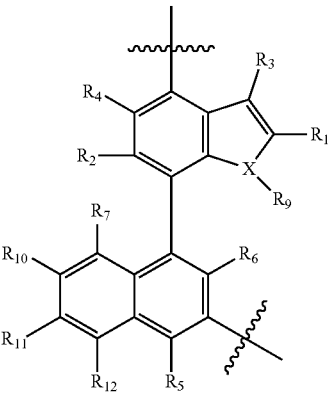

-continued

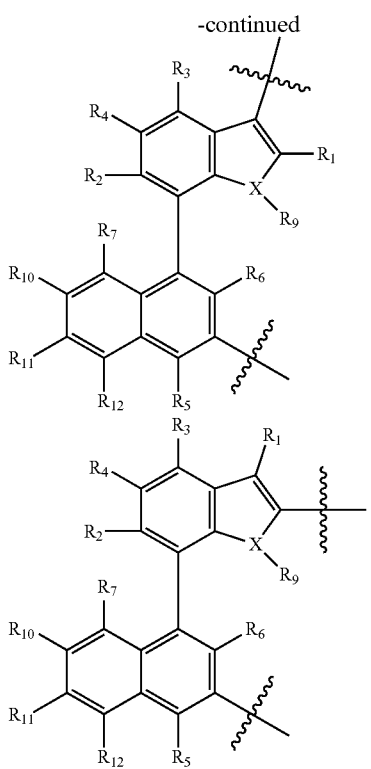

wherein X is S, Se, N, C, or O; each of $R_1$-$R_{12}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; and each of the wavy lines represents one of the meta positions.

12. The electrochromic device of claim 1, wherein each of the one or more Ars comprises one of a thiophene-based unit, a furan-based unit, a selenophene-based unit, or a pyrrole-based unit with one of the following formulas:

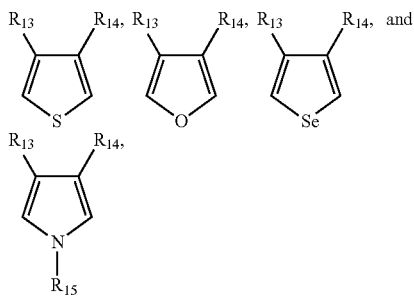

wherein each of $R_{13}$, $R_{14}$ and $R_{15}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

13. The electrochromic device of claim 12, wherein the thiophene-based unit comprises one of the following formulas:

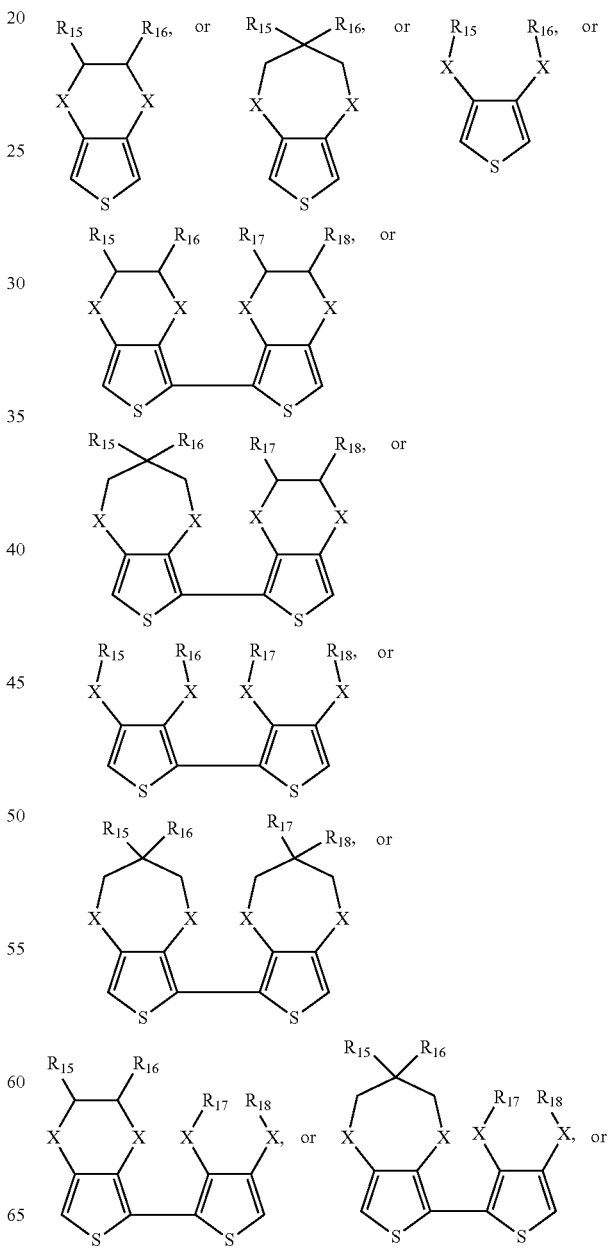

-continued

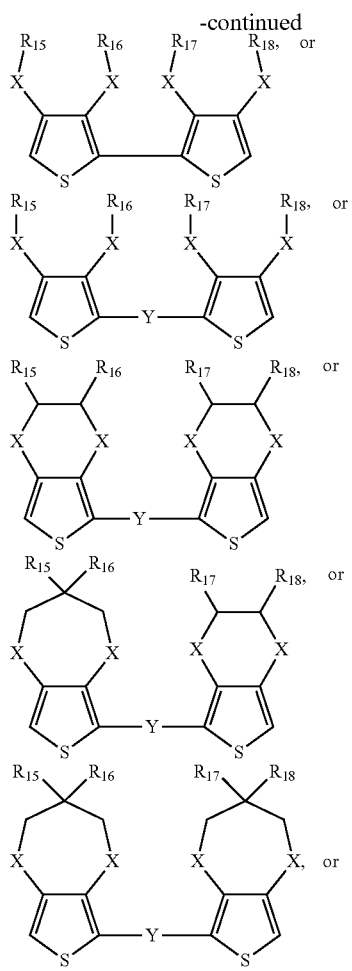

-continued

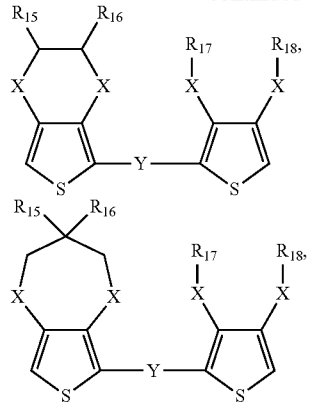

wherein X is S, Se, N, C, or O; each of $R_{15}$-$R_{18}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; Y is any one or more of Ars, or aromatic structures, or fused aromatic structures, or a combinations thereof.

14. The electrochromic device of claim 1, wherein the electrochromic polymer comprises a formula of

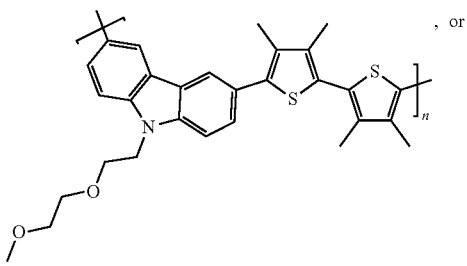, or 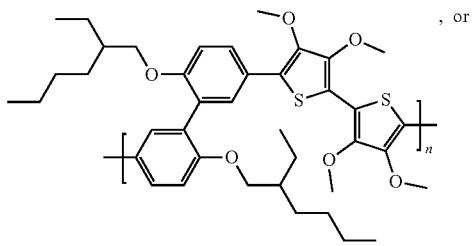, or

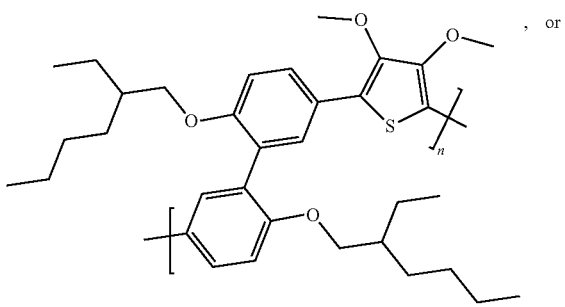, or 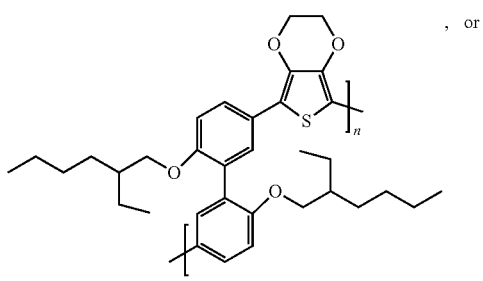, or

-continued
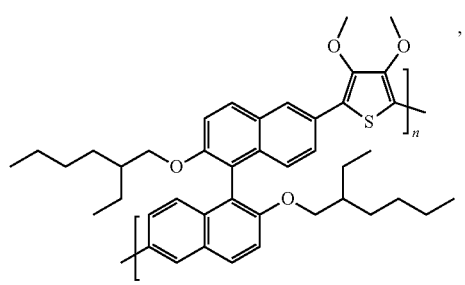, or
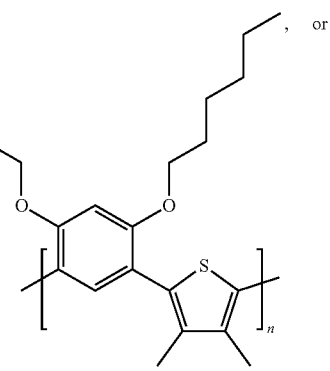, or
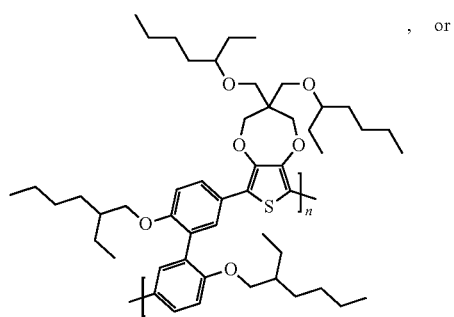, or
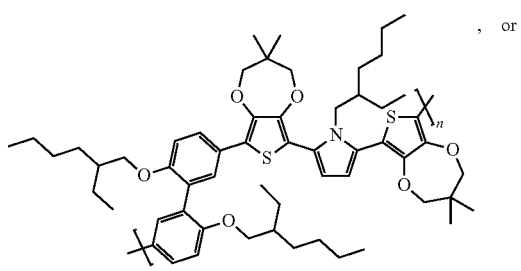, or
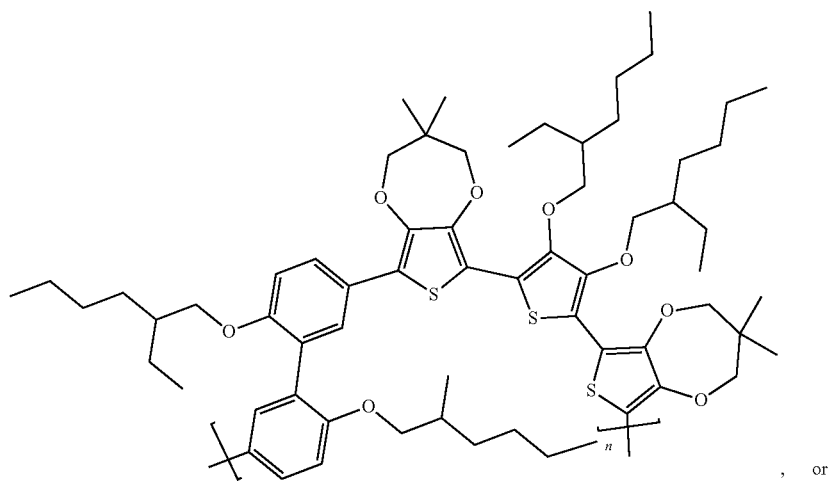, or
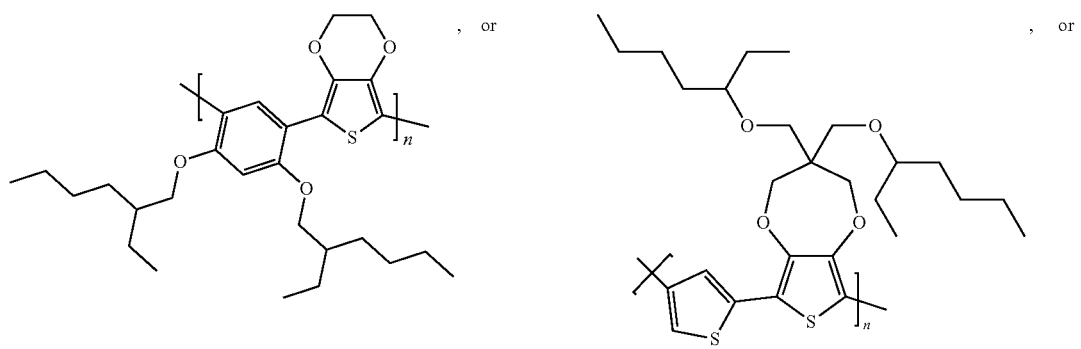, or -continued
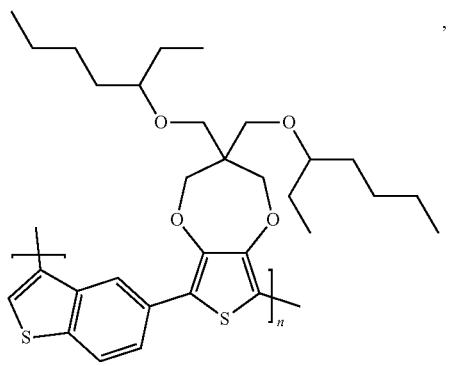, or 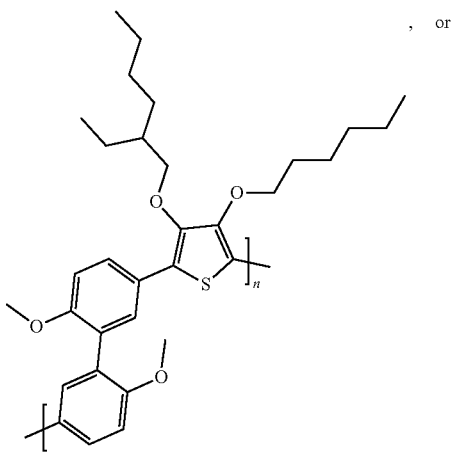, or
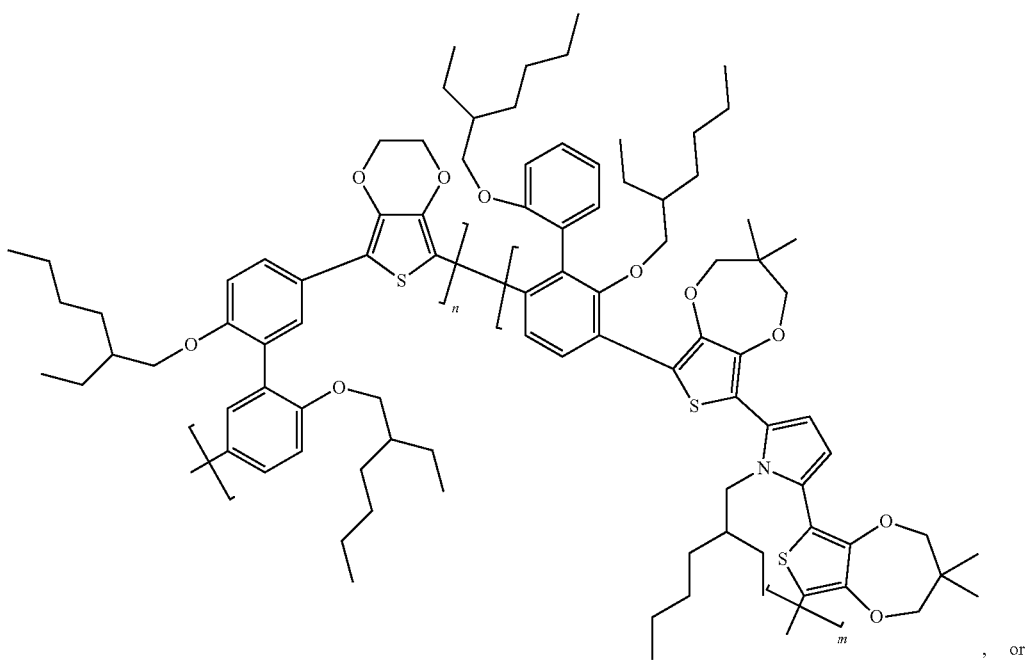, or
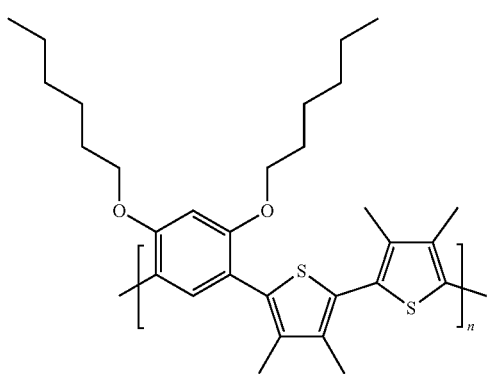, or -continued
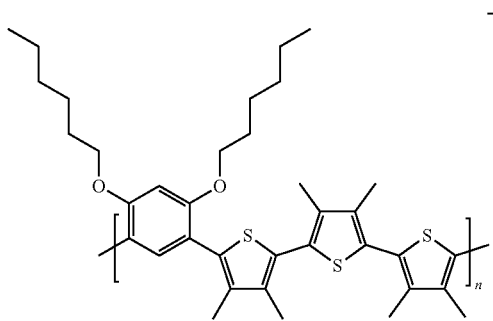, or
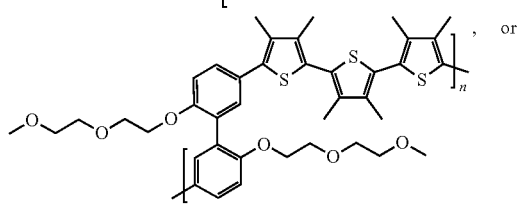, or
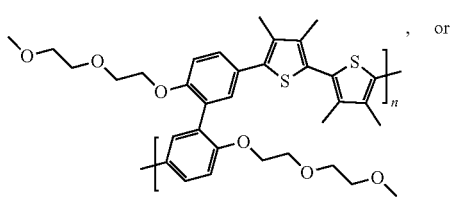, or
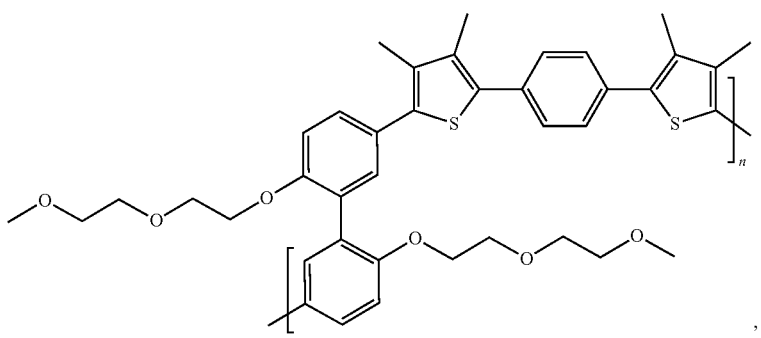, or
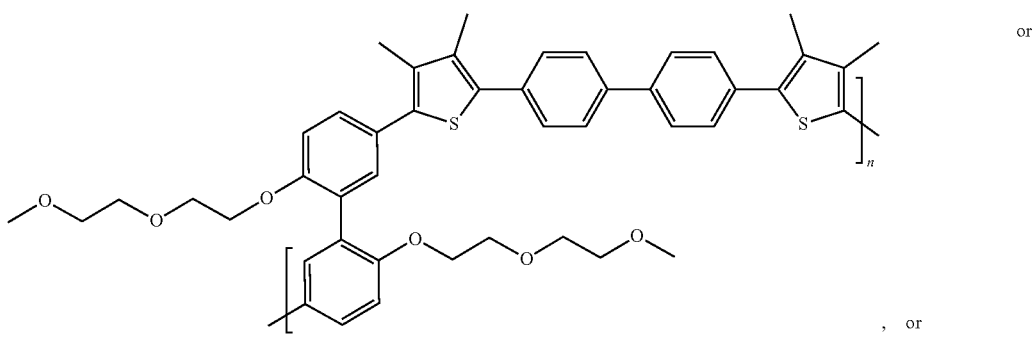, or
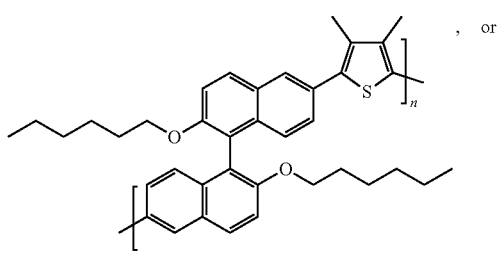, or
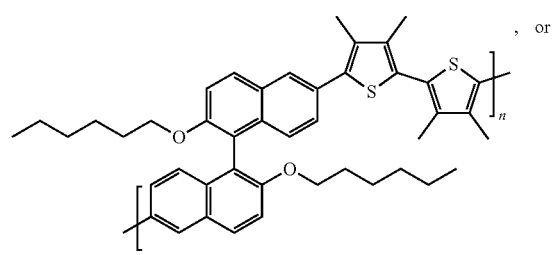, or -continued
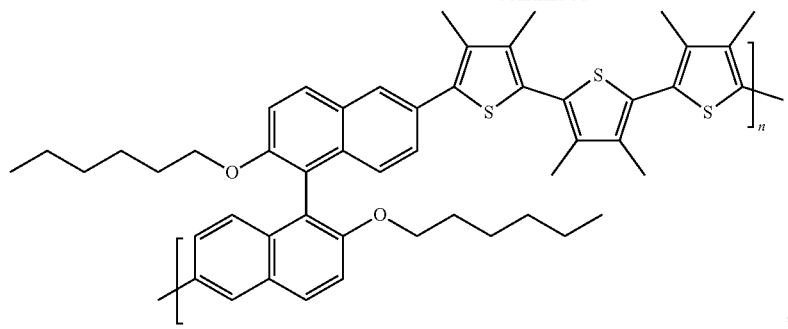
, or
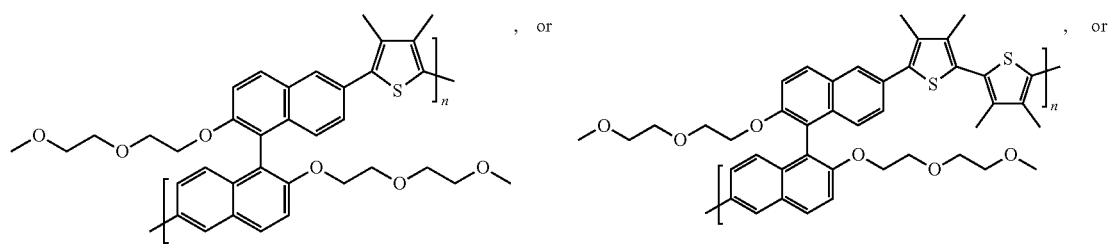
, or
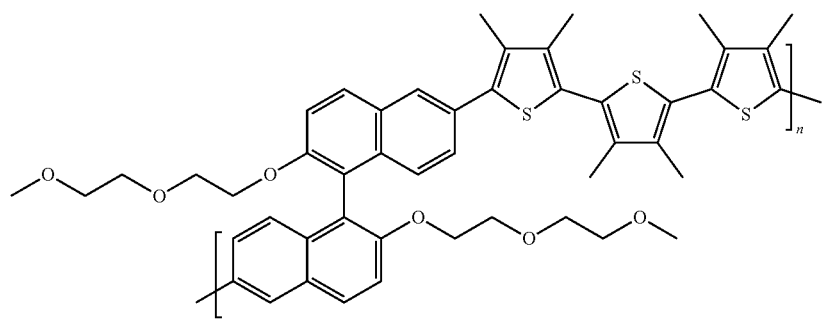
, or
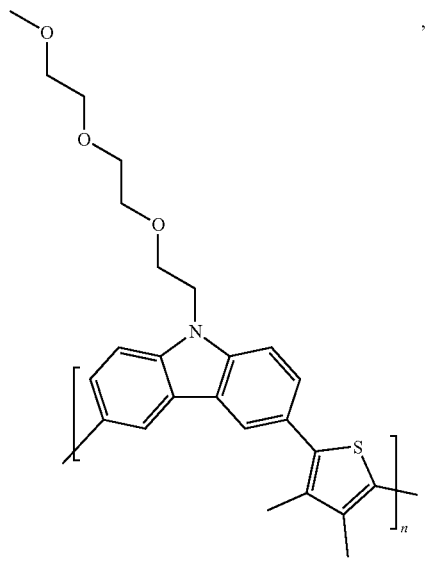
, or
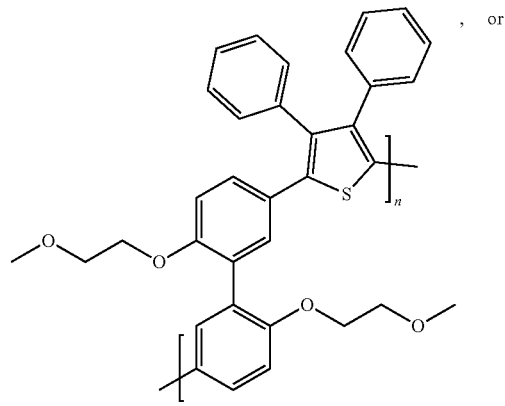

-continued

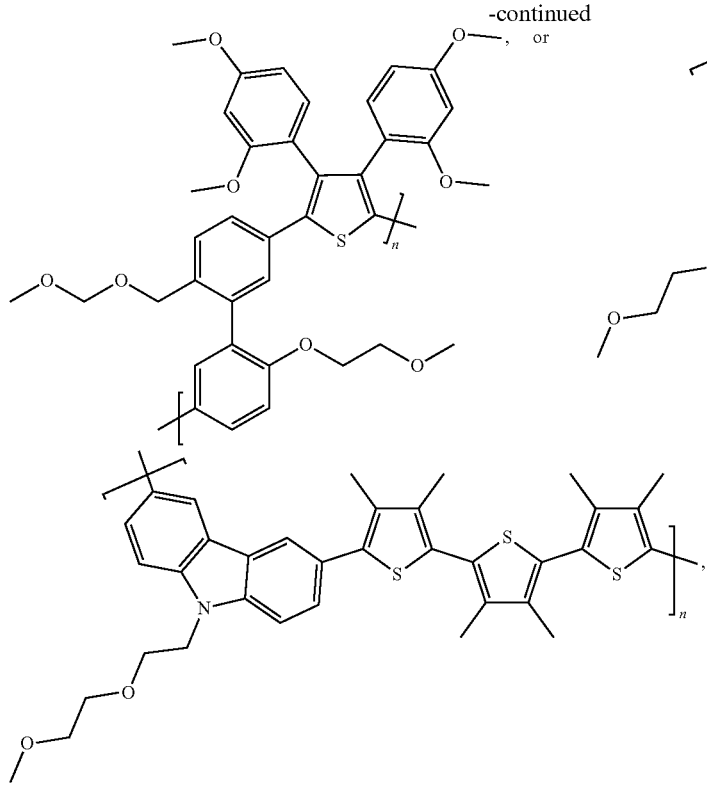

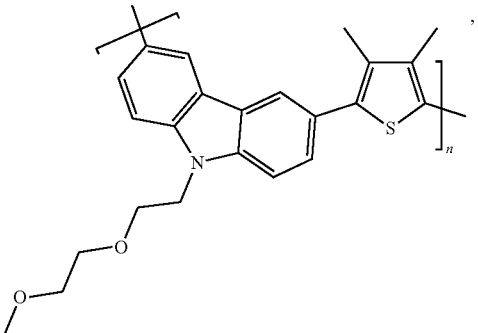

wherein n and m are integers greater than 0.

15. An electrochromic layer comprising an electrochromic polymer, wherein the electrochromic polymer consists of: a polymer backbone comprising one or more meta-conjugated linkers (MCLs) and one or more aromatic moieties (Ars), wherein:
  each of the one or more MCLs is partially conjugated with one of the one or more Ars at a meta position of the one or more MCLs; and
  a thickness of the electrochromic polymer is from 10 nm to 1500 nm resulting in transmittance of 85%-99.9% at a wavelength of 550 nm at a neutral state of the electrochromic layer; and wherein the electrochromic polymer is colorless in the neutral state of the electrochromic layer.

16. The electrochromic layer of claim 15, wherein the electrochromic layer has transmittance of 40%-0.1% at a wavelength of 550 nm at an oxidized state of the electrochromic layer.

17. The electrochromic layer of claim 15, wherein the electrochromic layer has an optical contrast of 60% or more.

18. The electrochromic layer of claim 15, wherein each of the one or more MCLs and corresponding meta positions comprise one of the following formulas:

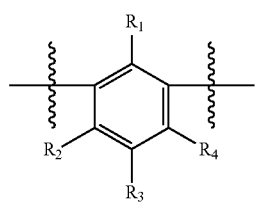

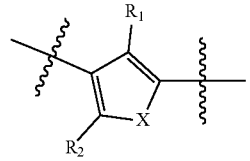

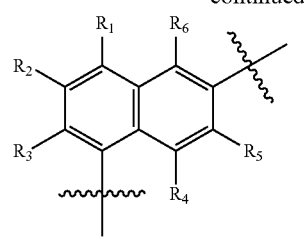

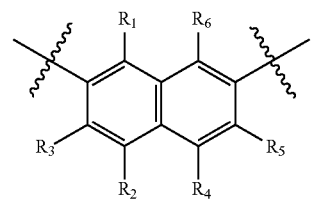

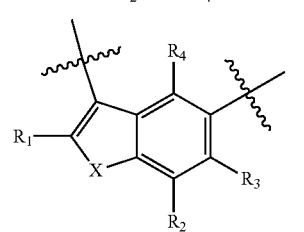

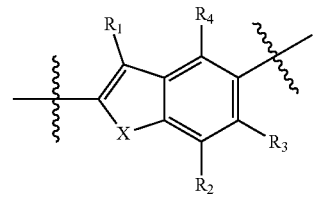

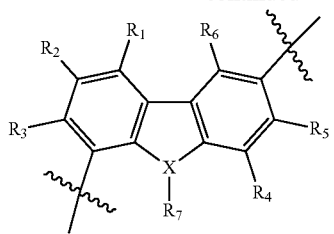
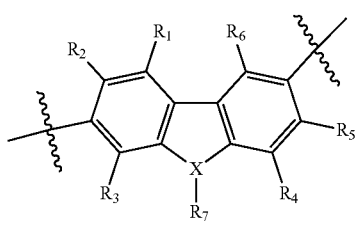
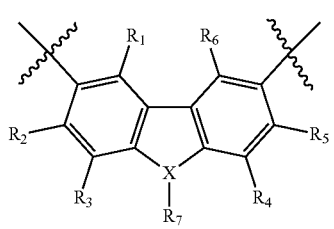
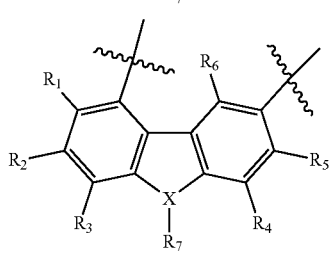
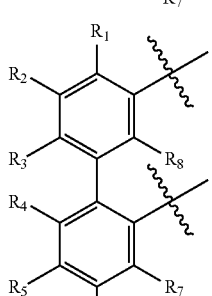
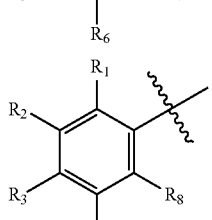
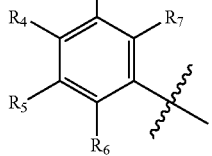
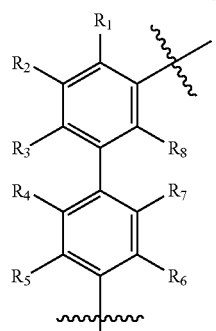
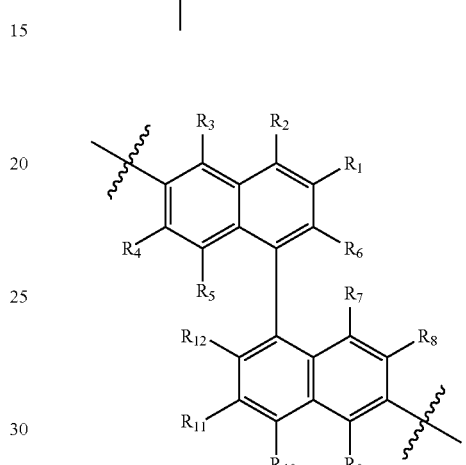
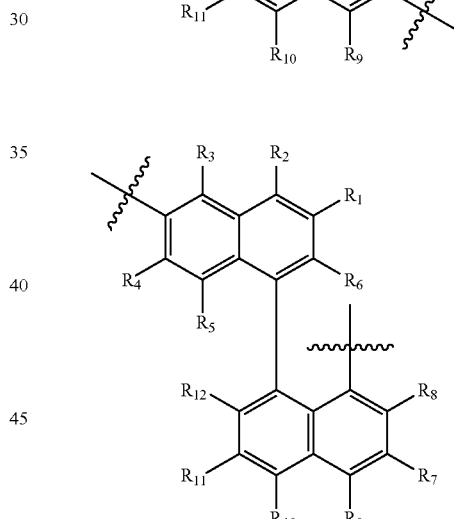
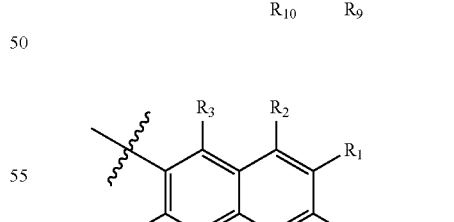
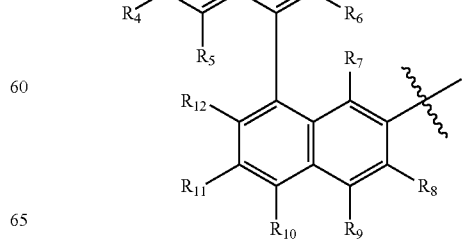

107
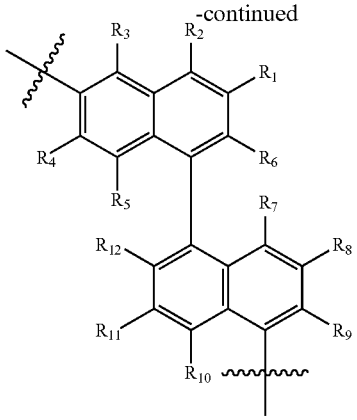
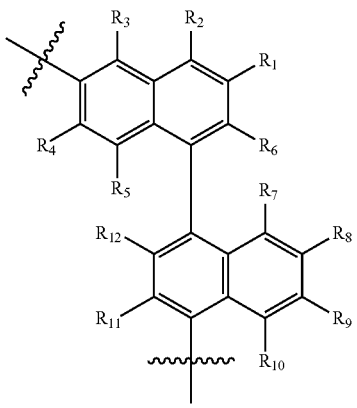
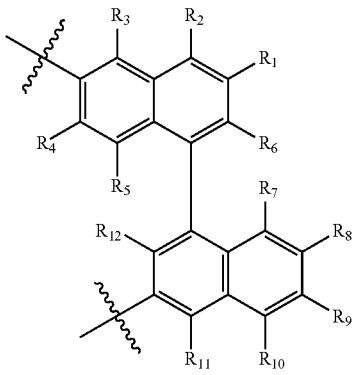
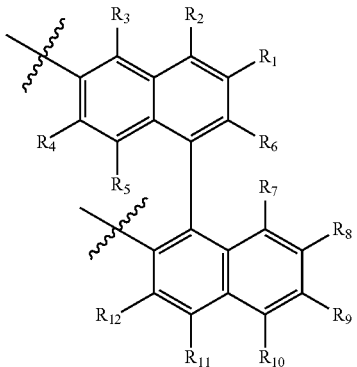
108
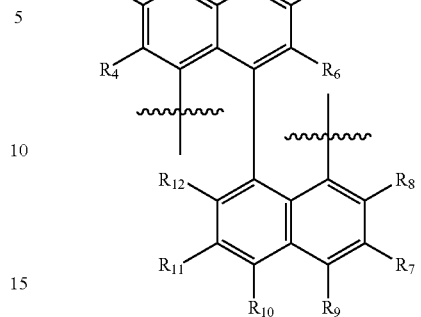
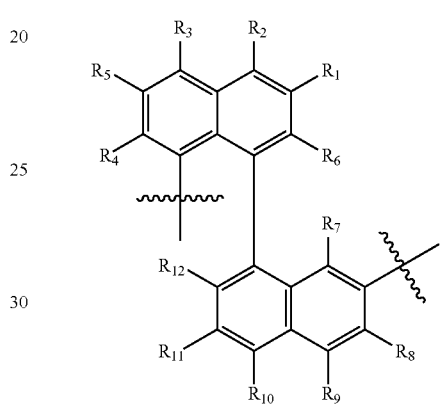
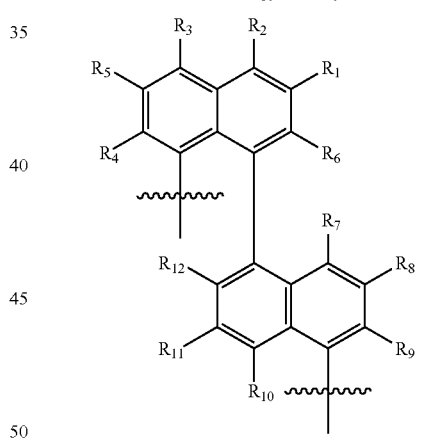
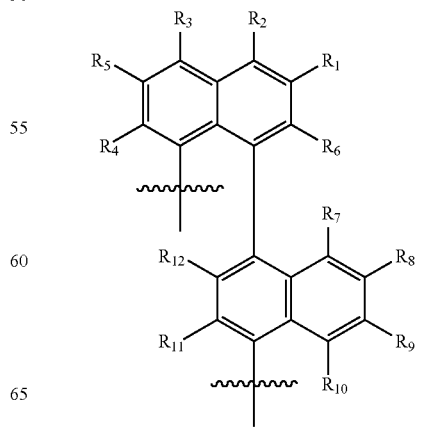

109
-continued
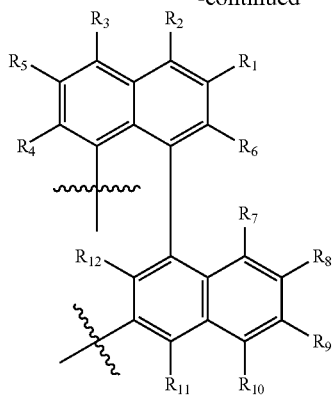
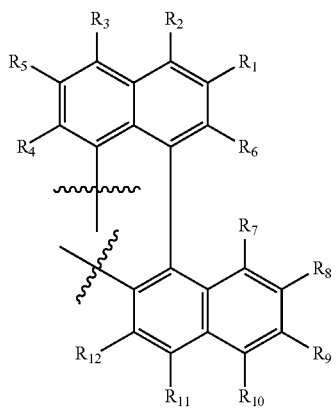
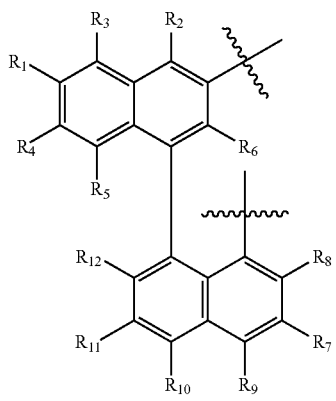
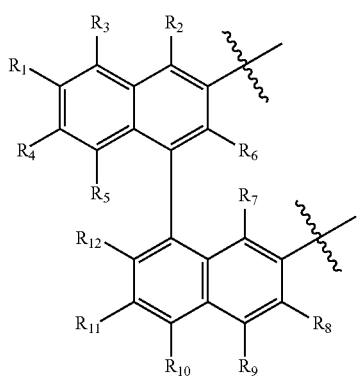
110
-continued
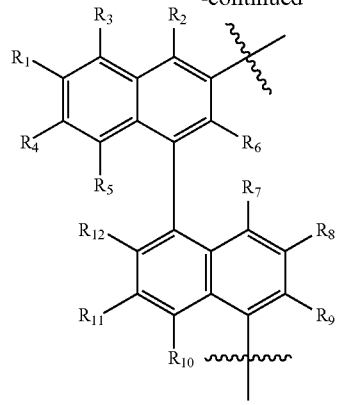
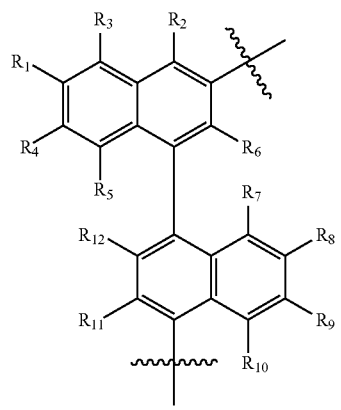
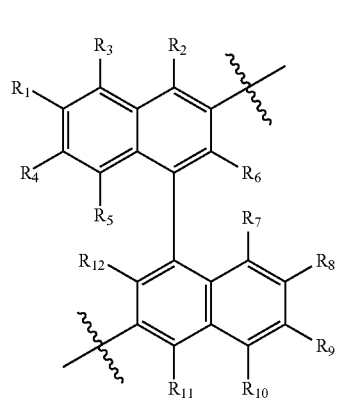
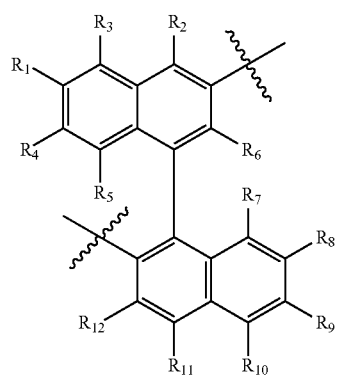

111
-continued
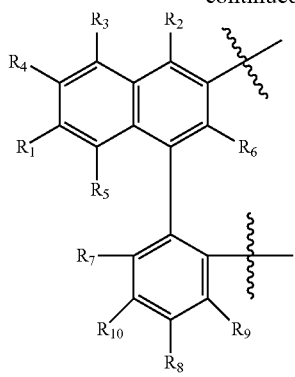
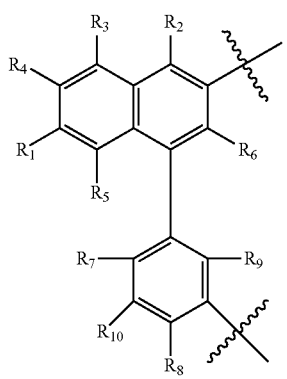
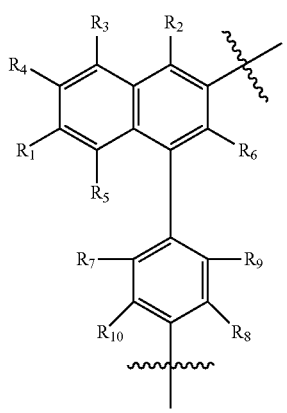
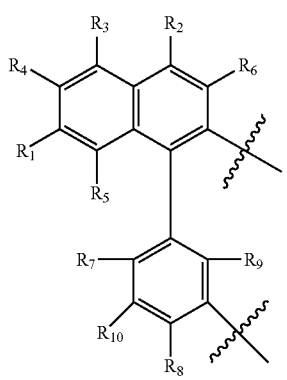
112
-continued
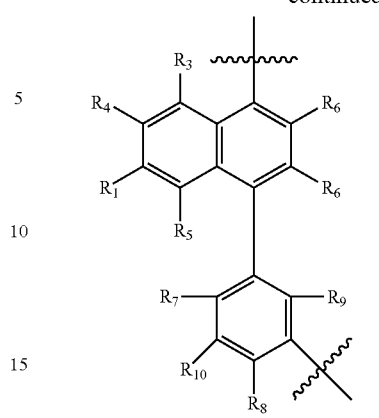
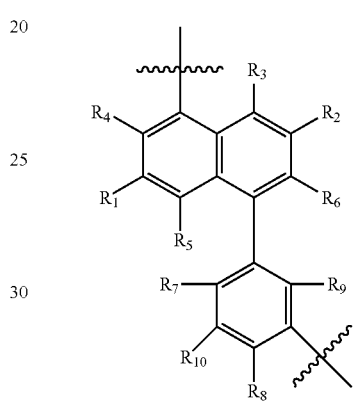
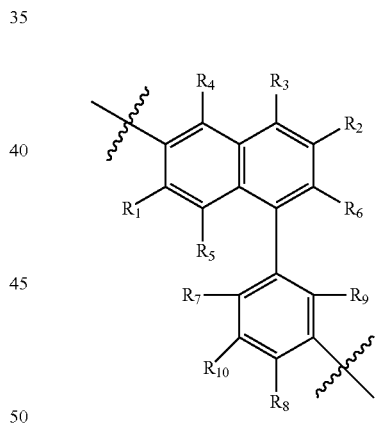
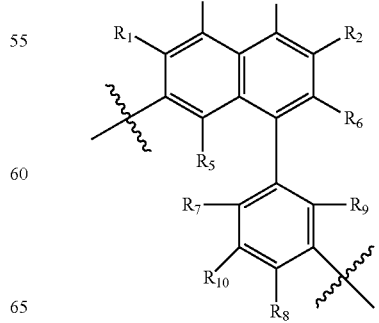

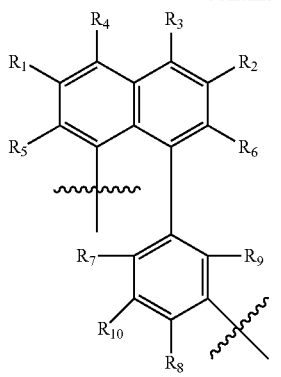
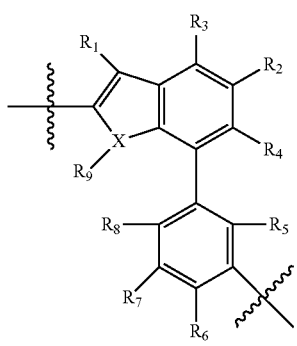
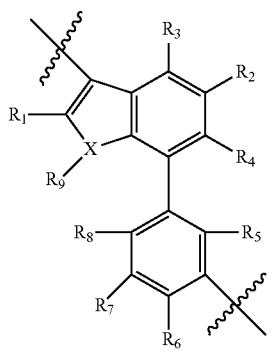
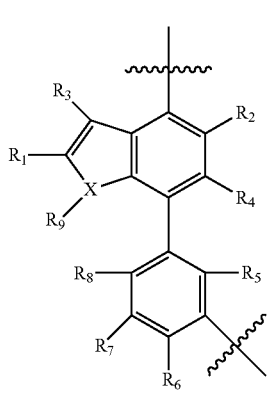
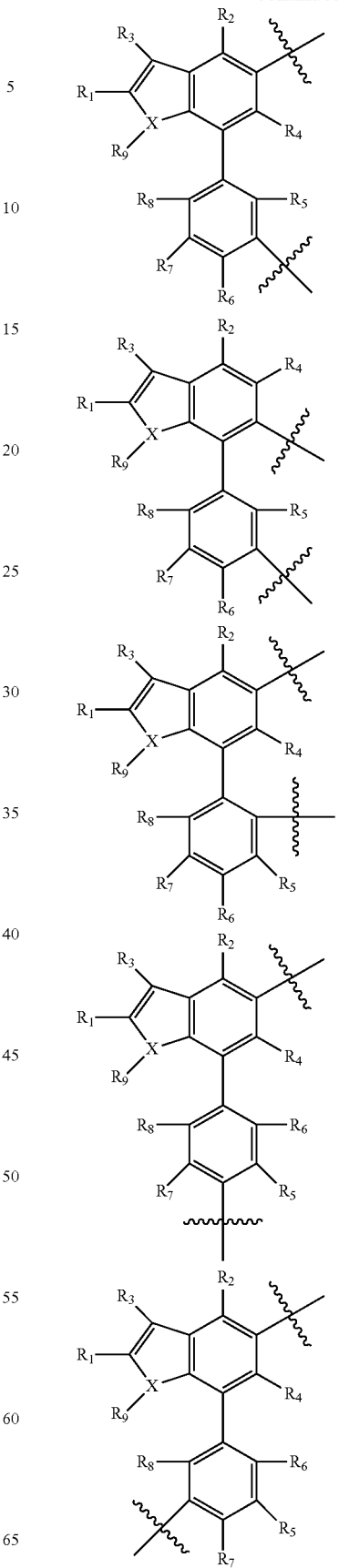

115
-continued
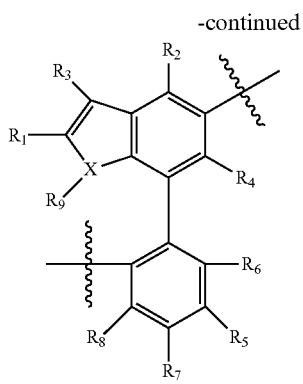
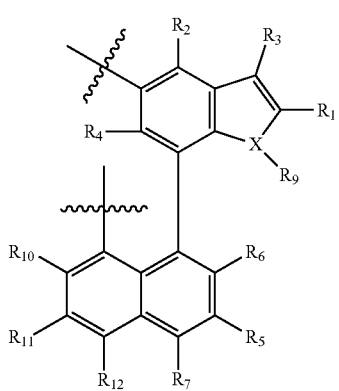
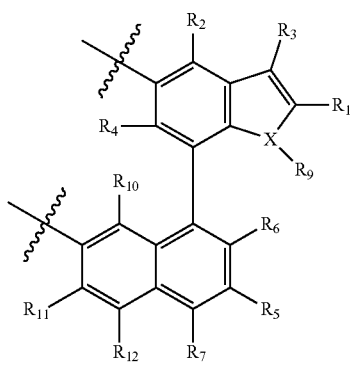
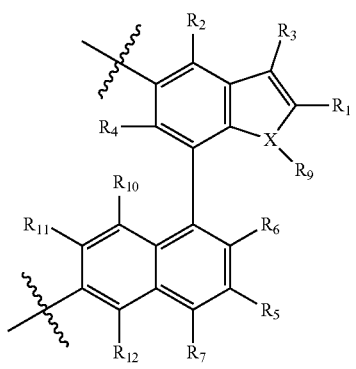
116
-continued
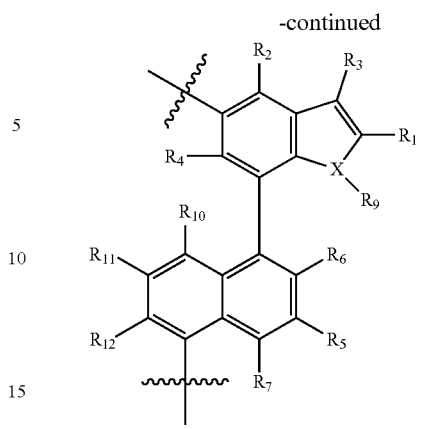
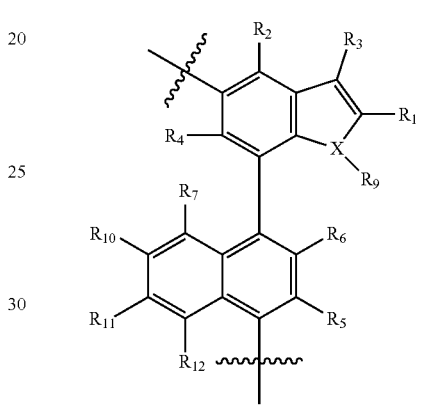
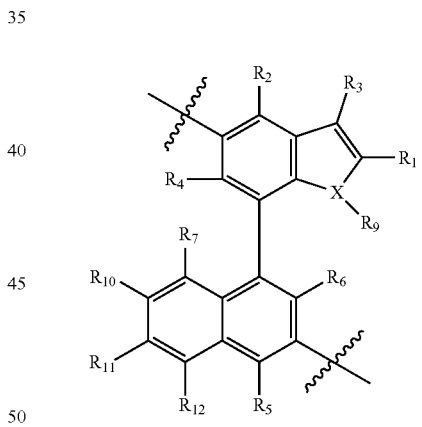
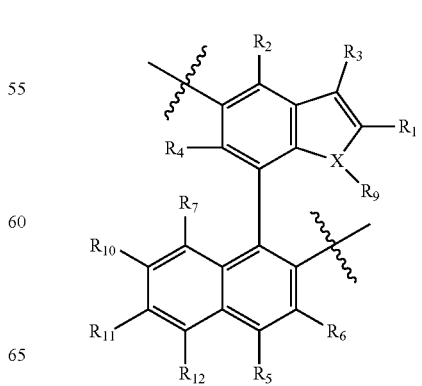

-continued

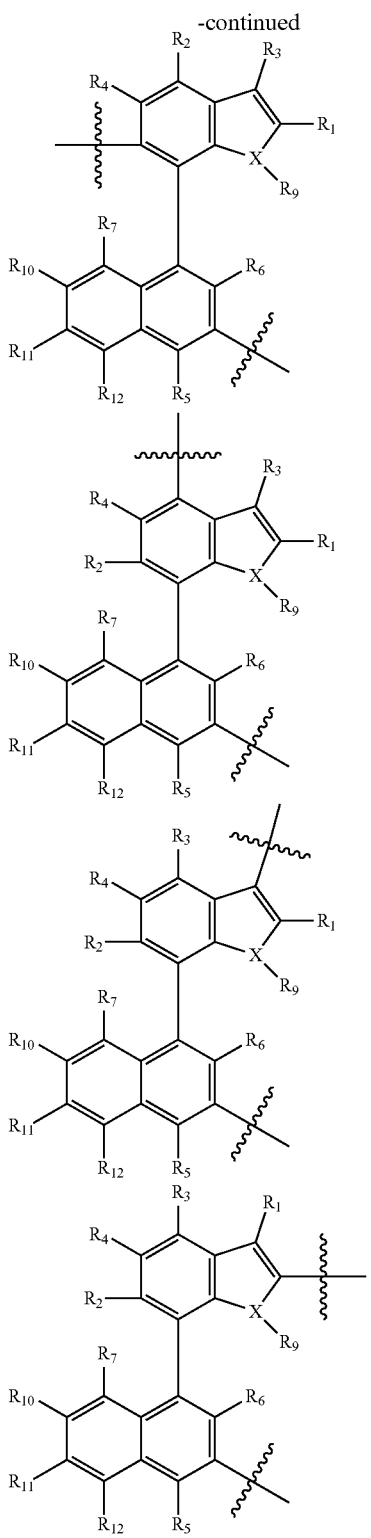

wherein X is S, Se, N, C, or O; each of $R_1$-$R_{12}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; and each of the wavy lines represents one of the meta positions.

19. The electrochromic layer of claim 15, wherein each of the one or more Ars comprises one of a thiophene-based unit, a furan-based unit, a selenophene-based unit, or a pyrrole-based unit with one of the following formulas:

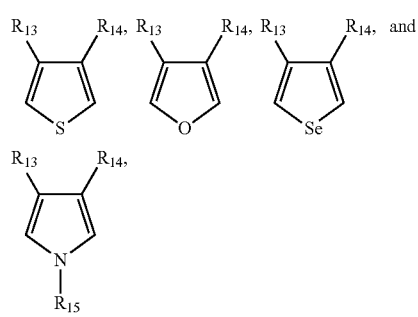

wherein each of $R_{13}$, $R_{14}$ and $R_{15}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

20. The electrochromic layer of claim 19, wherein the thiophene-based unit comprises one of the following formulas:

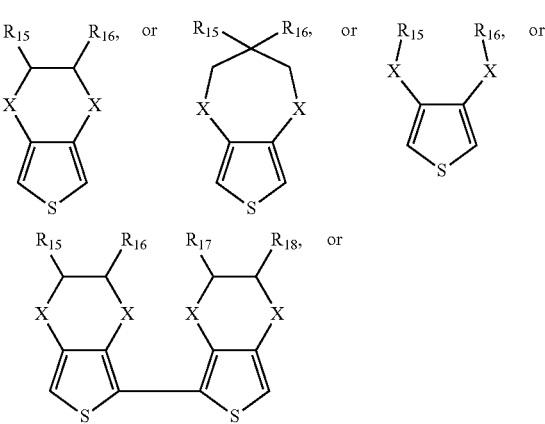

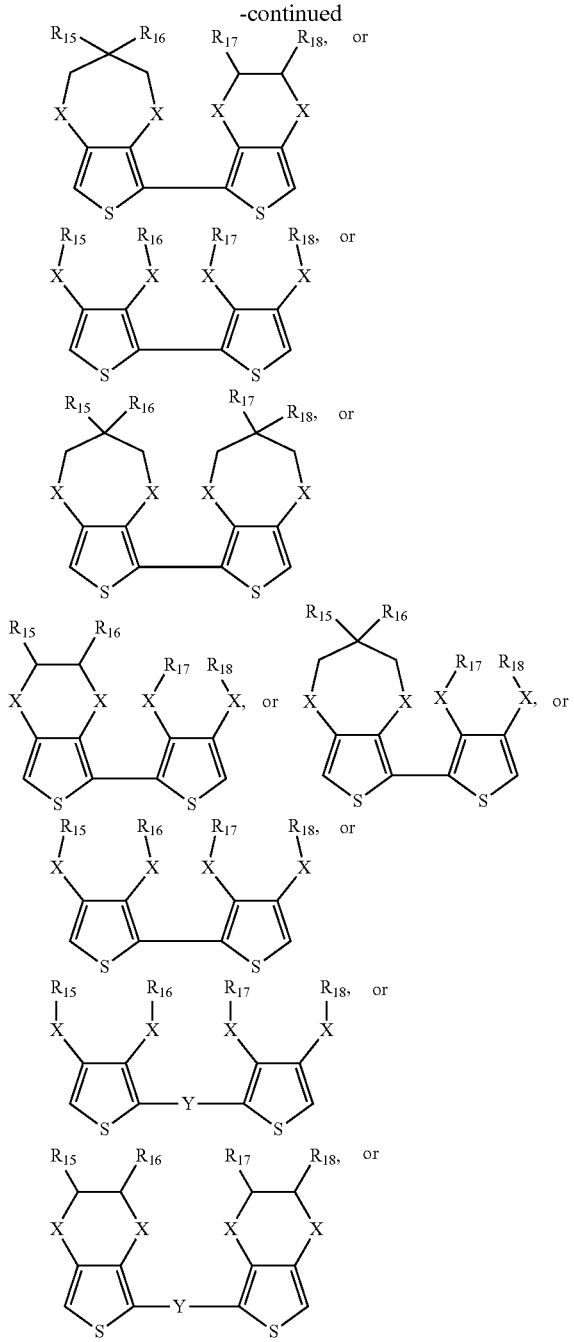
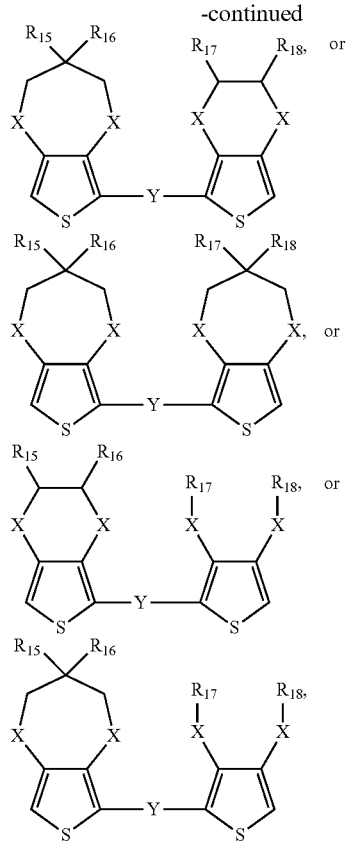

wherein X is S, Se, N, C, or O; each of $R_{15}$-$R_{18}$ is independently selected from one of hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ alkylthio, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; Y is any one or more of Ars, or aromatic structures, or fused aromatic structures, or a combinations thereof.

* * * * *